US008221957B2

(12) United States Patent
Iwai et al.

(10) Patent No.: US 8,221,957 B2
(45) Date of Patent: *Jul. 17, 2012

(54) PLANOGRAPHIC PRINTING PLATE PRECURSOR AND PRINTING METHOD USING THE SAME

(75) Inventors: Yu Iwai, Shizuoka-ken (JP); Norio Aoshima, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 969 days.

This patent is subject to a terminal disclaimer.

(21) Appl. No.: 12/165,205

(22) Filed: Jun. 30, 2008

(65) Prior Publication Data

US 2009/0047601 A1 Feb. 19, 2009

(30) Foreign Application Priority Data

Jul. 2, 2007 (JP) ................................ 2007-174561

(51) Int. Cl.

| | |
|---|---|
| ***G03F 7/004*** | (2006.01) |
| ***G03F 7/027*** | (2006.01) |
| ***G03F 7/033*** | (2006.01) |
| ***G03F 7/09*** | (2006.01) |
| ***B41N 1/00*** | (2006.01) |
| ***B41N 1/08*** | (2006.01) |

(52) U.S. Cl. ............... 430/271.1; 430/281.1; 430/286.1; 430/287.1; 101/453; 101/463.1

(58) Field of Classification Search ............... 430/270.1, 430/271.1, 272.1, 281.1, 286.1, 287.1, 300, 430/302, 944; 101/453, 463.1

See application file for complete search history.

(56) References Cited

U.S. PATENT DOCUMENTS

| | | | | |
|---|---|---|---|---|
| 5,393,637 | A * | 2/1995 | Kanda et al. | 430/138 |
| 6,902,864 | B2 | 6/2005 | Kunita et al. | |
| 6,902,865 | B2 | 6/2005 | Teng | |
| 7,005,234 | B2 | 2/2006 | Hoshi et al. | |
| 7,261,998 | B2 | 8/2007 | Hayashi et al. | |
| 2002/0177074 | A1 | 11/2002 | Hoshi et al. | |
| 2005/0069811 | A1 | 3/2005 | Mitsumoto et al. | |
| 2005/0095529 | A1* | 5/2005 | Sugasaki et al. | 430/270.1 |
| 2005/0266349 | A1 | 12/2005 | Van Damme et al. | |
| 2006/0057492 | A1 | 3/2006 | Kunita et al. | |
| 2006/0194150 | A1 | 8/2006 | Mitsumoto et al. | |
| 2007/0042293 | A1 | 2/2007 | Oohashi et al. | |
| 2007/0056457 | A1 | 3/2007 | Iwai et al. | |
| 2007/0224535 | A1 | 9/2007 | Hoshi et al. | |
| 2009/0047601 | A1 | 2/2009 | Iwai et al. | |
| 2009/0114108 | A1* | 5/2009 | Oya et al. | 101/454 |
| 2009/0246696 | A1* | 10/2009 | Iwai et al. | 430/287.1 |

FOREIGN PATENT DOCUMENTS

| | | | |
|---|---|---|---|
| EP | 1048457 | A2 | 11/2000 |
| EP | 1342568 | A1 | 9/2003 |
| EP | 1630618 | A2 | 3/2006 |
| EP | 1754597 | A2 | 2/2007 |
| EP | 1 859 954 | * | 11/2007 |
| EP | 1975710 | A2 | 10/2008 |
| JP | 2938397 | B2 | 6/1999 |
| JP | 2001-171250 | A | 6/2001 |
| JP | 2001-277740 | A | 10/2001 |
| JP | 2001-277742 | A | 10/2001 |
| JP | 2002-287334 | A | 10/2002 |
| JP | 2004-294934 | A | 10/2004 |
| JP | 2005-119273 | A | 5/2005 |
| JP | 2005-231347 | A | 9/2005 |
| JP | 2006-106700 | A | 4/2006 |
| JP | 2006-111860 | A | 4/2006 |
| JP | 2006-116941 | A | 5/2006 |
| JP | 2006-297907 | A | 11/2006 |
| JP | 2007-50660 | A | 3/2007 |
| WO | WO 2005/091068 | A1 | 9/2005 |
| WO | WO 2005/111727 | A1 | 11/2005 |

OTHER PUBLICATIONS

Extended European Search Report, dated Jul. 30, 2009, for European Application No. 09004105.4.
Extended European Search Report, dated Nov. 25, 2009, for European Application No. 08011283.2.
Fuji Film Corp. et al., "Lithographic printing plate precursor for use in lithographic printing, comprises graft polymer having hydrophilic main chain and graft chain containing hydrophobic segment," Database WPI, Week 200553, XP002554838, 2 pages, published in 2005.
U.S. Office Action, dated May 27, 2011, for U.S. Appl. No. 12/410,244.
U.S. Office Action, dated Nov. 14, 2011, for U.S. Appl. No. 12/410,244.
U.S. Final Office Action, dated May 23, 2012, for U.S. Appl. No. 12/142,564.

* cited by examiner

*Primary Examiner* — Anca Eoff
(74) *Attorney, Agent, or Firm* — Birch, Stewart, Kolasch & Birch, LLP

(57) ABSTRACT

The invention provides a planographic printing plate precursor comprising: a hydrophilic support; and an image recording layer that is provided on the support, the image recording layer comprising: an infrared ray absorbing agent (A); a polymerization initiator (B); a polymerizable monomer (C); and a specific polymer compound (D) having an alkyleneoxy group in its molecule and having, in a side chain thereof at least one specific group. The invention further provides a printing method using the planographic printing plate precursor, wherein no specific development process is required for performing printing.

7 Claims, No Drawings

PLANOGRAPHIC PRINTING PLATE PRECURSOR AND PRINTING METHOD USING THE SAME

CROSS-REFERENCE TO RELATED APPLICATION

This application claims priority under 35 USC 119 from Japanese patent Application No. 2007-174561 filed Jul. 2, 2007, the disclosure of which is incorporated by reference herein.

BACKGROUND OF THE INVENTION

1. Field of the Invention

The present invention relates to a planographic printing plate precursor which can record an image by laser and can be on-press developed, and a printing method using the same.

2. Technical Field

Generally, a planographic printing plate has a configuration having at least a lipophilic image portion for receiving ink in the printing process and a hydrophilic non-image portion for receiving dampening water. Planographic printing is a printing method such that a lipophilic image portion and a hydrophilic non-image portion in a planographic printing plate are used as an ink receiving portion and a dampening water receiving portion (an ink non-receiving portion) respectively by utilizing a property of repulsion of water and oil-based ink with each other, and a difference in adherability of ink is caused on the surface of the planographic printing plate to impress ink on only the image portion and thereafter transfer the ink to an object to be printed such as paper.

Conventionally, a planographic printing plate precursor (PS plate) provided with a lipophilic photosensitive resin layer (an image recording layer) on a hydrophilic support has been widely used in order to produce this planographic printing plate. Ordinarily, a planographic printing plate is obtained by performing plate-making by a method such that a planographic printing plate precursor is exposed to an original image such as a lith film, and thereafter an image recording layer corresponding to an image portion is made to survive, and an unnecessary image recording layer corresponding to a non-image portion is dissolved and removed by alkaline developing solution or organic solvent-containing developing solution, and a hydrophilic support surface is exposed to form a non-image portion.

When making a printing plate from a conventional planographic printing plate precursor, it is necessary to remove undesired portions of the image recording layer through dissolution in a developer or the like after exposure. There has recently been a demand for elimination or simplification of such an additional wet processing. In particular, in recent years, the disposal of waste fluid discharged with wet processing has been a great concern in the whole industrial world in consideration of the terrestrial environment, so that a request to solve the problem has been increasingly strengthened.

Under the circumstance, a so-called on-press development method has been proposed as a simplified platemaking method. In the on-press development method, an image recording layer allowing removal of undesired portions of the image recording layer of the planographic printing plate precursor in the normal printing step is used, and the undesirable portions of image recording layer are removed on-press after exposure.

Specific examples of the on-press development include a method for using a planographic printing plate precursor having an image recording layer capable of being dissolved or dispersed in dampening water, ink solvent or emulsion of dampening water and ink, a method for dynamically removing an image recording layer by contact with rollers and blanket of a printing press, and a method for weakening cohesive force of an image recording layer or adhesive force of an image recording layer and a support by penetration of dampening water and ink solvent to thereafter dynamically remove the image recording layer by contact with rollers and blanket.

In the invention, unless otherwise described, "developing" and "development (process)" mean using an apparatus (typically, an automatic developing machine) other than a printing press to contact an image recording layer with a liquid (typically, alkaline developing solution) so that the image recording layer in an unexposed portion in a planographic printing plate precursor is removed to expose a hydrophilic support surface. The "on-press developing" and "on-press development" mean a method and a process to use a printing press to contact a image recording layer with a liquid (typically, printing ink and/or dampening water) so that the image recording layer in an unexposed portion in a planographic printing plate precursor is removed to expose a hydrophilic support surface.

Digitalization technology of processing, storing, and outputting image information electronically in and out of computer has been widely spreading recently as an image forming means on the planographic printing plate precursor, and various new image-outputting systems compatible with the digitalization technology have been put into practical use. Computer to plate (CTP) technology of producing a planographic printing plate directly without use of a lith film by making a highly converged radiation ray such as laser radiation carry such digitalized image information and scan-irradiating the planographic printing plate precursor with the ray is attracting attention in the above situation. Accordingly, it is one of important technical issues to obtain a planographic printing plate precursor suitable for such technology.

In the simplification, the drying or the process-freeing of plate-making work as described above, an image recording layer after being exposed is not fixed through the development process, thus the image recording layer after being exposed has photosensitivity to bring a possibility of causing fog before printing. Therefore, an image recording layer and a light source capable of being handled in a bright room or under a yellow light are needed.

With regard to such a laser light source, a solid-state laser such as a semiconductor laser or a YAG laser for radiating infrared rays with a wavelength of 760 to 1200 nm is extremely useful for the reason that a high-output and small-sized solid-state laser is available inexpensively. An UV laser may be also used.

Examples of a planographic printing plate precursor subjected to the on-press development for recording an image by this infrared laser include a planographic printing plate precursor having an image recording layer, in which hydrophobic thermoplastic polymer particles are dispersed in a hydrophilic binder, on a hydrophilic support is described in Japanese Patent No. 2938397. It is described in Japanese Patent No. 2938397 that the planographic printing plate precursor is exposed to an infrared laser, and the hydrophobic thermoplastic polymer particles are integrated by heat to form an image, and thereafter the planographic printing plate precursor is mounted on a cylinder of a printing press to be capable of performing the on-press development by dampening water and/or ink.

The method for forming an image with integration of fine particles by mere heat seal in this manner has a problem that image intensity is extremely weak and printing durability is insufficient even though favorable on-press developability is exhibited.

Also, a planographic printing plate precursor having a microcapsule including a polymerizable compound on a hydrophilic support is described in Japanese Patent Application Laid-Open (JP-A) Nos. 2001-277740 and 2001-277742.

Further, a planographic printing plate precursor having a photosensitive layer containing an infrared absorbing agent, a radical polymerization initiator and a polymerizable compound on a support is described in JP-A Nos. 2002-287334 and 2005-329708+A planographic printing plate precursor having a photosensitive layer containing a polymer compound which contains at least one ethylenically unsaturated bond is also described therein. The methods using polymerization reaction in this manner are so high in chemical bonding density of an image portion as compared with an image portion formed by heat seal of polymer fine particles that image intensity is comparatively favorable and favorable printing durability may be exhibited. However, the methods using polymerization reaction are still insufficient in view of on-press developability. Specifically, the problem in the deterioration in the on-press developability after lapse of days is remarkable.

For improving on-press developability, there is a method of using a polymer compound including at least one of an ether group, an ester group and an amido group, as described in JP-A No. 2006-116941. However, this method has a problem of insufficient printing durability.

Improvements in both of removability of unexposed portions (non-image regions) upon development, and in printing durability have also been desired for planographic printing plate precursors to be subjected to development treatment.

SUMMARY OF THE INVENTION

The invention provides a planographic printing plate precursor which can achieve excellent removability of unexposed portions as well as maintaining excellent printing durability, and a printing method using the same.

The inventors examined various polymer compounds and found that a planographic printing plate precursor (of on-press developability type) having sufficient printing durability and being capable of achieving excellent removability of unexposed portions upon development can be achieved by using an image recording layer containing a polymer compound having a skeleton with a polymerizable functional group having a hydroxyl group at a specified position and having an alkyleneoxy skeleton.

Namely, a first aspect of the invention provides a planographic printing plate precursor comprising: a hydrophilic support; and an image recording layer that is provided on the support, the image recording layer comprising: an infrared ray absorbing agent (A); a polymerization initiator (B); a polymerizable monomer (C); and a polymer compound (D) having an alkyleneoxy group in its molecule and having, in a side chain thereof, at least one selected from a group represented by the following Formula (1) and a group represented by the following Formula (2).

Formula (1)

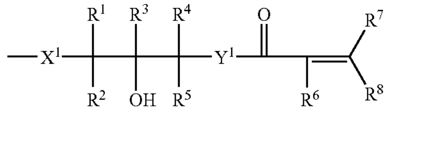

-continued

Formula (2)

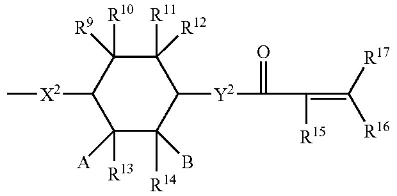

In Formula (1), $R^1$ to $R^8$ each independently represent a hydrogen atom or a monovalent substituent; $X^1$ and $Y^1$ each independently represent a single bond or a divalent linking group. In Formula (2), $R^9$ to $R^{17}$ each independently represent a hydrogen atom or a monovalent substituent; A and B each independently represent a hydrogen atom or a monovalent substituent, provided that at least one of A and B is a hydroxyl group; and $X^2$ and $Y^2$ each independently represent a single bond or a divalent linking group.

In a preferable embodiment, the image recording layer comprises at least one selected from a microcapsule and a microgel.

In another preferable embodiment, silicon atoms adhere on a surface of the hydrophilic support in an amount of 8 $mg/m^2$ or more.

In another preferable embodiment, the image recording layer is configured to form, following exposure, an image as a result of supply of printing ink and dampening water at a printing press and removal of an unexposed portion.

Further, as a second aspect, the invention provides a printing method comprising: imagewise exposing and mounting the planographic printing plate precursor of the first aspect on a printing press;

supplying printing ink and dampening water to the exposed planographic printing plate precursor; and printing, wherein a planographic printing plate which enables the printing is formed upon starting the printing, by removing an unexposed portion of the image recording layer without conducting a specific development process.

DETAILED DESCRIPTION OF THE INVENTION

Planographic Printing Plate Precursor

The planographic printing plate precursor of the invention has at least a hydrophilic support and an image recording layer provided on the hydrophilic support. The image recording layer contains at least: an infrared ray absorbing agent (A); a polymerization initiator (B); a polymerizable monomer (C); and a polymer compound (D) having an alkyleneoxy group in its molecule and having, in a side chain thereof, at least one selected from the group consisting of: a group represented by the following Formula (1); and a group represented by the following Formula (2). (Hereinafter, the compound (D) may be sometimes referred as a "specific polymer compound".) The image recording layer preferably has on-press developability. Namely, the image recording layer is preferably configured to form, following exposure, an image as a result of supply of printing ink and dampening water at a printing press and removal of an unexposed portion.

The planographic printing plate precursor of the invention may have a configuration in which a protective layer is further provided over the image recording layer provided over the support.

Hereinafter, the planographic printing plate precursor of the invention is described in detail.

Image Recording Layer

Specific Polymer Compound (D)

The image recording layer in the planographic printing plate precursor of the invention contains, as a binder polymer, (D) a polymer compound containing: an alkyleneoxy group in its molecule; and, in a side chain thereof, at least one of a group represented by the following Formula (1) and a group represented by the following Formula (2), for the purpose of improvement of film property and on-press developability.

Formula (1)

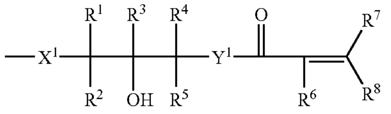

Formula (2)

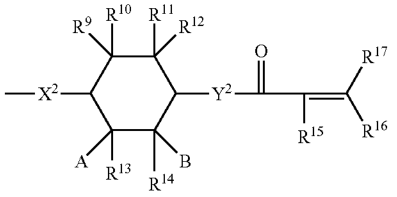

In Formula (1), $R^1$ to $R^8$ each independently represent a hydrogen atom or a monovalent substituent. $X^1$ and $Y^1$ each independently represent a single bond or a divalent linking group. In Formula (2), $R^9$ to $R^{17}$ each independently represent a hydrogen atom or a monovalent substituent. A and B each independently represent a hydrogen atom or a monovalent substituent, provided that at least one of A and B is a hydroxyl group. $X^2$ and $Y^2$ each independently represent a single bond or a divalent linking group.

The specific polymer compound used in the invention attains improvements in removability of unexposed portions upon development and on-press developability in a non-image portion (unexposed portion) by possessing an alkyleneoxy group, and simultaneously, a hydrophilic hydroxy group, as shown in Formulae (1) and (2), on its side chain.

In an image portion (exposed portion), on the other hand, a terminal polymerizable group in the group represented by Formula (1) or (2) in the specific polymer compounds crosslinks with an instance of the specific polymer compound or with the polymerizable monomer (C), thereby incorporating, into a crosslinked network, hydroxyl groups adjacent to the polymerizable groups, which presumably makes it more difficult for the hydroxyl groups to exhibit their hydrophilicity, rendering the image portion lipophilic (hydrophobic). Generally, the printing durability of the planographic printing plate precursor is improved by sufficient film strength and/or lipophilicity of the image portion. It is presumed that the planographic printing plate precursor of the invention, by using the specific polymer compound, increases crosslinking density, thereby improving the film strength of the image portion and increasing the lipophilicity thereof, thus achieving excellent printing durability.

It is estimated that the planographic printing plate precursor of the invention can achieve the improvements in both of removability of unexposed portions upon development and on-press developability and in printing durability for the above reasons.

From the viewpoints of removability of unexposed portions upon development, on-press developability and printing durability, the specific polymer compound preferably has, in a side chain thereof the group represented by Formula (1), and more preferably has, at a terminus of the side chain thereof, the group represented by Formula (1).

Group Represented by Formula (1)

Details of the group represented by Formula (1) are provided in the following.

Specific Development Promoting Agent

The image recording layer in the planographic printing plate precursor the invention necessarily contains at least the compound (D) represented by the following Formula (1). Hereinafter, the compound (D) is sometimes referred as a "specific development promoting agent", and details thereof Formula (1)

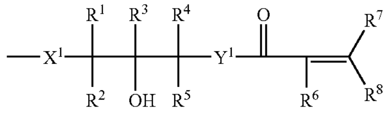

In Formula (1), $R^1$ to $R^8$ each independently represent a hydrogen atom or a monovalent substituent. $X^1$ and $Y^1$ each independently represent a single bond or a divalent linking group.

When $R^1$ to $R^8$ in Formula (1) each represent a monovalent substituent, examples of the monovalent substituent include a halogen atom, an amino group, a substituted amino group, a substituted carbonyl group, a substituted oxy group, a thiol group, a thioether group, a silyl group, a nitro group, a cyano group, an alkyl group, an alkenyl group, an alkynyl group, an aryl group, a heterocyclic group, a sulfo group, a substituted sulfonyl group, a sulfonato group, a substituted sulfinyl group, a phosphono group, a substituted phosphono group, a phosphonato group and a substituted phosphonato group.

Among these, $R^1$ to $R^8$ in Formula (1) each preferably independently represent a hydrogen atom, an alkyl group, or an aryl group from the viewpoint of providing a planographic printing plate precursor having excellently-balanced on-press developability and printing durability.

Examples of the alkyl group represented by $R^1$ to $R^6$ include a linear, branched or cyclic alkyl group having 1 to 20 carbon atoms. More preferable examples among those described above include a linear alkyl group having 1 to 12 carbon atoms, a branched alkyl group having 3 to 12 carbon atoms and a cyclic alkyl group having 5 to 10 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group.

When the alkyl group represented by $R^1$ to $R^6$ has a substituent (that is, when the alkyl group is substituted), the alkyl moiety of the substituted alkyl group includes, for example, divalent organic residues derived from the alkyl group having 1 to 20 carbon atoms by removing any hydrogen atom from it, and the range of the number of carbon atoms therein is preferably the same as that in the alkyl group.

Preferable examples of the substituted alkyl group include a chloromethyl group, a bromomethyl group, a 2-chloroethyl group, a trifluoromethyl group, a methoxymethyl group, a methoxycarbonylmethyl group, an isopropoxymethyl group, a butoxymethyl group, a sec-butoxybutyl group, a methoxyethoxyethyl group, an allyloxymethyl group, a phenoxymethyl group, an acetyloxymethyl group, a methylthiomethyl group, a tolylthiomethyl group, a pyridylmethyl group, a tetramethylpiperidinylmethyl group, an N-acetyltetramethylpiperidinylmethyl group, a trimethylsilylmethyl group, a methoxyethyl group, an ethylaminoethyl group, a diethylaminopropyl group, a morpholinopropyl group, an acetyloxymethyl group, a benzoyloxymethyl group, an N-cylohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl) carbamoylethyl group, an N-methyl-N-(sulfophenyl) carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl) sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, and a p-methylbenzyl group.

Examples of the substituent that may be introduced into the alkyl group represented by $R^1$ to $R^6$ include, in addition to the substituents described above for the substituted alkyl group, a monovalent non-metallic atomic group. Preferable examples of substituents including the substituents described above include a halogen atom (—F, —Br, —Cl and —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugated base group thereof (referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugated base group thereof (referred to as a phosphonato group), a dialkylphosphono group (—$PO_3$ (alkyl)$_2$; alkyl=an alkyl group, same in the followings), a diarylphosphono group (—$PO_3$ (aryl)$_2$); aryl=an aryl group, same in the followings), an alkylarylphosphono group (—$PO_3$(alkyl)(aryl)), a monoalkylphosphono group (—$PO_3$(alkyl)) and a conjugated base group thereof (referred to as an alkylphosphonato group), a monoarylphosphono group (—$PO_3H$(aryl)) and a conjugated base group thereof (referred to as an arylphosphonato group), a phosphonooxy group (—$OPO_3H_2$) and a conjugated base group thereof (referred to as a phosphonatooxy group), a dialkylphosphonoxy group (—$OPO_3H$(alkyl)$_2$), a diarylphosphonoxy group (—$OPO_3$(aryl)$_2$), an alkylarylphosphonoxy group (—$OPO_3$(alkyl)(aryl)), a monoalkylphosphonoxy group (—$OPO_3H$(alkyl)) and a conjugated base group thereof (referred to as an alkylphosphonatooxy group), a monoarylphosphonoxy group (—$OPO_3H$ (aryl)) and a conjugated base group thereof (referred to as an arylphosphonatooxy group), a cyano group, a nitro group, an aryl group, an alkenyl group, an alkynyl group, a heterocyclic group and a silyl group.

The specific examples of the alkyl moiety in the substituent that may be introduced into the alkyl group represented by $R^1$ to $R^6$ is the same as the alkyl moiety of the substituted alkyl group represented by $R^1$ to $R^6$, and preferable examples thereof are also in the same range as defined therein.

Specific examples of the aryl moiety in the substituent that may be introduced into the alkyl group represented by $R^1$ to $R^6$ include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a cyanophenyl group, a sulfophenyl group, a sulfonatophenyl group, a phosphonophenyl group and a phosphonatophenyl group.

Examples of the alkenyl group represented by $R^1$ to $R^6$ include an alkenyl group having 2 to 20 carbon atoms. More preferable examples among those mentioned above include an alkenyl group having 2 to 10 carbon atoms, and still more preferable examples include an alkenyl group having 2 to 8 carbon atoms. The alkenyl group may further have a substituent. Examples of the substituent that may be introduced thereto include a halogen atom, an alkyl group, a substituted alkyl group, an aryl group and a substituted aryl group, and preferable examples thereof include a halogen atom and linear, branched or cyclic alkyl groups having 1 to 10 carbon atoms. Specific examples of the alkenyl group include a vinyl group, a 1-propenyl group, a 1-butenyl group, a cinnamyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an allyl group, a 2-butenyl group, a 2-methylallyl group, a 2-methyl-3-butenyl group and a 3-methyl-2-butenyl group.

Examples of the alkynyl group represented by $R^1$ to $R^6$ include an alkynyl group having 2 to 20 carbon atoms. More preferable examples among those mentioned above include an alkynyl group having 2 to 10 carbon atoms, and still more preferable examples include an alkynyl group having 2 to 8 carbon atoms. Specific examples thereof include an ethynyl group, a 1-propynyl group, a 1-butynyl group, a phenylethynyl group, a trimethylsilylethynyl group, a 2-propynyl group, a 2-butynyl group and a 3-butynyl group.

Examples of the aryl group represented by $R^1$ to $R^6$ include a benzene ring, a condensed ring formed by condensing two to three benzene rings, and a condensed ring formed by condensing a benzene ring and a 5-membered unsaturated ring. Specific examples thereof include a phenyl group, a naphthyl group, an anthryl group, a phenanthryl group, an indenyl group, an acenaphthenyl group, and a fluorenyl group. Among these groups, a phenyl group and a naphthyl group are more preferable.

The aryl group represented by $R^1$ to $R^6$ may have a substituent on a carbon atom forming its ring. Examples of such a substituent include monovalent substituents composed of non-metallic atoms. Preferable examples of the substituent introduced into the aryl group include the alkyl group, substituted alkyl group, and substituents on the substituted alkyl groups described above.

The heterocyclic ring represented by $R^1$ to $R^6$ is preferably a three- to eight-membered heterocyclic group, more preferably a three- to six-membered heterocyclic group containing a nitrogen atom, an oxygen atom and a sulfur atom, still more preferably a five- to six-membered heterocyclic group containing a nitrogen atom, an oxygen atom and a sulfur atom. Specific examples of the heterocyclic ring include a pyrrole cyclic group, a furan cyclic group, a thiophene cyclic group, a benzopyrrole cyclic group, a benzofuran cyclic group, a benzothiophene cyclic group, a pyrazole cyclic group, an isoxazole cyclic group, an isothiazole cyclic group, an indazole cyclic group, a benzoisoxazole cyclic group, a benzoisothiazole cyclic group, an imidazole cyclic group, an oxazole cyclic group, a thiazole cyclic group, a benzimidazole cyclic group, a benzoxazole cyclic group, a benzothiazole cyclic group, a pyridine cyclic group, a quinoline cyclic group, an isoquinoline cyclic group, a pyridazine cyclic group, a pyrimidine cyclic group, a pyrazine cyclic group, a phthalazine cyclic group, a quinazoline cyclic group, a quinoxaline cyclic group, an acyridine cyclic group, a phenanthridine cyclic group, a carbazole cyclic group, a purine cyclic group, a pyran cyclic group, a piperidine cyclic group, a piperazine cyclic group, a morpholine cyclic group, an indole cyclic group, an indolizine cyclic group, a chromene cyclic group, a cinnoline cyclic group, an acridine cyclic group, a phenotbiazine cyclic group, a tetrazole cyclic group and a triazine cyclic group.

The heterocyclic group represented by $R^1$ to $R^6$ may have a substituent on carbon atoms forming its ring. Examples of such a substituent include monovalent substituents composed of non-metallic atoms. Preferable examples of the substituents introduced into the heterocyclic group include the alkyl group, substituted alkyl group and substituents on the substituted alkyl group described above.

The silyl group represented by $R^1$ to $R^6$ may have a substituent. Preferable examples of the silyl group include silyl groups having 0 to 30 carbon atoms, more preferable examples include silyl groups having 3 to 20 carbon atoms, and still more preferable examples include silyl groups having 3 to 10 carbon atoms. Specific examples thereof include a trimethylsilyl group, a triethylsilyl group, a tripropylsilyl group, a triisopropylsilyl group, a cyclohexyldimethylsilyl group and a dimethylvinylsilyl group.

The thioether group represented by $R^1$ to $R^6$ may have a substituent. Preferable examples of the thioether group include thioether groups having 0 to 30 carbon atoms, more preferable examples include thioether groups having 3 to 20 carbon atoms, and still more preferable examples include thioether groups having 1 to 10 carbon atoms.

Specific examples thereof include alkylthio groups such as a methylthio group, an ethylthio group or a cyclohexylthio group, and arylthio groups such as a phenylthio group.

Examples of the substituted oxy group ($R^{06}O$—) represented by $R^1$ to $R^6$ include a group in which $R^{06}$ consists of a monovalent non-metallic atomic group excluding a hydrogen atom. Preferable examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group and a phosphonatooxy group. The alkyl group and aryl group in these groups include, for example, the alkyl group, substituted alkyl group, aryl group and substituted aryl group described above. Examples of the acyl group ($R^{07}CO$—) in the acyloxy group include those wherein $R^{07}$ is the alkyl group, substituted alkyl group, aryl group or substituted aryl group described above. Among these substituents, an alkoxy group, an aryloxy group, an acyloxy group and an arylsulfoxy group are preferable. Preferable examples of the substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group and a phosphonatooxy group.

The amino group represented by $R^1$ to $R^6$ may be a substituted amino group which may further contain an amido group. Examples of the substituted amino group which may further contain an amido group ($R^{08}NH$—, $(R^{09})(R^{010})N$—) include those wherein $R^{08}$, $R^{09}$ and $R^{010}$ consist respectively of a monovalent non-metallic atomic group excluding a hydrogen atom. $R^{09}$ and $R^{010}$ may be bound to each other to form a ring. Preferable examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N'-alkyl-N'-arylureido group, an N',N'-dialkyl-N-alkylureido group, an N',N'-dialkyl-N'-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. Examples of the alkyl group and aryl group in these groups include the alkyl group, substituted alkyl group, aryl group and substituted aryl group described above, and $R^{07}$ in the acyl group ($R^{07}CO$—) in an acylamino group, an N-alkylacylamino group and an N-arylacylamino group is as described above. More preferable examples among those described above include an N-alkylamino group, an N,N-dialkylamino group, an N-arylamino group and an acylamino group. Preferable examples of the substituted amino group include a methylamino group, an ethylamino group, a diethylamino group, a morpholino group, a piperidino group, a pyrrolidino group, a phenylamino group, a benzoylamino group and an acetylamino group.

Examples of the substituted sulfonyl group ($R^{011}$—$SO_2$—) represented by $R^1$ to $R^6$ include a group in which $R^{11}$ consists of a monovalent non-metallic atomic group. More preferable examples include an alkylsulfonyl group, an arylsulfonyl group, and a substituted or unsubstituted sulfamoyl group. Examples of the alkyl group and aryl group in these groups include the alkyl group, substituted alkyl group, aryl group and substituted aryl group described above. Specific examples of the substituted sulfonyl group include a butylsulfonyl group, a phenylsulfonyl group, a chlorophenylsulfonyl group, a sulfamoyl group, an N-alkylsulfamoyl group, an N,N-dialkylsulfamoyl group, an N-arylsulfamoyl group and an N-alkyl-N-arylsulfamoyl group.

The sulfonato group (—$SO_3$—) represented by $R^1$ to $R^6$ refers to an anionic group of a conjugated base in a sulfo group (—$SO_3H$) and is usually preferably used with a counter cation. Examples of such a counter cation include those generally known, that is, various oniums (ammonium, sulfonium, phosphonium, iodonium and azinium), as well as metal ions ($Na^+$, $K^+$, $Ca^{2+}$, $Zn^{2+}$ etc.).

Examples of the substituted carbonyl group ($R^{013}$—CO—) represented by $R^1$ to $R^6$ include a group in which $R^{013}$ consists of a monovalent non-metallic atomic group. Preferable examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N'-arylcarbamoyl group. Examples of the alkyl group and aryl group in these groups include the alkyl group, substituted alkyl group, aryl group and substituted aryl group described above. More preferable examples of the substituted carbonyl group among those mentioned above include a formyl group, an acyl group, a carboxyl group, an alkoxycarbonyl group, an aryloxycarbonyl group, a carbamoyl group, an N-alkylcarbamoyl group, an N,N-dialkylcarbamoyl group and an N-arylcarbamoyl group. Still more preferable examples include a formyl group, an acyl group, an alkoxycarbonyl group, an aryloxycarbonyl group. Preferable example of the substituted carbonyl group include a formyl group, an acetyl group, a benzoyl group, a carboxyl group, a methoxycarbonyl group, an ethoxycarbonyl group, an allyloxycarbonyl group, a dimethylaminophenylethenylcarbonyl group, a methoxycarbonylmethoxycarbonyl group, an N-methylcarbamoyl group, an N-phenylcarbamoyl group, an N,N-diethylcarbamoyl group and an morpholinocarbonyl group.

Examples of the substituted sulfinyl group ($R^{014}$—SO—) represented by $R^1$ to $R^6$ include a group in which $R^{014}$ consists of a monovalent non-metallic atomic group. Preferable examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group and an N-alkyl-N-arylsulfinamoyl group. Examples of the alkyl group and aryl group in these groups include the alkyl group, substituted alkyl group, aryl group and substituted aryl group described above. More preferable examples among those mentioned above include an alkylsulfinyl group and an arylsulfinyl group. Specific examples of such substituted sulfinyl group include a hexylsulfinyl group, a benzylsulfinyl group and a tolylsulfinyl group.

The substituted phosphono group represented by $R^1$ to $R^6$ refers to a phosphono group, one or two hydroxyl groups of which are substituted with other organic oxo group(s), and preferable examples thereof include the dialkylphosphono group, the diarylphosphono group, the alkylarylphosphono group, the monoalkylphosphono group and the monoarylphosphono group. Among these groups, the dialkylphosphono group and the diarylphosphono group are more preferable. Specific examples thereof include a diethylphosphono group, a dibutylphosphono group and a diphenylphosphono group.

The phosphonato groups (—$PO_3H^-$ and —$PO_3^{2-}$) represented by $R^1$ to $R^6$ refer to conjugated base anion groups derived respectively by first dissociation of acid and acid second dissociation of acid of a phosphono group (—$PO_3H_2$). This group is usually used preferably together with a counter cation. Examples of such a counter cation include those generally known, that is, various oniums (ammonium, sulfonium, phosphonium, iodonium and azinium), as well as metal ions ($Na^+$, $K^+$, $Ca^{2+}$, $Zn^{2+}$ etc.).

The substituted phosphonato group represented by $R^1$ to $R^6$ refers to a conjugated base anion group derived from the above substituted phosphono group by replacing one of its hydroxyl groups by an organic oxo group, and specific examples include conjugated bases of the monoalkylphosphono group (—$PO_3H$(alkyl)) and monoarylphosphono group (—$PO_3H$(aryl)) described above.

Most preferable examples of the group or the atom independently represented by $R^1$ to $R^6$ include a hydrogen atom and an alkyl group, and examples of the alkyl group include a methyl group, an ethyl group, a propyl group, a butyl group, a pentyl group, a hexyl group, an isopropyl group, an isobutyl group, a sec-butyl group, a tert-butyl group, an isopentyl group, a neopentyl group and a cyclohexyl group.

From the viewpoint of easiness in availability of the synthetic material, removability of unexposed portions upon development and on-press developability, all of $R^1$ to $R^5$ in Formula (1) in the invention are preferably hydrogen atoms or alkyl groups having 6 or less carbon atoms (examples thereof include a methyl group, an ethyl group, a propyl group, a butyl group, a pentyl group, a hexyl group, an isopropyl group, an isobutyl group, a sec-butyl group, a tert-butyl group, an isopentyl group, a neopentyl group and a cyclohexyl group).

From the viewpoint of storage stability and easiness in synthesis, $R^6$ is most preferably an alkyl group (examples thereof include a methyl group, an ethyl group, a propyl group, a butyl group, a pentyl group, a hexyl group, an isopropyl group, an isobutyl group, a sec-butyl group, a tert-butyl group, an isopentyl group, a neopentyl group and a cyclohexyl group).

In Formula (1), $R^7$ and $R^8$ each dependently represent a hydrogen atom, a halogen atom, an amino group, a substituted carbonyl group, a sulfo group, a nitro group, a cyano group, an alkyl group which may have a substituent, an aryl group which may have a substituent, an alkoxy group which may have a substituent and an aryloxy group which may have a substituent, among which a hydrogen atom and an alkyl group which may have a substituent are particularly preferable from the viewpoint of printing durability and availability of raw materials, and more preferably both $R^7$ and $R^8$ are hydrogen atoms.

Specific examples of the alkyl group which may have a substituent include the same groups as those of $R^1$ to $R^6$.

Specific examples of the amino group represented by $R^7$ and $R^8$ include a methylamino group, an ethylamino group, a diethylamino group, a morpholino group, a piperidino group, a pyrrolidino group, a phenylamino group, a benzoylamino group and an acetylamino group.

Specific examples of the substituted carbonyl group represented by $R^7$ and $R^8$ include a formyl group, an acetyl group, a benzoyl group, a carboxyl group, a methoxycarbonyl group, an ethoxycarbonyl group, an allyloxycarbonyl group, a dimethylaminophenylethenylcarbonyl group, a methoxycarbonylmethoxycarbonyl group, an N-methylcarbamoyl group, an N-phenylcarbamoyl group, an N,N-diethylcarbamoyl group and an morpholinocarbonyl group.

Specific examples of the sulfo group represented by $R^7$ and $R^8$ include a butylsulfonyl group, a phenylsulfonyl group, a chlorophenylsulfonyl group, a sulfamoyl group, an N-alkylsulfamoyl group, an N,N-dialkylsulfamoyl group, an N-arylsulfamoyl group and an N-alkyl-N-arylsulfamoyl group.

Specific examples of the aryl group which may have a substituent and is represented by $R^7$ and $R^8$ include a phenyl group, a naphthyl group, an anthryl group, a phenanthryl group, an indenyl group, an acenaphthenyl group and a fluorenyl group.

Specific examples of the alkoxy group and the aryloxy group, which may have a substituent and is represented by $R^7$ and $R^8$ respectively, include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a mesityloxy group, a cumenyloxy group, a methoxphenyloxy group, an ethoxyphenyloxy group, a chlorophenyloxy group and a bromophenyloxy group.

The linking groups $X^1$ and $Y^1$ each independently represent a single bond or a divalent linking group.

$X^1$ represents a linking group which connects the main-chain skeleton of the specific polymer compound and the group represented by Formula (1).

When the divalent linking group represented by $X^1$ or $Y^1$ is a divalent organic linking group, the divalent organic linking group is preferably composed of 1 to 60 carbon atoms, 0 to 10 nitrogen atoms, 0 to 50 oxygen atoms, 1 to 100 hydrogen atoms and 0 to 20 sulfur atoms.

Specifically, it is preferable that $X^1$ and $Y^1$ each independently represent —O— or —$NR^{20}$—, in which $R^{20}$ represents a hydrogen atom, an alkyl group, or an aryl group.

Examples of the alkyl group represented by $R^{20}$ include a linear, branched or cyclic alkyl group having 1 to 20 carbon atoms. More preferable examples among those described above include a linear alkyl group having 1 to 12 carbon atoms, a branched alkyl group having 3 to 12 carbon atoms and a cyclic alkyl group having 5 to 10 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group.

Examples of the aryl group represented by $R^{20}$ include a benzene ring, a condensed ring formed by condensing two to three benzene rings, and a condensed ring formed by condensing a benzene ring and a 5-membered unsaturated ring. Specific examples thereof include a phenyl group, a naphthyl group, an anthryl group, a phenanthryl group, an indenyl group, an acenaphthenyl group, and a fluorenyl group. Among these groups, a phenyl group and a naphthyl group are more preferable.

The aryl group represented by $R^1$ to $R^6$ may have a substituent on a carbon atom forming the group. Examples of such a substituent include monovalent substituents composed of non-metallic atoms. Preferable examples of the substituent introduced into the aryl group include those which can be introduced to the alkyl group represented by any one of $R^1$ to $R^6$ described above.

Specific examples of the divalent linking groups represented by $X^1$ and $Y^1$ include the following divalent groups or those constituted by combining any of these.

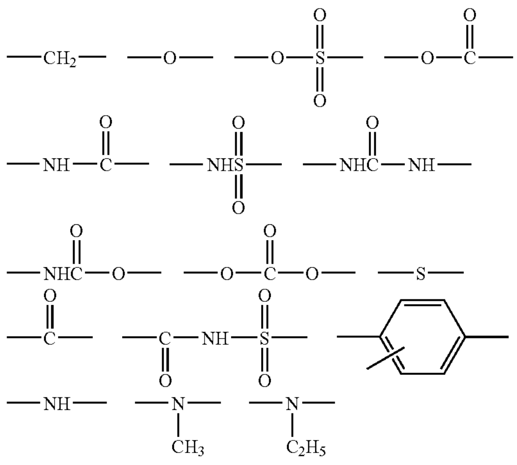

More specifically, the divalent linking groups represented by $X^1$ and $Y^1$ are preferably divalent groups represented by any one of the following structural formulae.

-continued

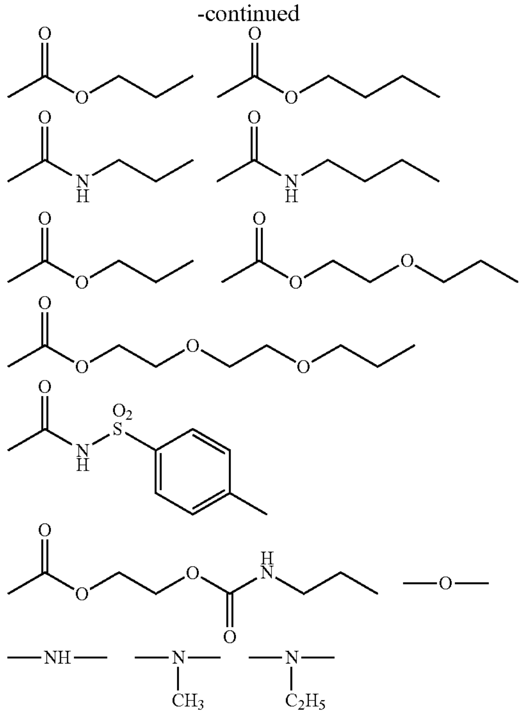

The divalent linking group represented by $X^1$ or $Y^1$ is particularly preferably —O— or —NH—.

Group Represented by Formula (2)

The group represented by Formula (2) constituting the specific polymer compound in the invention is described hereinafter.

Formula (2)

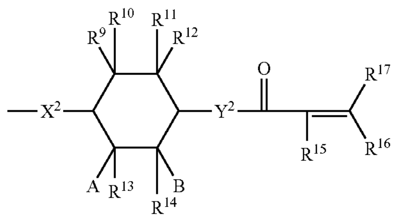

In Formula (2), $R^9$ to $R^{17}$ each independently represent a hydrogen atom or a monovalent substituent. A and B each independently represent a hydrogen atom or a monovalent substituent, and at least one of A and B is a hydroxyl group (—OH group). $X^2$ and $Y^2$ each independently represent a single bond or a divalent linking group.

When $R^9$ to $R^{15}$, A and B in Formula (2) each represent a monovalent substituent, examples of the monovalent substituent include a halogen atom, an amino group, a substituted amino group, a substituted carbonyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonato group, a substituted sulfinyl group, a phosphono group, a substituted phosphono group, a phosphonato group and a substituted phosphonato group.

Among these, $R^9$ to $R^{15}$ in Formula (2) each preferably independently represent a hydrogen atom, an alkyl group, or an aryl group from the viewpoint of providing a planographic printing plate precursor having excellently-balanced on-press developability and printing durability.

Specific examples of each substituent are the same as those of the monovalent substituent represented by $R^1$ to $R^6$ in Formula (1).

The most preferable examples of $R^9$ to $R^{15}$ include a hydrogen atom and an alkyl group, and preferable examples of the alkyl group include a methyl group, an ethyl group, a propyl group, a butyl group, a pentyl group, a hexyl group, an isopropyl group, an isobutyl group, a sec-butyl group, a tert-butyl group, an isopentyl group, a neopentyl group and a cyclohexyl group.

From the viewpoint of availability of the raw material for synthesis, removability of unexposed portions upon development and on-press developability, all $R^9$ to $R^{14}$ in Formula (2) in the invention are hydrogen atoms or alkyl groups having 6 or less carbon atoms (such as a methyl group, an ethyl group, a propyl group, a butyl group, a pentyl group, a hexyl group, an isopropyl group, an isobutyl group, a sec-butyl group, a tert-butyl group, an isopentyl group, a neopentyl group or a cyclohexyl group).

From the viewpoint of storage stability and easiness is synthesis, $R^{15}$ is most preferably an alkyl group (such as a methyl group, an ethyl group, a propyl group, a butyl group, a pentyl group, a hexyl group, an isopropyl group, an isobutyl group, a sec-butyl group, a tert-butyl group, an isopentyl group, a neopentyl group or a cyclohexyl group).

In the invention, from the viewpoint of easiness is synthesis, it is preferable that A is an OH group and B is a hydrogen atom in Formula (2).

In Formula (2), examples of the moiety represented by $R^{16}$ or $R^{17}$ include a hydrogen atom, a halogen atom, an amino group, a substituted carbonyl group, a sulfo group, a nitro group, a cyano group, an alkyl group which may have a substituent, an aryl group which may have a substituent, an alkoxy group which may have a substituent and an aryloxy group which may have a substituent. Among these, those in which $R^{16}$ and $R^{17}$ each independently represent a hydrogen atom, an alkyl group or an aryl group are preferable. Particularly, those in which $R^{16}$ and $R^{17}$ each independently represent a hydrogen atom or an alkyl group which may have a substituent are more preferable, and those in which in which both $R^{16}$ and $R^{17}$ are hydrogen atoms are particularly preferably from the viewpoint of providing a planographic printing plate precursor having excellently-balanced on-press developability and printing durability as well as the viewpoint of availability of the raw material.

Specific examples of each substituent include the monovalent substituents presented by $R^7$ and $R^8$ in Formula (1).

The linking groups $X^2$ and $Y^2$ each independently represent a single bond or a divalent linking group.

$X^2$ represents a linking group which connects the main-chain skeleton of the specific polymer compound and the group represented by Formula (2).

When the divalent linking groups represented by $X^2$ and $Y^2$ are divalent organic linking groups, each of the divalent organic linking groups is preferably composed of 1 to 60 carbon atoms, 0 to 10 nitrogen atoms, 0 to 50 oxygen atoms, 1 to 100 hydrogen atoms and 0 to 20 sulfur atoms.

Specifically, $X^2$ and $Y^2$ each preferably independently represent —O— or —$NR^{21}$—, in which $R^{21}$ represents a hydrogen atom, an alkyl group, or an aryl group. Preferable examples of the alkyl group or the aryl group represented by $R^{21}$ are the same as those of $R^{20}$.

Specific examples of the divalent linking groups represented by $X^2$ and $Y^2$ include the following divalent groups or those constituted with a combination thereof.

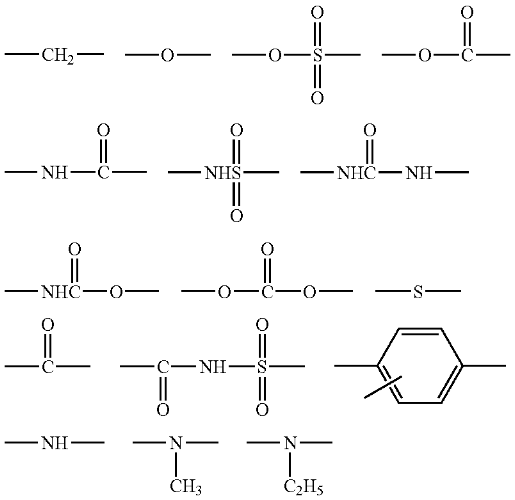

Specific examples of the divalent linking groups represented by $X^2$ and $Y^2$ include divalent groups represented by any one of the following structural formulae.

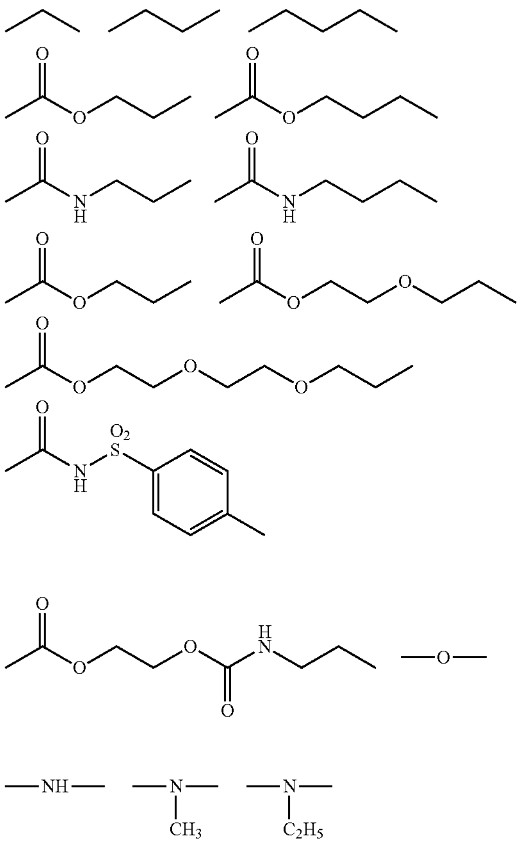

The divalent linking group represented by $X^2$ or $Y^2$ is particularly preferably —O— or —NH—.

Specific examples of structural units having the group represented by Formula (1) or (2) include the following structural units, while the scope of the invention is not limited thereby.

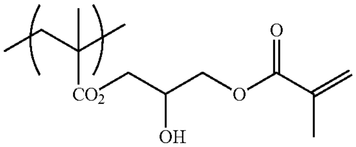

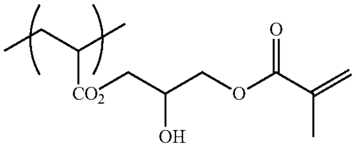

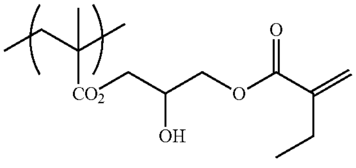

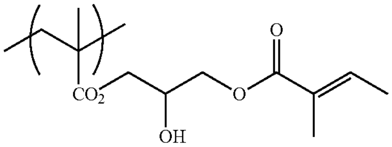

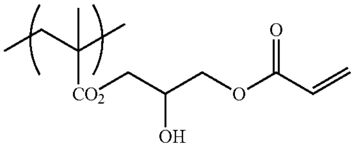

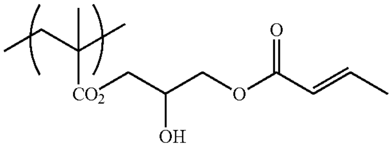

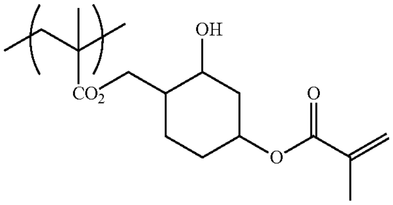

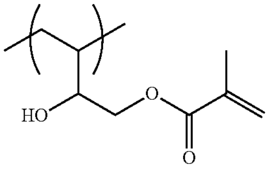

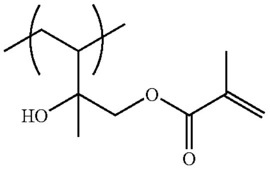

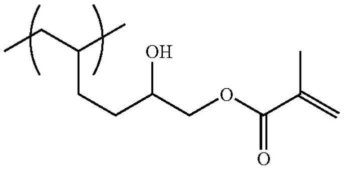

-continued
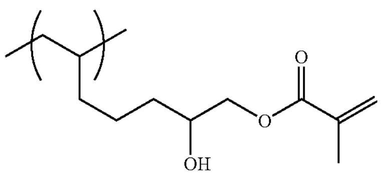
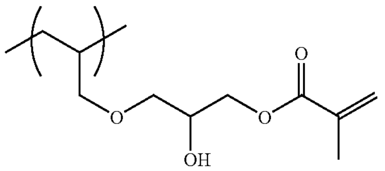
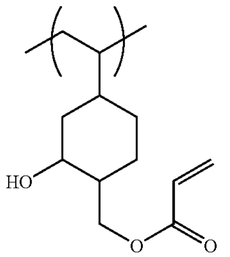
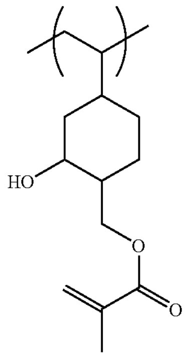
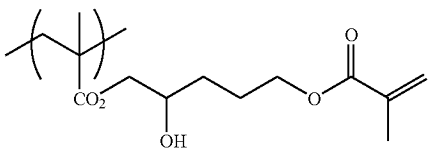
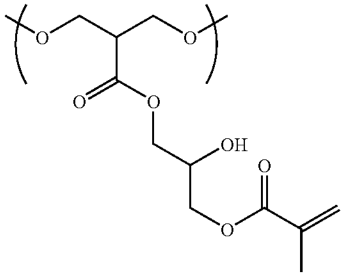
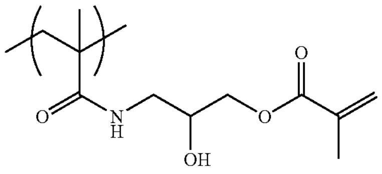
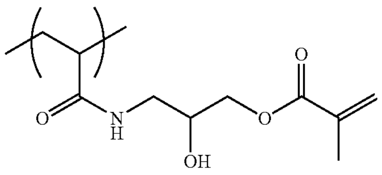
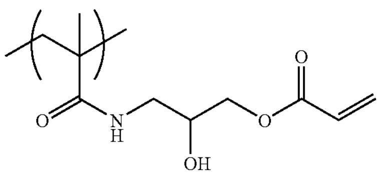
-continued
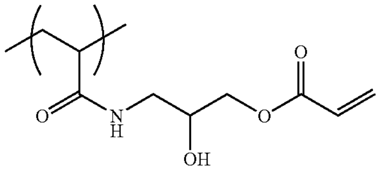
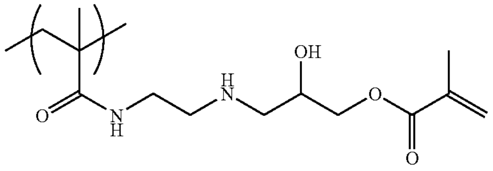
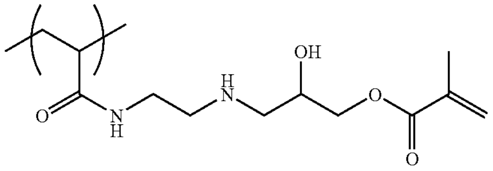
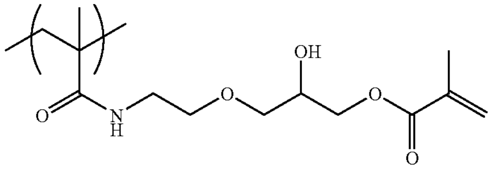
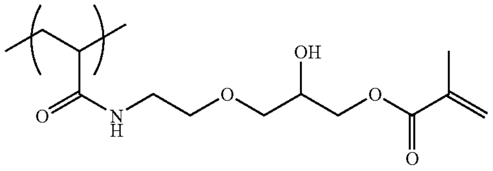
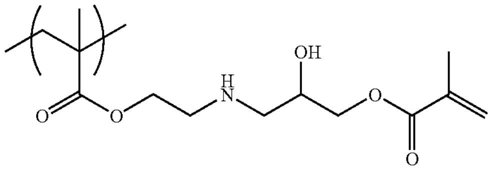
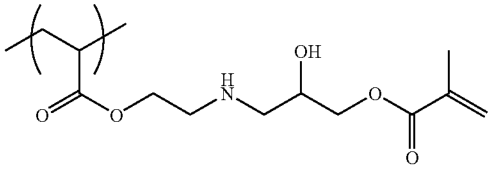
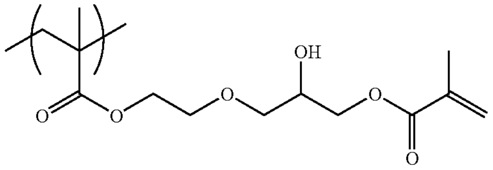
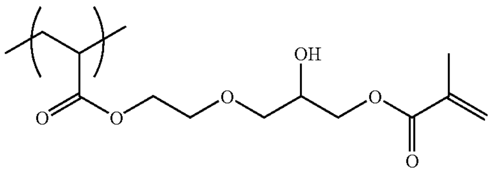
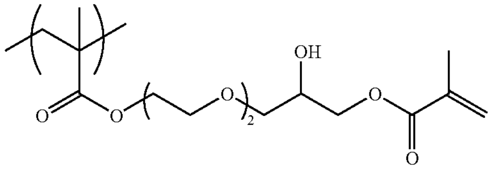

-continued

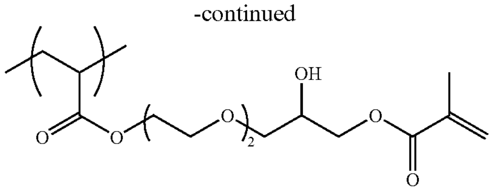

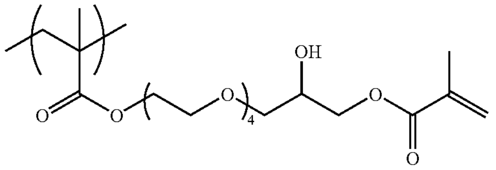

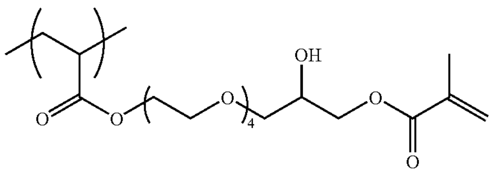

The specific polymer compound of the invention is preferably a copolymer containing structural units having the group represented by Formula (1) or (2), and the content of the structural units having the group represented by Formula (1) or (2) in this copolymer is preferably 1 to 80 mol % from the viewpoint of printing durability, more preferably 2 to 40 mol %, still more preferably 2 to 30 mol % from the viewpoint of synthesis, and most preferably 4 to 20 mol %.

Alkyleneoxy Group

The alkyleneoxy group contained in the specific polymer compound of the invention is preferably a structure represented by the following Formula (3).

Formula (3)

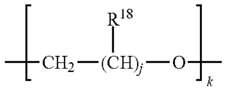

In Formula (3), $R^{18}$ represents a hydrogen atom or a methyl group, j is an integer of 1 or 2, and k is an integer of 1 to 15. When k is an integer of 2 to 9, each of the $R^{18}$ among the plural $R^{18}$s may be the same or different, and each of the integers respectively denoted by j may be the same or different.

k is preferably an integer of 1 to 15, more preferably an integer of 1 to 8, still more preferably an integer of 1 to 4, further preferably an integer of 2 to 4 from the viewpoint of printing durability and suppression of formation of development residues, and is most preferably 2.

The structure represented by Formula (3) may be contained in the main chain, or a side chain, of the specific polymer compound, while it is preferably contained in the side chain from the viewpoint of removability of unexposed portions upon development, on-press developability, prevention of generation of development scums, and printing durability.

When the structure represented by Formula (3) is contained in a side chain of the specific polymer compound, a structure of the side-chain is preferably represented by the following Formula (4).

Formula (4)

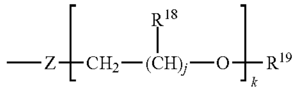

In Formula (4), $R^{18}$ represents a hydrogen atom or a methyl group, and $R^{19}$ represents a hydrogen atom, an alkyl group which may have a substituent, or an aryl group which may have a substituent.

$R^{19}$ is preferably an alkyl group which may have a substituent or an aryl group which may have a substituent. Specific examples of the alkyl group which may have a substituent and the aryl group which may have a substituent are the same as those of the alkyl group which may have a substituent and the aryl group which may have a substituent mentioned above in connection with $R^7$ and $R^8$.

j is an integer of 1 or 2, and k is an integer of 1 to 15. When k is an integer of 2 to 9, each of the $R^{18}$ among the plural $R^{18}$s may be the same or different, and each of the integers respectively denoted by j may be the same or different. k is preferably an integer of 1 to 8, more preferably an integer of 1 to 7, still more preferably an integer of 1 to 4, further preferably an integer of 2 to 4 from the viewpoint of printing durability and suppression of formation of development residues, and is most preferably 2.

Specifically, in exemplary embodiment of the structure of the side-chain represented by Formula (4), $R^{19}$ is an alkyl group having 1 to 4 carbon atoms, and k is preferably an integer of 1 to 15, more preferably an integer of 2 to 8, still more preferably an integer of 2 to 7, further preferably an integer of 2 to 4, and is most preferably 2 from the viewpoint of printing durability and suppression of formation of development residues.

Z represents a single bond or a linking group to be connected with the main-chain skeleton of the specific polymer compound (D), and preferable embodiment of the linking group for linking the main-chain skeleton are the same as those of $X^1$ in Formula (1).

Specific examples of the structural unit which is represented by Formula (3) and is contained in the main chain and specific examples of the structural units which is represented by Formula (4) and is contained in the side chain include the followings, while the scope of the invention is not limited thereto.

Structural Units Contained in Side Chain:

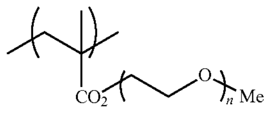

n = 1, 2, 4, 8, 9, 12

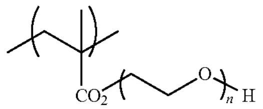

n = 1, 2, 3, 4, 8

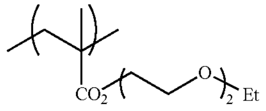

-continued

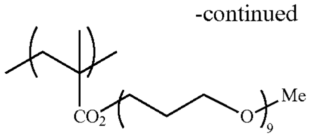

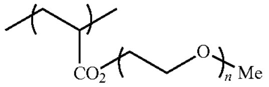

n = 1, 2, 4, 9, 13, 15

Structural Units Contained in Side Chain:

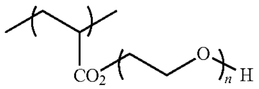

n = 1, 2, 3, 6, 9, 13

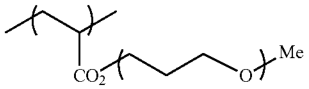

n = 3, 6, 9, 13

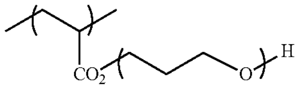

n = 3, 6, 9, 13

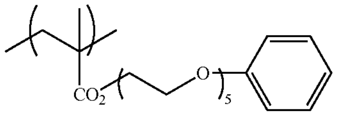

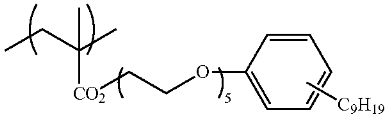

Structural Units Contained in Main Chain:

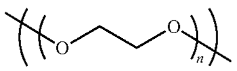

n = 1, 2, 4, 8, 10

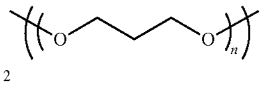

n = 1, 2

The specific polymer compound of the invention, which has the structural units having the group represented by Formula (1) or (2), is preferably a copolymer containing the structural unit of Formula (3) in the main chain thereof, or a copolymer containing the structural unit of Formula (4). The content of the structural units having the group represented by Formula (4) in the specific polymer compound is preferably 1 to 85 mol %, and is more preferably 5 to 70 mol %, from the viewpoint of removability of unexposed portions upon development, on-press developability, and prevention of generation of on-press developability scums.

The groups represented by Formula (1), (2) or (4) are groups present in side chains of the specific polymer compound. The main-chain skeleton to which these groups are bound (that is, a part or the whole of the main-chain skeleton) of the specific polymer compound preferably has the following structure.

That is, the main-chain skeleton is preferably synthesized by polymerizing one or more of radical polymerizable compounds having a carboxylic acid (acrylic acid, methacrylic acid, itaconic acid, crotonic acid, incrotonic acid, maleic acid, p-carboxylstyrene, and metal salts and ammonium compounds of these acid groups) or one or more of radical polymerizable compounds having an epoxy group (glycidyl acrylate, glycidyl methacrylate or the like), or by copolymerizing them with other radical polymerizable compounds if necessary.

Alternatively, the main-chain skeleton can also be synthesized by polyaddition reaction of a carboxyl group-containing diol compound with a diisocyanate compound. Examples of the carboxyl group-containing diol compound include 3,5-dihydroxybenzoic acid, 2,2-bis(hydroxymethyl) propionic acid, 2,2-bis(2-hydroxyethyl) propionic acid, 2,2-bis(3-hydroxypropyl) propionic acid, bis(hydroxymethyl)acetic acid, bis(4-hydroxyphenyl)acetic acid, 2,2-bis(hydroxymethyl) butyric acid, 4,4-bis(4-hydroxyphenyl)pentanoic acid, tartaric acid, N,N-dihydroxyethylglycine, and N,N-bis(2-hydroxyethyl)-3-carboxy-propionamide. Examples of the diisocyanate compound include an aromatic diisocyanate compound such as 2,4-tolylene diisocyanate, a 2,4-tolylene diisocyanate dimer, 2,6-tolylenezylene diisocyanate, p-xylylene diisocyanate, m-xylylene diisocyanate, 4,4'-diphenylmethane diisocyanate, 1,5-naphthylene diisocyanate or 3,3'-dimethylbiphenyl-4,4'-diisocyanate, an aliphatic diisocyanate compound such as hexamethylene diisocyanate, trimethylhexamethylene diisocyanate, lysine diisocyanate or dimer acid diisocyanate, an alicyclic diisocyanate compound such as isophorone diisocyanate, 4,4'-methylene-bis(cyclohexyl isocyanate), methylcylohexane-2,4 (or 2,6)diisocyanate or 1,3-(isocyanate methyl)cyclohexane, and a diisocyanate compound that is a reaction product of diol and diisocyanate, such as an adduct of 1 mole of 1,3-butylene glycol and 2 moles of tolylene diisocyanate.

Copolymerizable Components

The specific polymer compound of the invention may further contain copolymerizable components in addition to the structural units containing the group represented by Formula (1) or (2) and the structural unit containing an alkyleneoxy group (preferably the structural unit of Formula (3) when contained in the main chain, and the structural unit represented by Formula (4)) for the purpose of improving various performances such as image strength, as long as the effect of the invention is not impaired.

Examples of radical polymerizable compounds capable of forming the additionally-contained copolymerizable components include radical polymerizable compounds selected from acrylic acid esters, methacrylic acid esters, N,N-disubstituted acrylamides, N,N-disubstituted methacrylamides, styrenes, acrylonitriles, and methacrylonitriles.

Specific examples thereof include acrylic acid esters such as alkyl acrylates (in which the alkyl group preferably has 1 to 20 carbon atoms) (for example, methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, and tetrahydrofurfuryl acrylate); aryl acrylates (for example, phenyl acrylate); methacrylic esters such as alkyl methacrylates (in which the alkyl group preferably has 1 to 20 carbon atoms) (for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate); aryl methacrylates (for example, phenyl methacrylate, cresyl methacrylate, and naphthyl methacrylate); styrene and styrene compounds such as alkylstyrenes (for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene); alkoxystyrenes (for example, methoxystyrene, 4-methoxy-3-methylstyrene, and dimethoxystyrene); halogenostyrenes (for example, chlorostyrene, dichlorostyrene, trichlorostyrene, tetrachlorostyrene, pentachlorostyrene, promostyrene, dibromostyrene, iodostyrene, fluorostyrene, trifluorostyrene, 2-bromo-4-trifluoromethylstyrene, and 4-fluoro-3-trifluoromethylstyrene); acrylonitrile; methacrylonitrilacrylic acid; and carboxylic acid-containing radical polymerizable compounds (acrylic acid, methacrylic acid, itaconic acid, crotonic acid, isocrotonic acid, maleic acid, p-carboxylstyrene, and metal salts and ammonium salt compounds of these acid groups).

The specific polymer compound of the invention may have, in its molecule, an ester group represented by the following Formula (a) or an amido group represented by the following Formula (b). Radical polymerizable compounds containing these groups are also preferably used as copolymerizable components of the specific polymer compound of the invention.

(a)

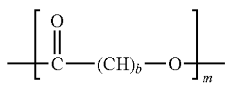

(b)

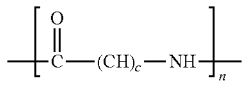

In Formulae (a) and (b), b is an integer of 2 to 5, c is an integer of 2 to 7, and m and n each independently represent an integer of 1 to 100.

Among these radical polymerizable compounds, those preferably used include acrylic esters, methacrylic esters and styrenes, and methacrylic esters are most preferable from the viewpoint of printing durability. These radical polymerizable compounds can be used singly or as a mixture of two or more thereof.

The content of these additionally-contained copolymerizable components that can be used in the specific polymer compound is typically 0 to 95 mol %, and is preferably 20 to 90 mol %, based on the total amount of the specific polymer compounds.

Specific examples of the specific polymer compound in the invention are shown below, while the invention is not limited thereto.

(1)

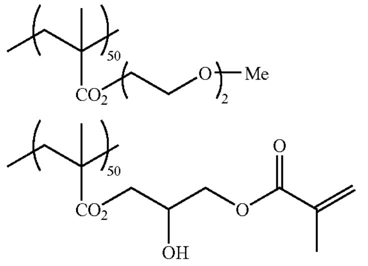

(2)

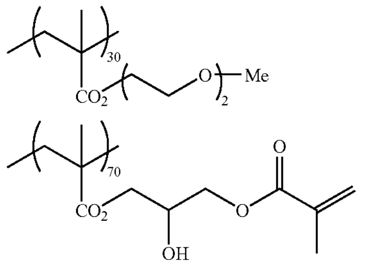

(3)

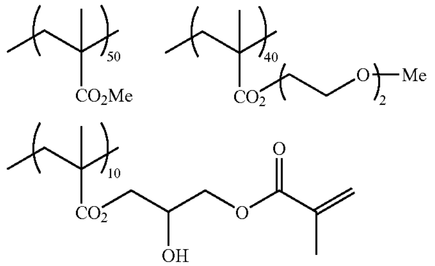

(4)

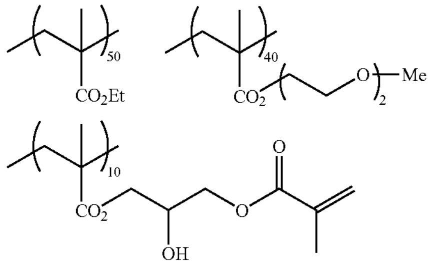

(5)

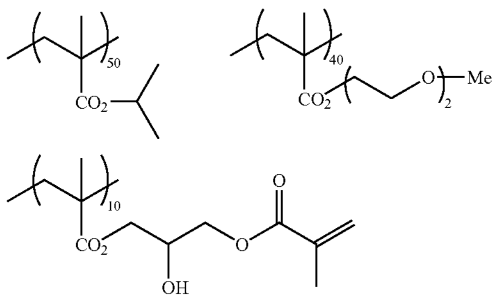

(6)

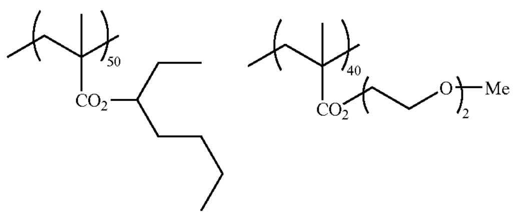

-continued
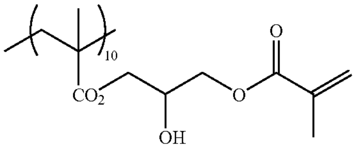
(7)
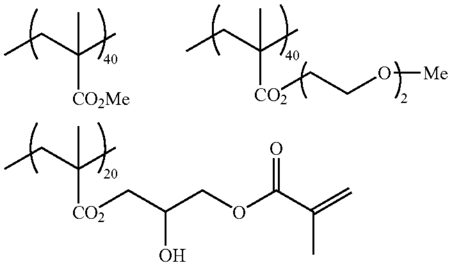
(8)
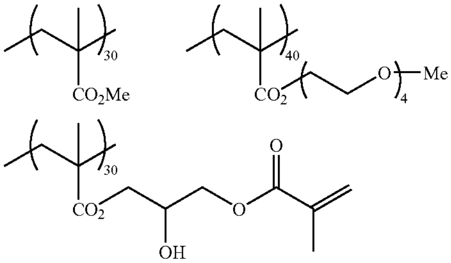
(9)
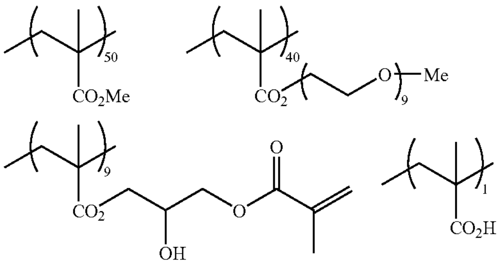
(10)
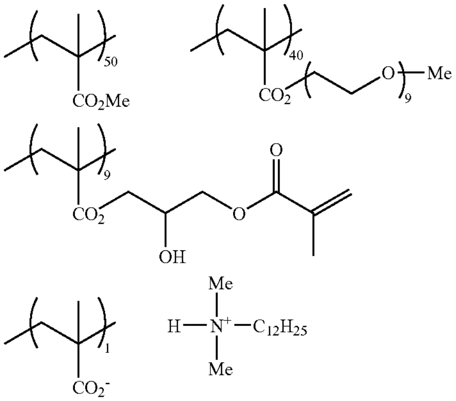
(11)
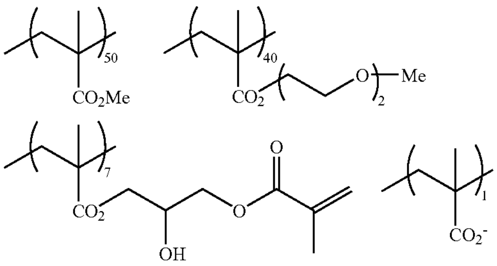
-continued
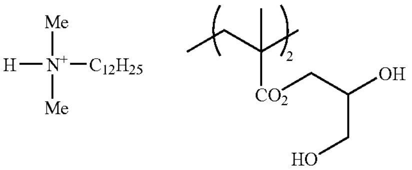
(12)
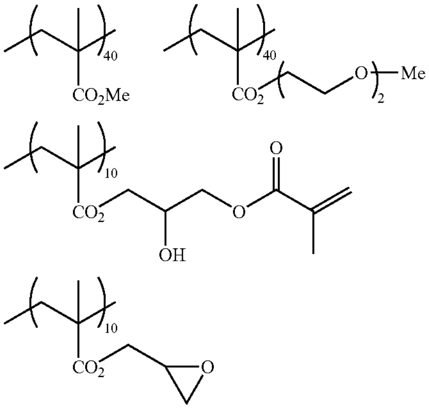
(13)
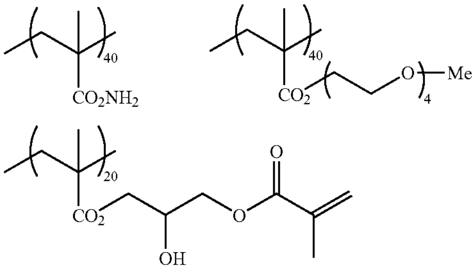
(14)
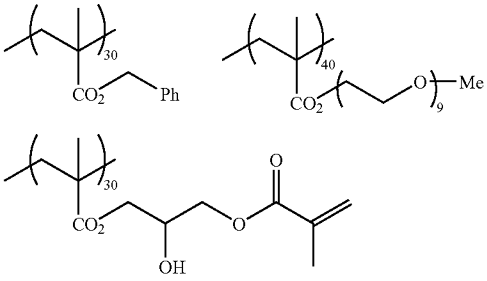
(15)
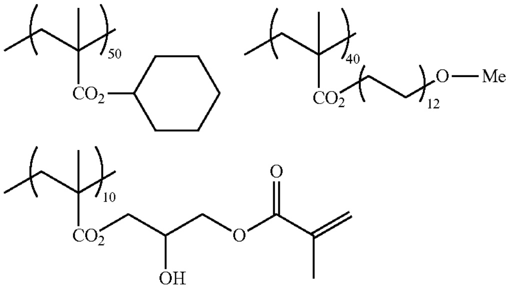
(16)
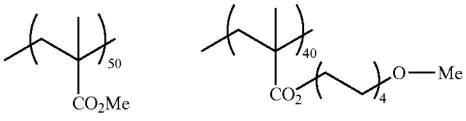

-continued
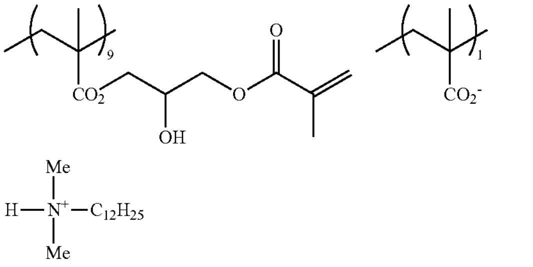
(17)
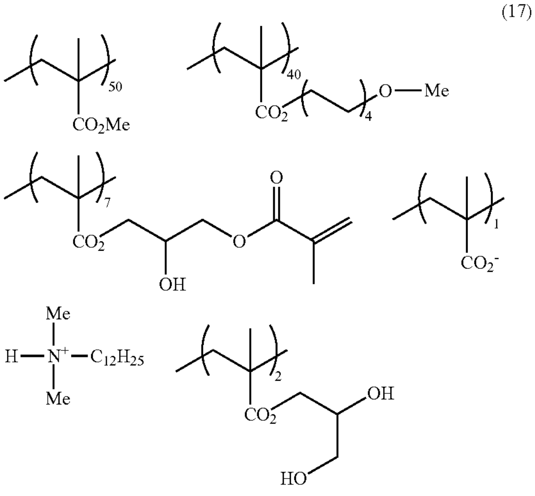
(18)
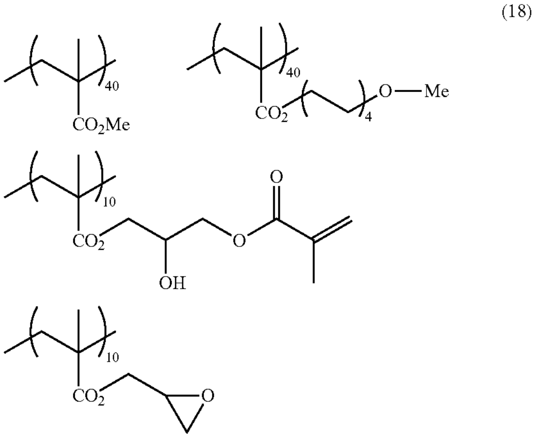
(19)
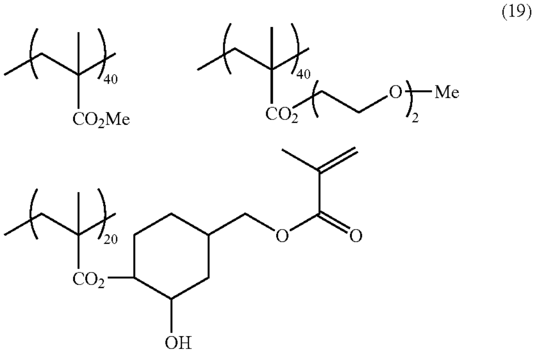
(20)
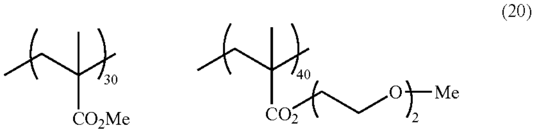
-continued
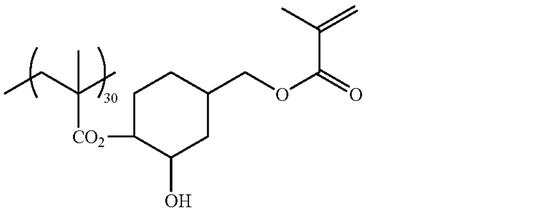
(21)
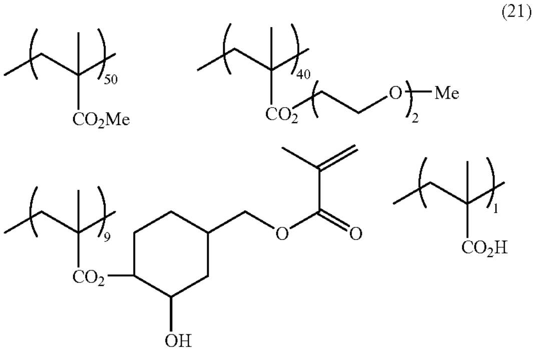
(22)
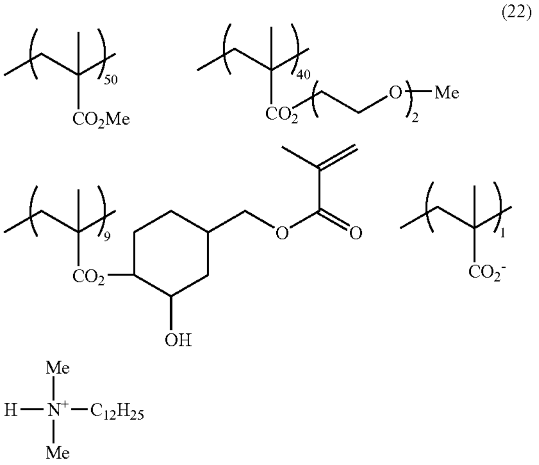
(23)
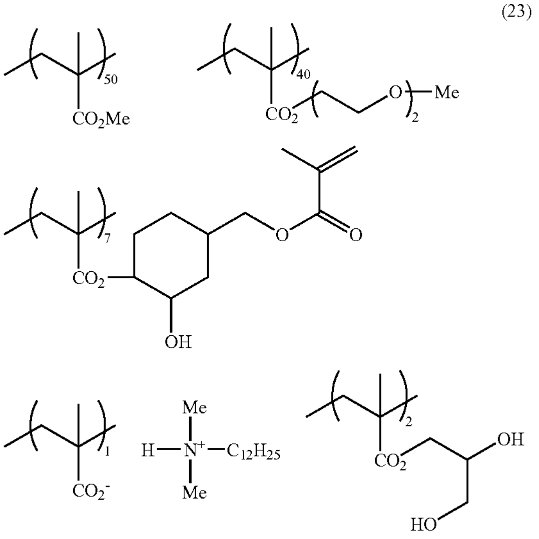
(24)
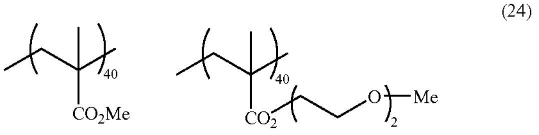

-continued

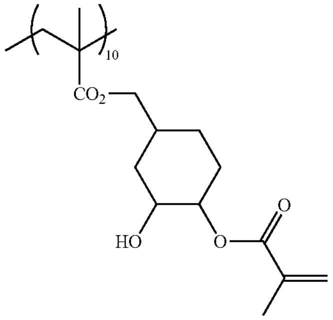

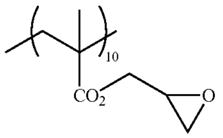

(25)

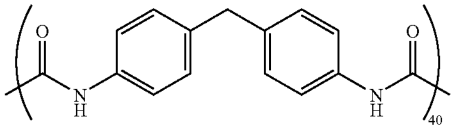

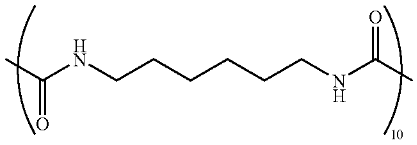

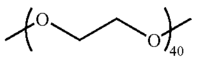

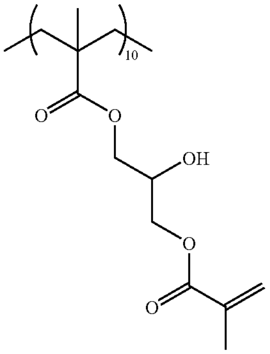

Synthesis Method

Examples of the method of introducing the group represented by Formula (1) into the specific polymer compound according to the invention include: a method that involves synthesizing a polymer compound having the group represented by the following Formula (5) and then reacting it with a compound represented by the following Formula (6); and a method that involves synthesizing a polymer compound having the group represented by the following Formula (7) and then reacting it with a compound represented by the following Formula (8). The method that involves synthesizing a polymer compound having the group represented by Formula (5) and then reacting it with a compound represented by Formula (6) is preferable from the viewpoint of the rate of introduction of crosslinking groups.

Formula (5)

$$-L^1-CO_2H$$

-continued

Formula (6)

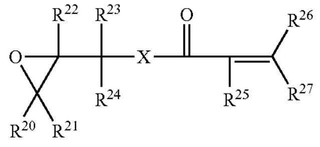

Formula (7)

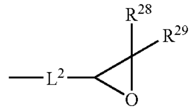

Formula (8)

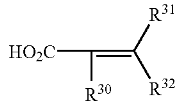

In Formulae (5) to (8), $R^{20}$ to $R^{32}$ each independently represent a monovalent substituent. Examples of $R^{20}$ to $R^{25}$ and $R^{28}$ to $R^{30}$ include a hydrogen atom and monovalent organic groups such as an alkyl group which may have a substituent, and particularly preferable examples thereof include a hydrogen atom, a methyl group, a methylalkoxy group and a methyl ester group. Any substituents among $R^{20}$ to $R^{24}$ and X may be bound with each other to form a ring structure, and any substituents among $R^{28}$, $R^{29}$ and $L^2$ may be bound with each other to form a ring structure. Examples of $R^{26}$, $R^{27}$, $R^{31}$ and $R^{32}$ include a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent, among which a hydrogen atom, a carboxyl group, an alkoxycarbonyl group, an alkyl group which may have a substituent and an aryl group which may have a substituent. Examples of a substituent that may be introduced into these groups include a methoxycarbonyl group, an ethoxycarbonyl group, an isopropyoxycarbonyl group, a methyl group, an ethyl group and a phenyl group.

Each of $L^1$ and $L^2$ represents a linking group which is connected to the main-chain skeleton of the specific polymer compound. $L^1$ and $L^2$ each independently represent a single bond or a divalent organic linking group.

The divalent organic linking group represented by $L^1$ or $L^2$ is preferably composed of 1 to 60 carbon atoms, 0 to 10 nitrogen atoms, 0 to 50 oxygen atoms, 1 to 100 hydrogen atoms and 0 to 20 sulfur atoms.

Specific examples of the divalent organic linking group include the following divalent groups and those constituted with a combination thereof.

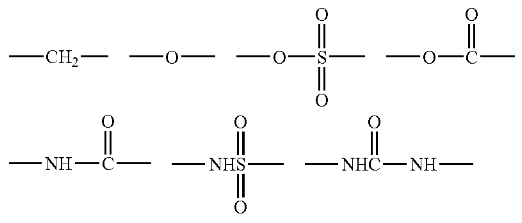

-continued

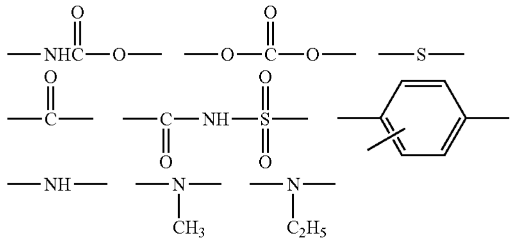

More specifically, preferable examples of the divalent organic linking groups represented by $L^1$ or $L^2$ include divalent groups represented by the following structural formulae.

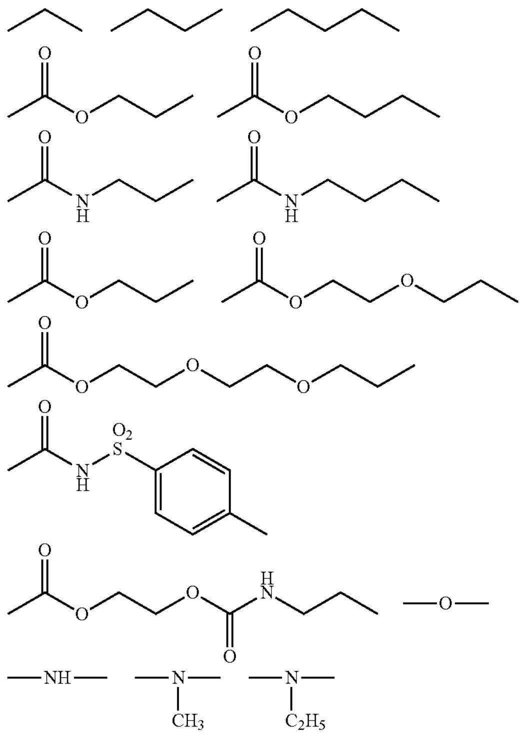

The divalent organic linking group represented by $L^1$ or $L^2$ is particularly preferably —O— or —NH—.

The polymer compound having the group represented by Formula (5) or (7) may be a block copolymer, a random copolymer or a graft copolymer.

An introduction of an alkyleneoxy group into the main chain of the specific polymer compound can be performed by a method including copolymerizing a copolymerizing radical polymerizable compound having an alkyleneoxy group.

An introduction of an alkyleneoxy group into a side chain of the specific polymer compound can be performed by a method including performing polyaddition reaction between a diol compound having an alkyleneoxy group and a diisocyanate compound.

Examples of solvents used in synthesis of such specific polymer compounds include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethyl acetamide, dimethyl sulfoxide, toluene, ethyl acetate, methyl lactate and ethyl lactate. These solvents may be used singly or as a mixture of two or more thereof.

The weight-average molecular weight (Mw) of the specific polymer compound of the invention is preferably 2,000 or more, preferably in the range of 40,000 to 300,000 from the viewpoint of printing durability, and most preferably in the range of 40,000 to 90,000 from the viewpoint of developability. The specific polymer compound of the invention may further contain unreacted monomers. In this case, the content of monomers in the specific polymer compound is desirably 15% by mass or less.

The content of the specific polymer compound in the image recording layer in the planographic printing plate precursor of the invention is preferably 5 to 95% by mass, and is more preferably 10 to 85% by mass, in terms of solid content based on the total amount of the image recording layer. When the content is in this range, excellent image strength and image formability can be attained.

Additionally-Contained Binder Polymer

The image recording layer of the planograhic printing plate precursor may further contain an additionally-contained binder polymer for improving film strength thereof.

Any one of known binder polymers may be used as the additionally-contained binder polymer without particular restriction. The binder is preferably a polymer having a film forming property. Examples of the binder polymer include acrylic resins, polyvinylacetal resins, polyurethane resins, polyurea resins, polyimide resins, polyamide resins, epoxy resins, methaerylic resins, polystyrene resins, novolak phenol resins, polyester resins, synthetic rubbers, and natural rubbers.

In a case where the image recording layer is on-press developable, the additionally-contained binder polymer preferably has higher solubility or dispersibility in printing ink and/or damping water in view of improvement in on-press developability of an unexposed portion of the image recording layer.

The additionally-contained binder polymer is preferably lipophilic from the viewpoint of improving the solubility or dispersibility in printing ink. On the other hand, the additionally-contained binder polymer is preferably hydrophilic from the viewpoint of improving the solubility or dispersibility in damping water. Therefore, in the invention, it is effective to use a combination of a lipophilic binder polymer and a hydrophilic binder polymer.

Examples of hydrophilic binder polymers include polymers having hydrophilic groups such as a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group, or a phosphoric acid group.

Specific examples thereof include gum arabic, casein, gelatin, starch compounds, carboxymethylcellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinylalcohols, hydrolyzed polyvinyl acetates having a hydrolysis degree of 60 mmol % or more, preferably 80 mol % or more, polyvinylformal, polyvinylbutyral, polyvinylpyrrolidone, homopolymers and copolymers of acrylamide, homopolymers and copolymers of methacrylamide, homopolymers and copolymers of N-methylol acrylamide, polyvinylpyrrolidone, alcohol-soluble nylons, and polyethers of 2,2-bis-(4-hydroxyphenyl)-propane and epichlorohydrin.

The weight-average molecular weight of the binder polymer is preferably 2,000 or more, more preferably 5,00 or more, and is further preferably 10,000 to 300,000, and the number-average molecular weight of the additionally-contained binder polymer is preferably 1,000 or more, and is more preferably 2,000 to 250,000. The polydispersity (weight-average molecular weight/number-average molecular weight) is preferably 1.1 to 10.

The additionally-contained binder polymer may be obtained by purchasing commercially-available products or by synthesizing according to conventionally-known methods.

The content of simultaneously usable binder polymers is preferably 20% by mass or less) more preferably 10% by mass or less, and is still more preferably 6% by mass or less, based on the total amount of all binder polymers in the image recording layer in the invention.

The ratio between the amount of the polymerizable monomer (C) relative to that of the binder polymers (the total amount of the specific polymer compound and other binder polymers) in the image recording layer in the invention is preferably in a ratio of from 0.5/1 to 4/1 by mass.

(A) Infrared Absorbing Agent

The planographic printing plate precursor of the invention essentially contains at least (A) the infrared absorbing agent. The utilization of (A) the infrared absorbing agent allows image formation by using a laser for emitting infrared rays with a wavelength of 760 to 1200 nm as a light source.

The infrared absorbing agent has the function of converting absorbed infrared rays into heat and the function of performing electron transfer and/or energy transfer to the polymerization initiator (radical generator), which is described in the following, by being excited with infrared rays. The infrared absorbing agent used in the invention is a dye or a pigment having the absorption maximum at a wavelength of 760 to 1200 nm.

Examples of the dye include commercially available dyes and the compounds described in literatures such as "Dye Handbook" (ed. Soc. Synthetic Organic Chemistry, 1970), may be used. Specific examples thereof include dyes azo dyes, metal complex salt azo dyes, pyrazolone azo dyes, naphthoquinone dyes, anthraquinone dyes, phthalocyanine dyes, carbonium dyes, quinonimine dyes, methine dyes, cyanine dyes, squarylium colorants, pyrylium salts, or metal thiolate complexes.

Preferable examples of the dye include cyanine dyes such as those described in JP-A Nos. 58-125246, 59-84356, and 60-78787; methine dyes such as those described in JP-A Nos. 58-173696, 58-181690, and 58-194595; naphthoquinone dyes such as those described in JP-A Nos. 58-112793, 58-224793, 59-48187, 59-73996, 60-52940, and 60-63744; squarylium colorants such as those described in JP-A No. 58-112792; and cyanine dyes such as those described in British Patent No. 434,875.

Also preferably used are infrared-absorbing sensitizers such as those described in U.S. Pat. No. 5,156,938; substituted arylbenzo(thio)pyrylium salts such as those described in U.S. Pat. No. 3,881,924; trimethine thiapyrylium salts such as those described in JP-A No. 57-142645 (U.S. Pat. No. 4,327,169); pyrylium compounds such as those described in JP-A Nos. 58-181051, 58-220143, 59-41363, 59-84248, 59-84249, 59-146063, and 59-146061; cyanine colorants such as those described in JP-A No. 59-216146; pentamethine thiopyrylium salts and others such as those described in U.S. Pat. No. 4,283,475; and pyrylium compounds such as those described in JP-B Nos. 5-13514 and 5-19702. Other preferable examples of the dye include infrared-absorbing dyes represented by Formulae (1) or (II) described in U.S. Pat. No. 4,756,993.

Yet other preferable examples of the photoabsorbing material used in the invention include the specific indolenine cyanine colorants described in JP-A No. 2002-278057, whose examples are shown below.

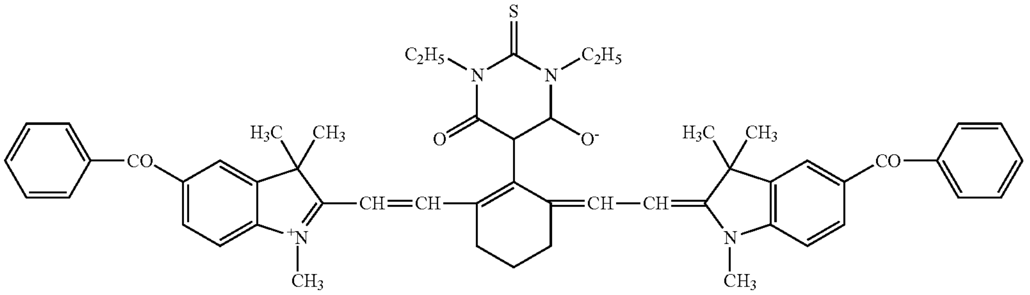

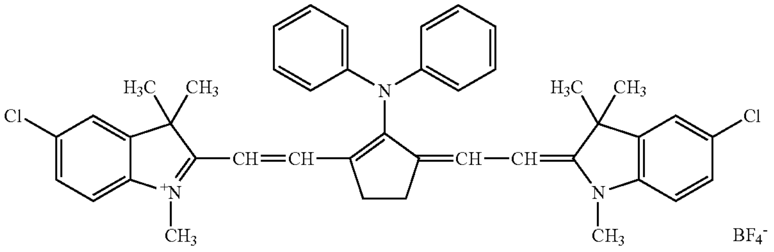

-continued

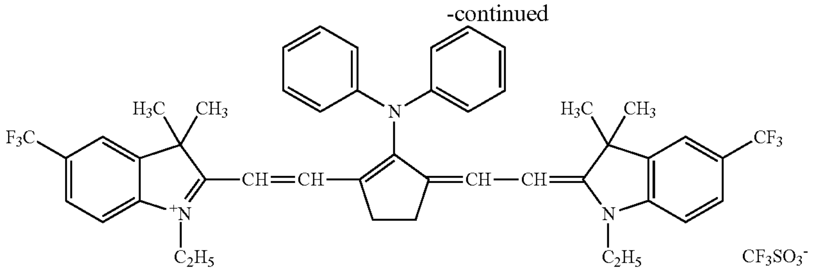

Particularly preferable examples among the dyes include cyanine dyes, squarylium dyes, pyrylium salts, nickel thiolate complexes, and indolenine cyanine dyes. Cyanine dyes and indolenine cyanine dyes are more preferable, and cyanine dyes represented by the following Formula (1) are particularly preferable.

Formula (i)

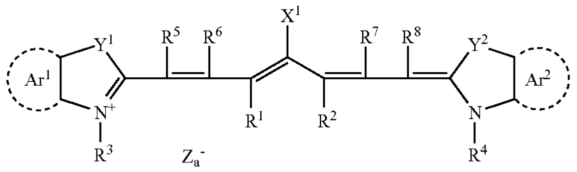

In Formula (1), $X^1$ represents a hydrogen atom, a halogen atom, —$NPh_2$, $X^2$-$L^1$ or the group shown below. In the Formula, $X^2$ represents an oxygen atom, a nitrogen atom, or a sulfur atom; and $L^1$ represents a hydrocarbon group having 1 to 12 carbon atoms, a heteroatom-containing aromatic ring, or a heteroatom-containing hydrocarbon group having 1 to 12 carbon atoms. The "heteroatom" means a nitrogen atom, a sulfur atom, an oxygen atom, a halogen atom, or a selenium atom. In the group shown below, $X_a^-$ has the same definition as $Z_a^-$ described below; and $R^a$ represents a substituent selected from a hydrogen atom, an alkyl group, an aryl group, a substituted and unsubstituted amino group, and a halogen atom.

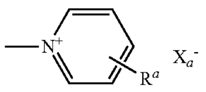

In Formula (1), $R^1$ and $R^2$ each independently represent a hydrocarbon group having 1 to 12 carbon atoms. From the point of the storage stability of the image recording layer coating liquid, $R^1$ and $R^2$ respectively preferably represent a hydrocarbon group having two or more carbon atoms. In a particularly preferable embodiment, $R^1$ and $R^2$ bind to each other to form a five- or six-membered ring.

$Ar^1$ and $Ar^2$ may be the same as or different from each other, and each independently represent an aromatic hydrocarbon group which may have a substituent. Preferable examples of the aromatic hydrocarbon group include benzene rings and naphthalene rings. Preferable examples of the substituent include hydrocarbon groups having 12 or fewer carbon atom(s), halogen atom(s), and alkoxy groups having 12 or fewer carbon atom(s). $Y^1$ and $Y^2$ may be the same as or different from each other, and each independently represent a sulfur atom or a dialkylmethylene group having 12 or fewer carbon atoms. $R^3$ and $R^4$ may be the same as or different from each other, and each independently represent a hydrocarbon group having 20 or fewer carbon atoms that may have a substituent. Preferable examples of the substituent thereon include alkoxy groups having 12 or fewer carbon atoms, a carboxyl group, and a sulfo group. $R^5$, $R^6$, $R^7$ and $R^8$ may be the same as or different from each other, and each independently represent a hydrogen atom or a hydrocarbon group having 12 or fewer carbon atoms. Each of $R^5$, $R^6$, $R^7$ and $R^8$ preferably represents a hydrogen atom, from the point of availability of the raw material. $Z_a^-$ represents a counter anion. However, when the cyanine colorant represented by Formula (1) has an anionic substituent in the structure and there is no need for neutralization of the electric charge, $Z_a^-$ is unnecessary. From the point of the storage stability of the image recording layer coating liquid, $Z_a^-$ preferably represents a halogen ion, a perchloric acid ion, a tetrafluoroborate ion, a hexafluorophosphate ion, or a sulfonic acid ion, and particularly preferably represents a perchloric acid ion, a hexafluorophosphate ion, or an aryl sulfonic acid ion.

Specific examples of the cyanine colorants represented by Formula (1) preferably used in the invention include those described in JP-A No. 2001-133969, paragraph numbers 0017 to 0019.

Other preferable examples thereof include the above-mentioned specific indolenine cyanine colorants described in JP-A No. 2002-278057.

Examples of the pigment usable in the invention include commercially available pigments and the pigments described in Color Index (C.I.) Handbook, "Latest Pigment Handbook" (Japan Society of pigment technologies Ed., 1977), "Latest Pigment Application Technologies" (OMC Publishing, 1986), and "Printing Ink Technology" (CMC Publishing, 1984).

Examples of the pigments include black pigments, yellow pigments, orange pigments, brown pigments, red pigments, purple pigments, blue pigments, green pigments, fluorescent pigments, metal powder pigments, as well as polymer-bound colorants. Specific examples thereof include insoluble azo pigments, azolake pigments, condensation azo pigments, chelate azo pigments, phthalocyanine pigments, anthraquinone-based pigments, perylene pigments, perynone pigments, thioindigo pigments, quinacridone pigments, dioxazine pigments, isoindolinone pigments, quinophtharone pigments, dyed lake pigments, azine pigments, nitroso pigments, nitro pigments, natural pigments, fluorescent pigments, inorganic pigments, and carbon black. Among these pigments, carbon black is preferable.

These pigments may be used either with or without surface treatment. Examples of the surface treatment methods include methods of coating a resin or wax on the surface of pigment; methods of attaching a surfactant thereon; and methods of binding a reactive substance (e.g., a silane coupling agent, epoxy compound, polyisocyanate, or the like) to the surface of the pigment. The surface treatment methods above are described in "Properties and Applications of Metal Soaps" (Saiwai Shobo), "Printing Ink Technologies" (CMC Publishing, 1984) and "Latest Pigment Application Technologies" (CMC Publishing, 1986).

The particle diameter of the pigment is preferably in the range of 0.01 to 10 μm, more preferably of 0.05 to 1 μm, and particularly preferably of 0.1 to 1 μm. Within the range above, satisfactory dispersion quality of the pigment in the image recording layer coating liquid, and excellent uniformity of the image recording layer are achieved.

The method for dispersing the pigment may be any one of the dispersion techniques known in the art and used for production of inks, toners, and the like. Suitable dispersing machines include an ultrasonic dispersing machine, a sand mill, an attriter, a pearl mill, a super mill, a ball mill, an impeller, a disperser, a KD mill, a colloid mill, a dynatron, a three roll mill, and a pressurized kneader. More detailed description on such dispersing machines is found in the "Latest Pigment Application Technologies" (CMC Publishing, 1986).

The photoabsorbing material may be added to the same layer containing other components or to a layer separate from the layer containing other components. The photoabsorbing material may be added during production of a negative planographic printing plate precursor such that the absorbance of the image recording layer at the maximum absorption wavelength in the wavelength range of 760 to 1,200 nm, as determined by a reflection measurement method, falls in the range of 0.3 to 1.2, preferably in the range of 0.4 to 1.1. Within the range above, the polymerization reaction progresses uniformly in the depth direction of the image recording layer, so that the image portion has favorable film strength and favorable adhesiveness to the support.

The absorbance of the image recording layer can be adjusted by the amount of the Infrared absorbing agent added to the image recording layer and the thickness of the image recording layer. The absorbance can be determined by an ordinary method. The measurement method may be a method including formin, on a reflective support such as of aluminum, a recording layer having a post-drying coating amount that is adequately selected within a suitable range for a planographic printing plate and measuring the reflection density thereof with an optical densitometer, a method of measuring the reflection density with a spectrophotometer using an integrating sphere, or the like.

The amount of the photoabsorbing material to be added to the image recording layer is preferably 0.1 to 10 wt %, and is more preferably 0.5 to 5 wt %, with respect to the amount of the total solid contents in the image recording layer of the planographic printing plate precursor of the invention.

(B) Polymerization Initiator

The (B) polymerization initiator (radical polymerization initiator) is a compound that generates a radical by light, heat, or both and initiates and promotes polymerization of the polymerizable monomer (C) and the specific polymer compound (D). Examples of the polymerization initiator usable in the invention include known thermal polymerization initiators, compounds containing a bond having a small bond dissociation energy, and photopolymerization initiators.

Examples of the radical generating compound include organic halides, carbonyl compounds, organic peroxide compounds, azo-based polymerization initiators, azide compounds, metallocene compounds, hexaarylbiimidazole compounds, organic borate compounds, disulfonic acid compounds, oxime ester compounds, and onium salt compounds.

Specific examples of the organic halides include the compounds described in Wakabayashi et al., "Bull Chem. Soc Japan" 42, 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243, and 63-298339, and M. P. Hutt, "Journal of Heterocyclic Chemistry", 1 (No. 3), (1970)"; and particularly preferable are oxazole compounds substituted by a trihalomethyl group, and S-triazine compounds.

More preferable examples of the organic halides include s-triazine compounds and oxidiazole compounds having at least one mono-, di-, or tri-halogen-substituted methyl group.

Specific examples thereof include: 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-(p-bromophenyl)-4,6-bis(trichloromethyl)-s-triazine, 2-(p-fluorophenyl)-4,6-bis(trichloromethyl)-s-triazine, 2-(p-trifluorometjylphenyl)-4,6-bis(trichloromethyl)-s-triazine, 2-(2,6-dichlorophenyl)-4,6-bis(trichloromethyl)-s-triazine, 2-(2,6-dicbromophenyl)-4,6-bis(trichloromethyl)-s-triazine, 2-(4-biphenylyl)-4,6-bis(trichloromethyl)-s-triazine, 2-(4'-chrolo-4-biphenylyl)-4,6-bis(trichloromethyl)-s-triazine, 2-(p-cyanophenyl)-4,6-bis(trichloromethyl)-s-triazine, 2-(p-acetylphenyl)-4,6-bis(trichloromethyl)-s-triazine, 2-p-ethoxycarbonylphenyl)-4,6-bis(trichloromethyl)-s-triazine, 2-(p-phenoxycarbonylphenyl)-4,6-bis(trichloromethyl)-s-triazine, 2-(p-methylsulfonlylphenyl)-4,6-bis(trichloromethyl)-s-triazine, 2-(p-dimethylsulfoniumphenyl)-4,6-bis(trichloromethyl)-s-triazine tetrafluoroborate, 2-(2,4-difluorophenyl)-4,6-bis(trichloromethyl)-s-triazine, 2-(p-diethoxyphosphorylphenyl)-4,6-bis(trichloromethyl)-s-triazine, 2-[4-(4-hydroxyphenylcarbonylamino)phenyl]-4,6-bis(trichloromethyl)-s-triazine, 2-[4-(p-methoxyphenyl)-1,3-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, 2-(o-methoxystyryl)-5-trichloromethyl-1,3,4-oxadiazole, 2-(3,4-epoxystyryl)-5-trichloromethyl-1,3,4-oxadiazole, 2-[1-phenyl-2-(4-methoxystyryl)vinyl]-5-trichloromethyl-1,3,4-oxadiazole, 2-(p-hydroxystyryl)-5-trichloromethyl-1,3,4-oxadiazole, 2-(3,4-dihydroxystyryl)-5-trichloromethyl-1,3,4-oxadiazole, and 2-(p-t-butoxystyryl)-5-trichloromethyl-1,3,4-oxadiazole.

Examples of the carbonyl compounds include: benzophenone; benzophenone compounds such as Michler's ketone, 2-methylbenzophenone, 3-methylbenzophenone, 4-methylbenzophenone, 2-chlorobenzophenone, 4-bromobenzophenone, or 2-carboxybenzophenone;

acetophenone compounds such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)

ketone, 1-hydroxy-1-(p-dodecylphenyl)ketone, 2-methyl-(4'-(methylthio)phenyl)-2-morpholino-1-propanone, or 1,1,1-trichloromethyl-(p-butylphenyl)ketone;

thioxanthone compounds such as thioxanthone, 2-ethylthioxanthone, 2-isopropylthioxanthone, 2-chlorothioxanthone, 2,4-dimethylthioxanthone, 2,4-diethylthioxanthone, or 2,4-diisopropylthioxanthone; and benzoate ester compounds such as ethyl p-dimethylaminobenzoate or ethyl p-diethylaminobenzoate.

Examples of the azo compounds include the azo compounds described in JP-A No. 8-108621.

Examples of the organic peroxide compounds include trimethylcyclohexanone peroxide, acetylacetone peroxide, 1,1-bis(tert-butylperoxy)-3,3,5-trimethyleyclohexane, 1,1-bis (tert-butylperoxy)cyclohexane, 2,2-bis(tert-butylperoxy) butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, persuccinic acid, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxylaurate, tercil carbonate, 3,3',4,4'-tetra-(t-butyl peroxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl-di(t-butylperoxydihydrogen diphthalate), and carbonyl-di(t-hexylperoxydihydrogen diphthalate).

Examples of the metallocene compounds include: various titanocene compounds described in JP-A Nos. 59-152396, 61-151197, 63-41484, 2-249, 2-4705, and 5-83588 such as di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, and di-methylcyclopentadienyl-Ti-bis-2,3,4,5,6-pentafluorophen-1-yl; and the iron-arene complexes described in JP-A Nos. 1-304453 and 1-152109.

Examples of the azide compounds include 2,6-bis(4-azidobenzylidene)-4-methylcyclohexanone.

Examples of the hexaarylbiimidazole compounds include various compounds described, for example, in JP-B No. 6-29285, U.S. Pat. Nos. 3,479,185, 4,311,783, and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenylbiimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Specific examples of the organic borate salt compounds include the organic borate salts described, for example, in JP-A Nos. 62-143044, 62-150242, 9-188685, 9-188686, 9-188710, 2000-131837, and 2002-107916, Japanese Patent 2764769, JP-A No. 2002-116539, and Kunz, Martin, "Rad Tech '98. Proceeding Apr. 19-22, 1998, Chicago"; the organic boron sulfonium complexes or organic boron oxosulfonium complexes described in JP-A Nos. 6-157623, 6-175564, and 6-175561; the organic boron iodonium complexes described in JP-A Nos. 6-175554 and 6-175553; the organic boron phosphonium complexes described in JP-A No. 9-188710; the organic boron transition metal coordination complexes described in JP-A Nos. 6-348011, 7-128785, 7-140589, 7-306527, and 7-292014.

Examples of the disulfonated compounds include the compounds described in JP-A Nos. 61-166544 and 2003-328465.

Examples of the oxime ester compounds include the compounds described in J. C. S. Perkin II (1979) 1653-1660, J. C. S. Perkin II (1979) 156-162, Journal of Photopolymer Science and Technology (1995) 202-232, JP-A Nos. 2000-66385 and 2000-80068, and specific examples thereof include the compounds represented by the following structural formulae.

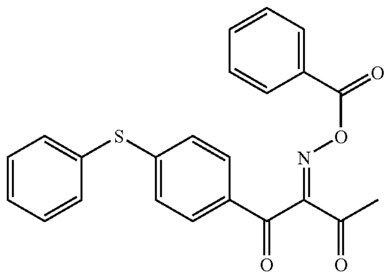

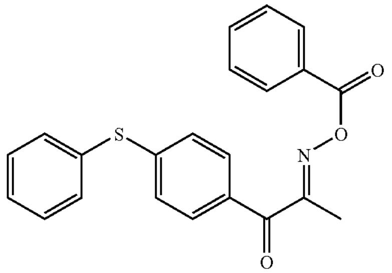

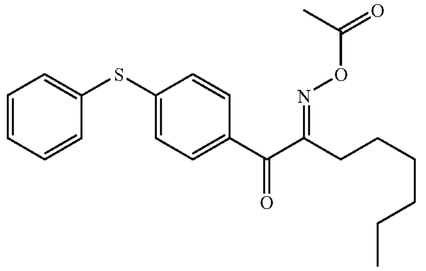

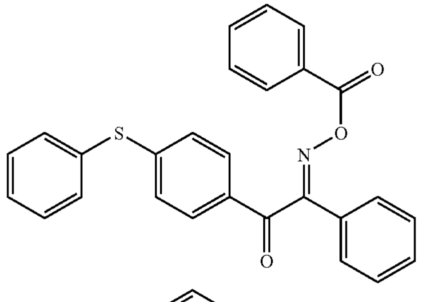

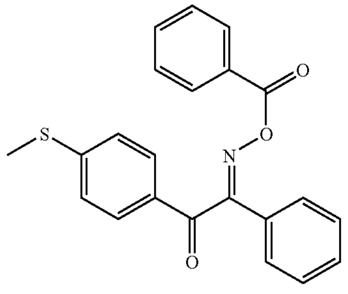

-continued
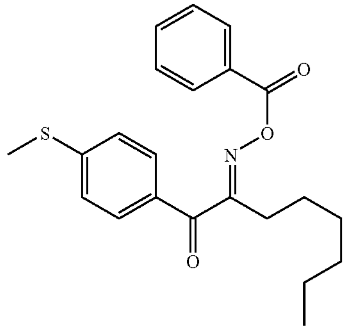
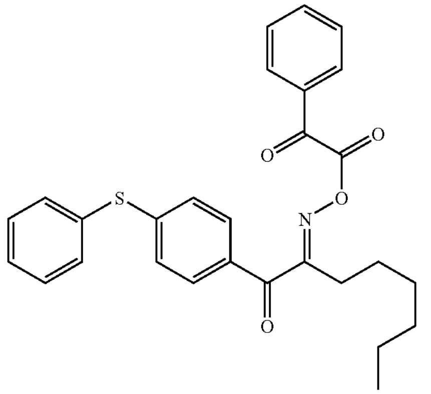
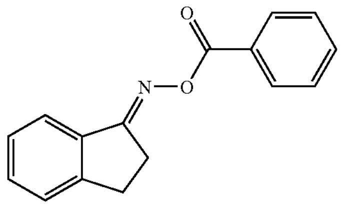
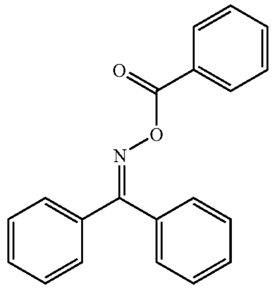
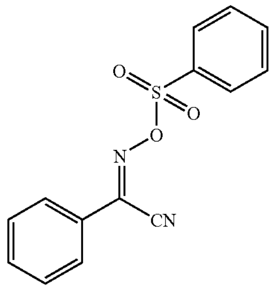
-continued
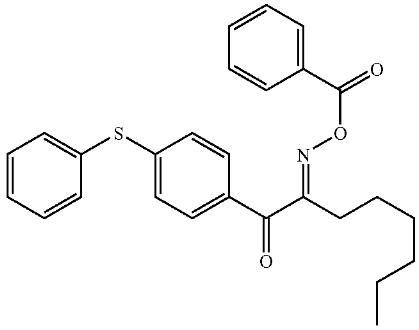
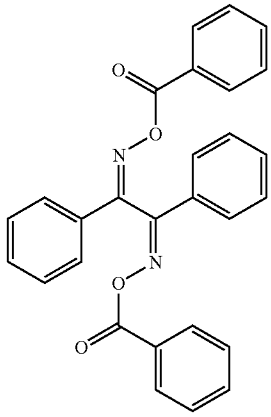
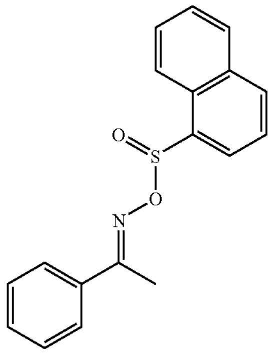
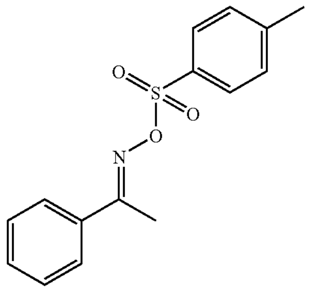
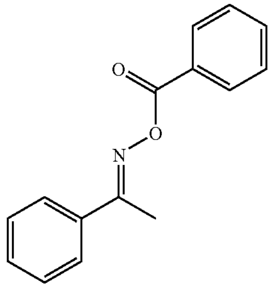

-continued

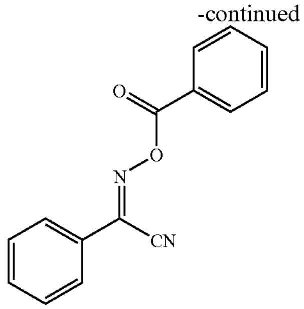

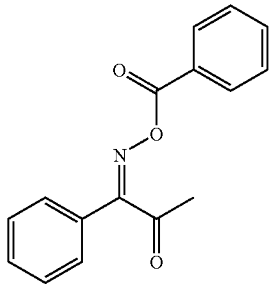

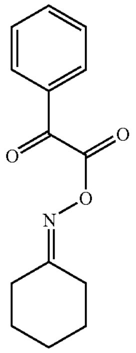

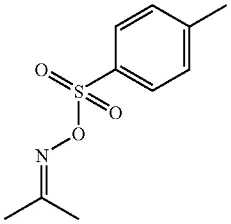

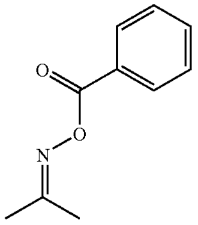

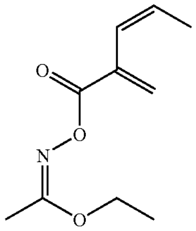

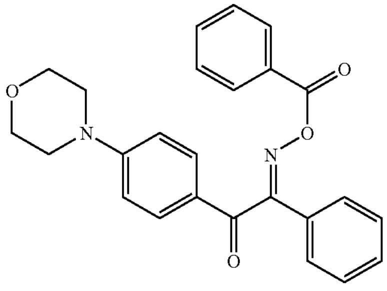

Examples of the onium salt compounds include the diazonium salts described in S. I. Schlesinger, Photogr. Sci. Eng., 18, 387 (1974), T. S. Bal et al., Polymer, 21, 423 (1980); the ammonium salts described in U.S. Pat. No. 4,069,055, JP-A No. 4-365049, and others; the phosphonium salts described in U.S. Pat. Nos. 4,069,055 and 4,069,056; the iodonium salts described in EP Patent No. 104,143, U.S. Pat. Nos. 339,049 and 410,201, JP-A Nos. 2-150848 and 2-296514; the sulfonium salts described EP Patent Nos. 370,693, 390,214, 233, 567, 297,443, and 297,442, U.S. Pat. Nos. 4,933,377, 161, 811, 410,201, 339,049, 4,760,013, 4,734,444, and 2,833,827, and Germany Patent No. 2,904,626, 3,604,580, and 3,604, 581; the selenonium salts described in J. V. Crivello et al., Macromolecules, 10 (6), 1307 (1977), J. V. Crivello et al., J. Polymer Sci., Polymer Chem. Ed., 17, 1047 (1979); the arsonium salts described in C. S. Wen et al., Teh, Proc. Conf. Rad. Curing ASIA, p. 478 Tokyo, October (1988); and the like.

The oxime ester compounds, diazonium salts, iodonium salts, and sulfonium salts above are particularly preferable from the points of reactivity and stability. The onium salt functions not as an acid generator but as an ionic radical-polymerization initiator in the invention.

The onium salt used in the invention is preferably selected from those represented by the following Formulae (R-I) to (R-III).

$$Ar^{11}—N^{+}≡N \quad Z^{11-} \qquad \text{(R-I)}$$

$$Ar^{21}—I^{+}—Ar^{22} \quad Z^{21-} \qquad \text{(R-II)}$$

(R-III)

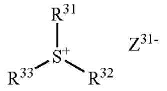

In Formula (R-I), $Ar^{11}$ represents an aryl group having 20 or fewer carbon atoms that may have one to six substituents, and preferable examples of the substituents include alkyl groups having 1 to 12 carbon atoms, alkenyl groups having 1 to 12 carbon atoms, alkynyl groups having 1 to 12 carbon atoms, aryl groups having 6 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkylamido or arylamido groups having 1 to 12 carbon atoms, a carbonyl group, a carboxyl groups, a cyano group, a sulfonyl group, thioalkyl groups having 1 to 12 carbon atoms, and thioaryl groups having 6 to 12 carbon atoms. $Z^{11-}$ represents a monovalent anion, and specific examples thereof include halide ions, a perchlorate ion, a hexafluorophosphate ion, a tetrafluoroborate ion, a sulfonate ion, a sulfinate ion, a thiosulfonate ion, and a sulfate ion. Among them, perchlorate, hexafluorophosphate, tetrafluoroborate, sulfonate and sulfinate ions are preferable from the point of stability and visibility.

In Formula (R-II), $A^{21}$ and $Ar^{22}$ each independently represent an aryl group having 20 or fewer carbon atoms that may have one to six substituents, and preferable examples of the substituents include alkyl groups having 1 to 12 carbon atoms, alkenyl groups having 1 to 12 carbon atoms, alkynyl groups having 1 to 12 carbon atoms, aryl groups having 6 to 12 carbon atoms, alkoxy groups having 1 to 12 carbon atoms, aryloxy groups having 6 to 12 carbon atoms, halogen atoms, alkylamino groups having 1 to 12 carbon atoms, dialkylamino groups having 1 to 12 carbon atoms, alkylamido or arylamido groups having 1 to 12 carbon atoms, a carbonyl group, a carboxyl group, a cyano group, a sulfonyl group, thioalkyl groups having 1 to 12 carbon atoms, and thioaryl groups having 6 to 12 carbon atoms. $Z^{21-}$ represents a monovalent anion, specifically a halide, perchlorate, hexafluorophosphate, tetrafluoroborate, sulfonate, sulfinate, thiosulfonate, or sulfate ion; and preferable from the points of stability and visibility is a perchlorate, hexafluorophosphate, tetrafluoroborate, sulfonate, sulfinate, or carboxylate ion.

In Formula (R-III), $R^{31}$, $R^{32}$ and $R^{33}$ each independently represent an aryl, alkyl, alkenyl, or alkynyl group having 20 or fewer carbon atoms that may have one to six substituents. Preferable among them from the points of reactivity and stability is an aryl group. Examples of the substituents include alkyl groups having 1 to 12 carbon atoms, alkenyl groups having 1 to 12 carbon atoms, alkynyl groups having 1 to 12 carbon atoms, aryl groups having 6 to 12 carbon atoms, alkoxy groups having 1 to 12 carbon atoms, aryloxy groups having 1 to 12 carbon atoms, halogen atoms, alkylamino groups having 1 to 12 carbon atoms, dialkylamino groups having 1 to 12 carbon atoms, alkylamido or arylamido groups having 1 to 12 carbon atoms, a carbonyl group, a carboxyl group, a cyano group, a sulfonyl group, thioalkyl groups having 1 to 12 carbon atoms, and thioaryl group having 6 to 12 carbon atoms. $Z^{31-}$ represents a monovalent anion. Specific examples thereof include halide ions, a perchlorate ion, a hexafluorophosphate ion, a tetrafluoroborate ion, a sulfonate ion, a sulfinate ion, a thiosulfonate ion, and a sulfate ion. Among them, perchlorate, hexafluorophosphate, tetrafluoroborate, sulfonate, sulfinate, and carboxylate ions are preferable from the points of stability and visibility. More preferable examples thereof include the carboxylate ions described in JP-A No. 2001-343742, and particularly preferable examples thereof include the carboxylate ions described in JP-A No. 2002-148790.

Specific examples of the onium salt compounds preferably used in the invention are shown below, while the examples should not be construed as limiting the invention.

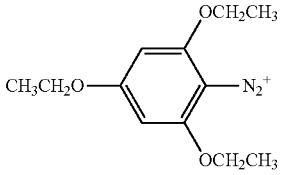

(N-1)

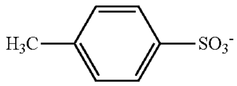

(N-2)

$PF_6^-$

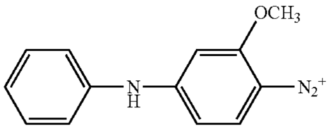

(N-3)

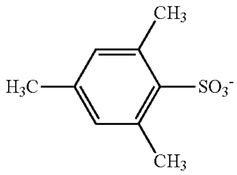

(N-4)

$ClO_4^-$ (N-5)

$PF_6^-$

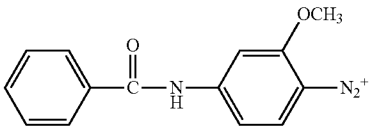

(N-6)

$CF_3SO_3^-$ (N-7)

$BF_4^-$

-continued

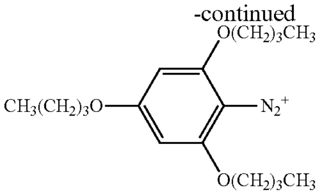

(N-8)

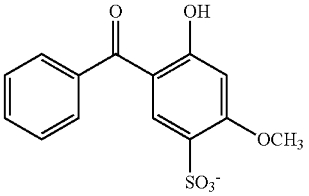

(N-9)

$ClO_4^-$

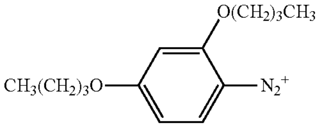

(N-10)

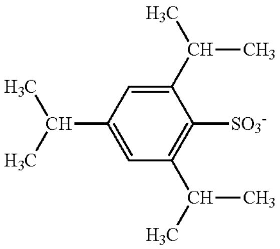

(N-11)

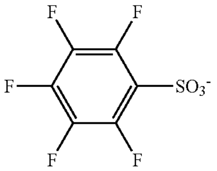

(N-12)

$PF_6^-$

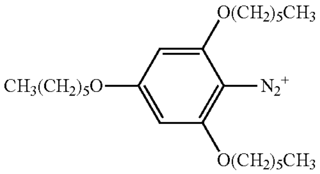

(N-13)

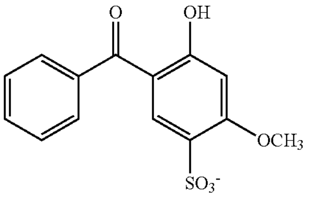

(N-14)

$ClO_4^-$ (N-15)

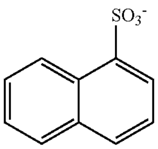

(N-16)

$PF_6^-$

-continued
(N-17)
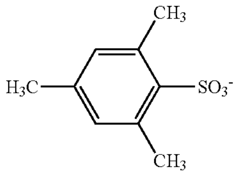
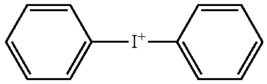
(I-1)
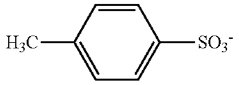
(I-2)
$PF_6^-$
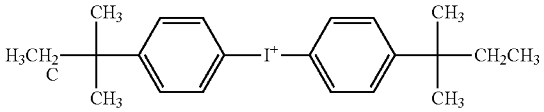
(I-3)
$PF_6^-$
(I-4)
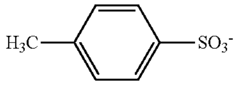
(I-5)
$ClO_4^-$
(I-6)
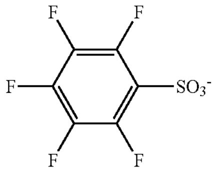
(I-7)
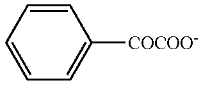
(I-7)
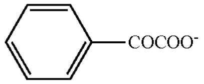
(I-8)
$CF_3SO_3^-$
(I-9)
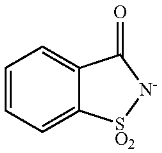
(I-10)
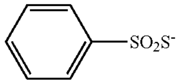
(I-11)
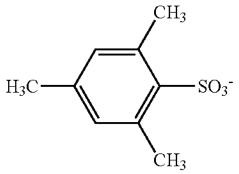
-continued
(I-12)
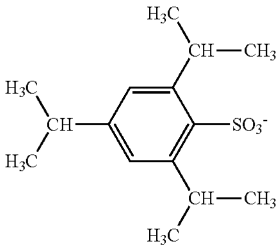
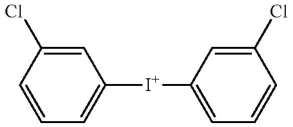
(I-13)
$BF_4^-$
(I-14)
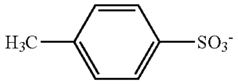
(I-15)
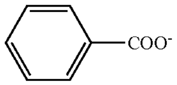
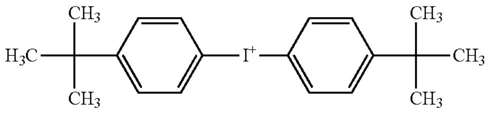
(I-16)
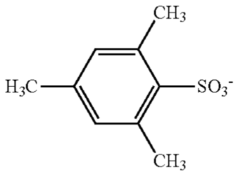
(I-17)
$ClO_4^-$
(I-18)
$PF_6^-$
(I-19)
$C_4F_9SO_3^-$
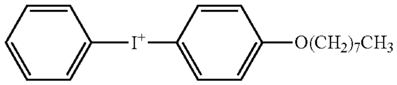
(I-20)
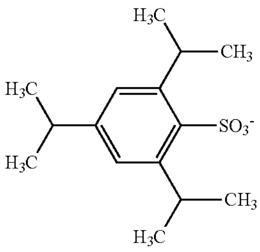
(I-21)
$CF_3COO^-$
(I-22)
$CF_3SO_3^-$
(I-23)
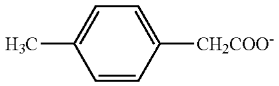

-continued
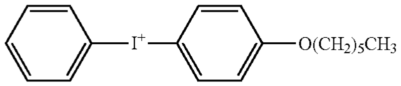
(I-24)
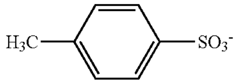
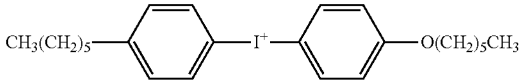
(I-25)
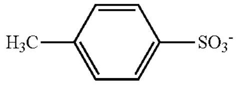
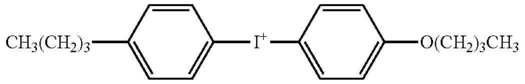
(I-26)
$C_4F_9COO^-$
(I-27)
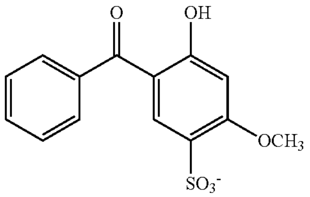
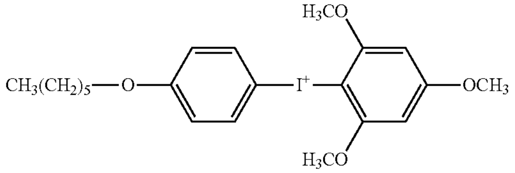
(I-28)
$PF_6^-$
(I-29)
$ClO_4^-$
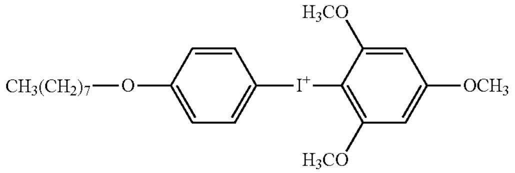
(I-30)
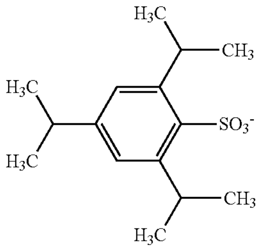
(I-31)
$PF_6^-$
(I-32)
$C_4F_9SO_3^-$
(I-33)
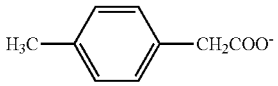
-continued
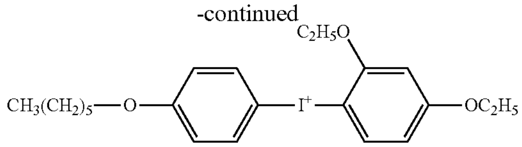
(I-34)
$BF_4^-$
(I-35)
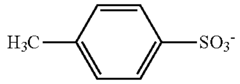
(I-36)
$PF_6^-$
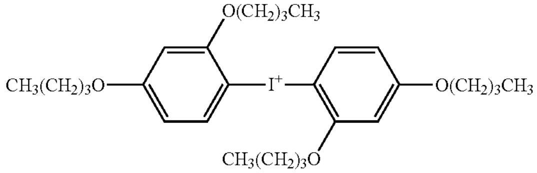
(I-37)
$PF_6^-$
(I-38)
$C_4F_9SO_3^-$
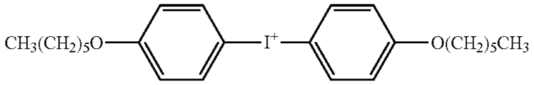
(I-39)
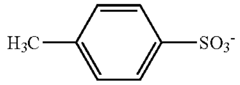
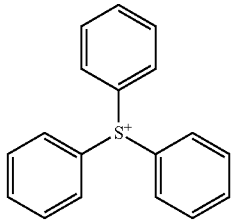
(S-1)
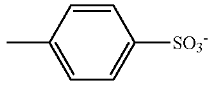
(S-2)
$PF_6^-$
(S-3)
$ClO_4^-$
(S-4)
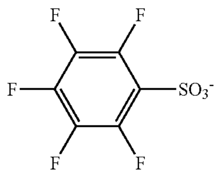
(S-5)
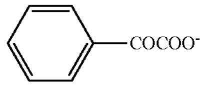
(S-6)
$CF_3SO_3^-$
(S-7)
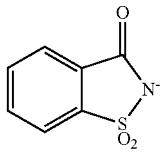

-continued (S-8)

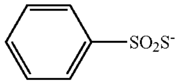

(S-9)

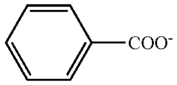

(S-10)

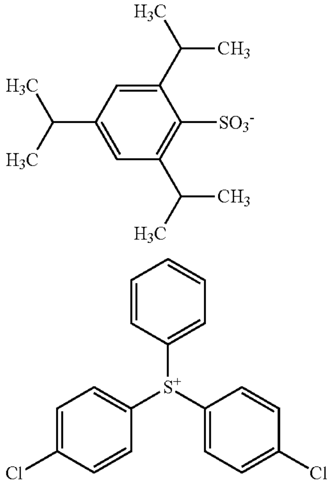

(S-11)

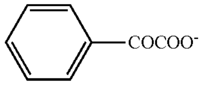

(S-12)

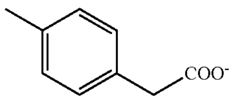

(S-13)

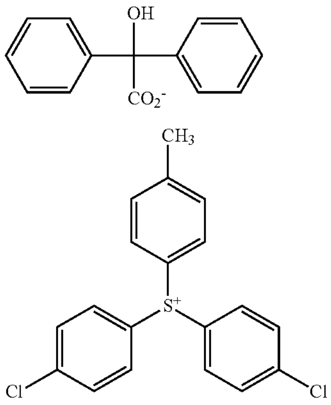

(S-14)

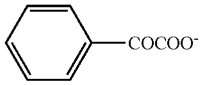

(S-15)

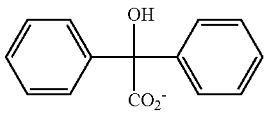

(S-16)

$BF_4^-$

-continued (S-17)

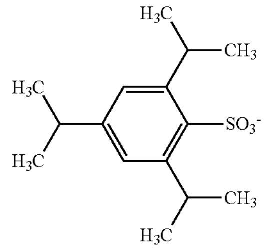

(S-18)

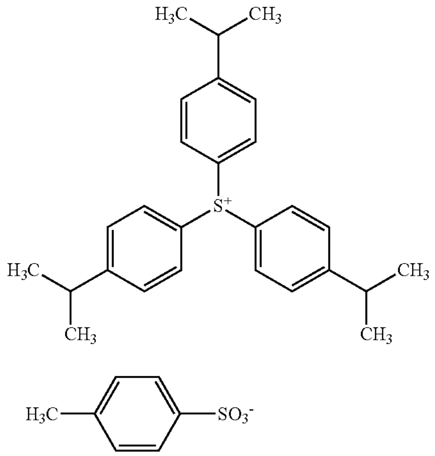

(S-19)

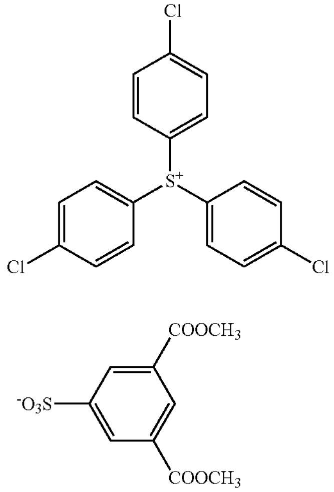

While the polymerization initiator is not limited to those exemplified in the above, the polymerization initiator is more preferably a triazine initiator, an organic halide compound, an oxime ester compound, a diazonium salt, an iodonium salt and a sulfonium salt in view of reactivity and stability. Among these polymerization initiators, an onium salt having an inorganic anon such as $PF_6^-$ or $BF_4^-$ as a counterion is preferable from the viewpoint of improving visibility by being used in combination with the infrared absorbing agent. In addition, the onium salt is preferably diaryliodonium in view of being excellent in coloring property.

The amount of these polymerization initiators contained in the image recording layer is preferably 0.1 to 50% by mass, more preferably 0.5 to 30% by mass and particularly preferably 0.8 to 20% by mass with respect to the total solid content composing the image recording layer. This range allows favorable sensitivity and favorable resistance to dirt of a non-image portion during printing.

The polymerization initiator may be used singly or in combination of two kinds or more thereof. Also, the polymerization initiator may be added to the same layer as other components, or to a layer provided separately from layers of other components.

(C) Polymerizable Monomer

The polymerizable monomer (C) herein used refers to a compound which has a weight-average molecular weight of less than 2,000 and is different from the specific polymer compound (D). The polymerizable monomer (C) which can be used in the image recording layer of the planographic printing plate precursor of the invention is an additional polymerizable compound having at least one ethylenically-unsaturated bond and may be selected from those having at least one, preferably two or more, terminal ethylenic unsaturated bond(s). Such compounds are widely known to those skilled in the art, and any one of them may be used in the invention without particular restriction. These compounds may be in a chemical form such as a monomer, a prepolymer (dimer, trimer or oligomer), or a mixture or copolymer thereof.

Examples of the monomers and the copolymers formed thereof include unsaturated carboxylic acids (such as acrylic acid, methacrylic acid, itaconic acid, crotonic acid, isocrotonic acid, or maleic acid) and esters and amides thereof, and preferable examples thereof include esters of an unsaturated carboxylic acid and an aliphatic polyhydric alcohol compound, and amides of an unsaturated carboxylic acid and an aliphatic polyvalent amine compound. In addition, addition reaction products of an unsaturated carboxylic ester or amide having a nucleophilic substituent such as hydroxyl, amino, or mercapto group with a monofunctional or multifunctional isocyanate or epoxy compound, and dehydration condensation products thereof with a monofunctional or polyfunctional carboxylic acid, and the like are also preferable. Addition reaction products of an unsaturated carboxylic ester or amide having an electrophilic substituent such as an isocyanate or an epoxy group with a monofunctional or polyfunctional alcohol, amine, or thiol, and substitution reaction products of an unsaturated carboxylic ester or amide having a leaving group such as a halogen or tosyloxy group with a monofunctional or polyfunctional alcohol, amine, or thiol are also preferable. Other examples include compounds in which the unsaturated carboxylic acid is replaced with an unsaturated phosphonic acid, styrene, vinyl ether, or the like.

Specific examples of the esters (as a monomer) of an aliphatic polyhydric alcohol compound and an unsaturated carboxylic acid include:

acrylic esters such as ethylene glycol diacrylate, triethylene glycol diacrylate, 1,3-butanediol diacrylate, tetramethylene glycol diacrylate, propylene glycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl) isocyanurate, or polyester acrylate oligomers;

methacrylic esters such as tetramethylene glycol dimethacrylate, triethylene glycol dimethacrylate, neopentylglycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethaerylate, bis [p-(3-methacryloxy-2-hydroxypropoxy) phenyl] dimethylmethane, or bis-[p-(methacryloxyethoxy)phenyl] dimethylmethane;

itaconate esters such as ethylene glycol diitaconate, propylene glycol diitaconate, 1,3-butanediol diitaconate, 1,4-butanediol diitaconate, tetramethylene glycol diitaconate, pentaerythritol diitaconate, or sorbitol tetraitaconate;

crotonate esters such as ethylene glycol dicrotonate, tetramethylene glycol dicrotonate, pentaerythritol dicrotonate, or sorbitol tetradicrotonate;

isocrotonate esters such as ethylene glycol diisocrotonate, pentaerythritol diisocrotonate, or sorbitol tetraisocrotonate;

maleate esters such as ethylene glycol dimaleate, triethylene glycol dimaleate, pentaerythritol dimaleate, or sorbitol tetramaleate; and other esters such as the aliphatic alcohol esters described in JP-B No. 51-47334 and JP-A No. 57-196231, the esters having an aromatic skeleton described in JP-A Nos. 59-5240, 59-5241, and 2-226149, and the amino group-containing esters described in JP-A No. 1-165613.

In addition, a mixture of two or more of the ester monomers described above can be used in the invention.

Specific examples of the monomers of amide of an aliphatic polyvalent amine compound and an unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide. Other preferable examples of the amide monomers include amides having a cyclohexylene structure described in JP-B No. 54-21726.

Addition polymerizable-urethane compounds obtained by addition reaction of an isocyanate and a hydroxyl group are also preferable. Specific examples thereof include vinyl urethane compounds having two or more polymerizable vinyl groups in a molecule thereof, such as those described in JP-B No. 48-41708, which are prepared by adding a vinyl monomer having a hydroxyl group represented by the following Formula (A) to a polyisocyanate compound having two or more isocyanate group in a molecule.

$$CH_2{=}C(R^{4'})COOCH_2CH(R^{5'})OH \qquad \text{Formula (A)}$$

(In Formula (A), $R^4$ and $R^5$ each independently represent H or $CH_3$.)

Also preferable are urethane acrylates described in JP-A No. 51-37193 and JP-B Nos. 2-32293 and 2-16765; and urethane compounds having an ethylene oxide skeleton described in JP-B Nos. 58-49860, 56-17654, 62-39417, and 62-39418. It is also possible to obtain a photopolymerizable composition significantly superior in photoresponsive speed by using the addition polymerizable compound having an amino or sulfide structure in the molecule described in JP-A Nos. 63-277653, 63-260909, or 1-105238.

Other preferable examples thereof include polyfunctional acrylates and methacrylates such as polyester acrylates, and epoxyacrylates obtained in reaction of an epoxy resin with acrylic or methacrylic acid, such as those described in JP-A No. 48-64183, and JP-B Nos. 49-43191 and 52-30490. Yet other examples thereof include specific unsaturated compounds described in JP-B Nos. 46-43946, 1-40337, and 1-40336, and vinylphosphonic acid compounds described in JP-A No. 2-25493. In addition, the structures containing a perfluoroalkyl group described in JP-A No. 61-22048 are used favorably in some cases. Further, photosetting monomers and oligomers described in Journal of Adhesion Soc. Jpn. Vol. 20, No. 7, p. 300 to 308 (1984) are also usable.

Details of the use of the addition polymerizable compound such as: what structure is used; whether they are used singly or in combination; the addition amount; or the like can be arbitrarily determined in accordance with the performance and design of the final planographic printing plate precursor. For example, they are selected from the following viewpoints.

In respect of photosensitivity, the structure of the addition polymerizable compound preferably has a high unsaturated group content per one molecule, and in many cases, they are preferably bifunctional or higher-functional. To increase the strength of an image portion (i.e. the cured layer), they are preferably trifunctional or higher-functional. It is also effective to use a method of regulating both photosensitivity and strength by combined use of addition polymerizable compounds having different functionalities and different polymerizable groups (e.g. acrylic esters, methacrylic esters, styrene compounds, and vinyl ether compounds).

The selection and utilization of the addition polymerizable compound are important factors for compatibility and dispersibility thereof with other components (e.g. a binder polymer, an initiator, a colorant etc.) in the recording layer, and the compatibility may be improved by using a low-purity compound, a combination of two or more addition polymerizable compounds and the like. In some cases, a specific structure can be selected in order to improve the adhesiveness to the support or the protective layer described in the following.

The content of the polymerizable monomer (C) in the image recording layer is preferably from 5 to 80 wt %, and is more preferably from 25 to 75 wt %, with respect to the total amount of nonvolatile components in the image recording layer.

An appropriate structure, an appropriate formulation, and an appropriate addition amount of the addition polymerizable compound may be arbitrarily selected in consideration of the degree of polymerization inhibition by oxygen, resolution, fogging, change in the refractive index, and surface adhesiveness. In some cases, a coating method such as undercoating or overcoating and a layer structure formed thereby may be adopted.

Microcapsule and Microgel

The image recording layer preferably further contains a microcapsule and/or a microgel in view of obtaining good on-press developability. Namely, in a case where the image recording layer of the planographic printing plate precursor of the invention has on-press developability, the image recording layer preferably contains a microcapsule and/or a microgel.

Examples of the microcapsule which can be used in the invention include those having all or some of the components of the image recording layer (including the components of (A) to (D)) encapsulated therein, similarly to those described in JP-A Nos. 2001-277740 and 2001-277742. Components of the image recording layer may also be contained outside the microcapsules in the microcapsule-containing image recording layer. In a preferable embodiment of the microcapsule-containing image recording layer, hydrophobic components are encapsulated, while hydrophilic components are contained outside the microcapsules.

In yet another embodiment, the image recording layer may contain crosslinked resin particles, i.e., microgel. The microgel may contain some of the components of the image recording layer (including the components of (A) to (D)) in the interior of and/or on the surface of the resin particles. In particular, from the viewpoints of image forming sensitivity and printing durability, it is preferable that the microgel is made to be a reactive microgel by being provided with the (C) polymerizable monomer on its surface.

Conventionally-known methods may be used for encapsulating the image recording layer components in microcapsules or forming a microgel containing the image recording layer components.

Examples of the method for producing the microcapsules include, but are not limited to, the methods of using coacervation described in U.S. Pat. Nos. 2,800,457 and 2,800,458; the interfacial polymerization methods described in U.S. Pat. No. 3,287,154, JP-B Nos. 38-19574, 42-446, and others; the polymer precipitation methods described in U.S. Pat. Nos. 3,418,250 and 3,660,304; the method using an isocyanate polyol wall-forming material described in U.S. Pat. No. 3,796,669; the method of using an isocyanate wall-forming material described in U.S. Pat. No. 3,914,511; the methods of using a urea-formaldehyde or urea-formaldehyde-resorcinol wall-forming material described in U.S. Pat. Nos. 4,001,140, 4,087,376, and 4,089,802; the method of using a wall-forming material such as a melamine-formaldehyde resin or hydroxypropylcellulose described in U.S. Pat. No. 4,025,455; the in-situ methods involving monomer polymerization described in JP-B No. 36-9163 and JP-A No. 51-9079; the spray drying methods described in U.S. Pat. No. 3,111,407 and British Patent No. 930422; the electrolytic dispersion cooling methods described in British Patent Nos. 952807 and 965074.

A microcapsular wall which can be preferably used in the invention has three-dimensional crosslinks and sells in a solvent. In consideration of these, the microcapsular wall material is preferably polyurea, polyurethane, polyester, polycarbonate, polyamide, or a mixture thereof, and is particularly preferably polyurea or polyurethane. The microcapsular wall may also contain a compound having a crosslinking functional group such as an ethylenic unsaturated bond introducible to a binder polymer.

Examples of the method for preparing the microgel include, but are not limited to, the methods involving particle formation by interfacial polymerization described in JP-B Nos. 38-19574 and 42-446, and the method involving particle formation by nonaqueous dispersion polymerization described in JP-A No. 5-61214.

Any one of known microcapsular production methods such as those described above may be used in the method involving interfacial polymerization.

In a preferable embodiment, the microgel is prepared through particle formation by interfacial polymerization and has a three-dimensional crosslinks. From such a viewpoint, the raw material to be used for forming the microgel is preferably polyurea, polyurethane, polyester, polycarbonate, polyamide, or a mixture thereof, and is more preferably polyurea or polyurethane.

The average diameter of the microcapsule or microgel particle is preferably from 0.01 to 3.0 μm, more preferably from 0.05 to 2.0 μm, and is particularly preferably from 0.10 to 1.0 μm. Favorable resolution and storage stability upon time lapse can be obtained in the range above.

Other Components

In addition to the components described above, the image recording layer of the planographic printing plate precursor according to the invention may further contain various compounds in accordance with necessity. Hereinafter, such other additives will be described.

(1) Surfactant

The image recording layer of the planographic printing plate of the invention preferably contains a surfactant for the purpose of improving removability of unexposed portions upon development, on-press developability and a condition of coated surface thereof.

Examples of the surfactant include a nonionic surfactant, an anionicsurfactant, a cationicsurfactant, an amphotericsurfactant, or a fluorine surfactant. The surfactant can be used singly or in a combination of two or more thereof.

The nonionic surfactant used in the invention is not particularly limited, and any one of known nonionic surfactants may be used. Examples thereof include polyoxyethylene alkylethers, polyoxyethylene alkylphenylethers, polyoxyethylene polystyrylphenylethers, polyoxyethylene polyoxypropylene alkylethers, glycerols partially esterified with an aliphatic acid, sorbitans partially esterified with an aliphatic acid, pentaerythritols partially esterified with an aliphatic acid, propylene glycol monoaliphatic acid esters, sucroses partially esterified with an aliphatic acid, polyoxyethylene sorbitans partially esterified with an aliphatic acid, polyoxyethylene sorbitols partially esterified with an aliphatic acid, polyethylene glycol aliphatic acid esters, polyglycerins partially esterified with an aliphatic acid, polyoxyethylene-modified castor oils, polyoxyethylene glycerols partially esterified with an aliphatic acid, aliphatic acid diethanol amides, N,N-bis-2-hydroxyalkylamines, polyoxyethylene alkylamines, triethanolamine aliphatic acid esters, trialkylamine oxides, polyethylene glycol, and copolymers of polyethylene glycol and polypropylene glycol.

The anionic surfactant used in the invention is not particularly limited, and any one of known anionic surfactants may be used. Examples thereof include aliphatic acid salts, abietic acid salts, hydroxyalkanesulfonic acid salts, alkanesulfonic acid salts, dialkyl sulfoscuccinate salts, straight-chain alkylbenzenesulfonic acid salts, branched-chain alkylbenzenesulfonic acid salts, alkylnaphthalenesulfonic acid salts, alkylphenoxypolyoxyethylene propylsulfonic acid salts, polyoxyethylene alkylsulfophenylether salts, N-methyl-N-oleyltaurine sodium salt, N-alkyl-sulfosuccinic monoamide disodium salts, petroleum sulfonic salt, sulfated beef tallow oil, sulfate ester salts of an aliphatic acid alkyl ester, alkyl sulfate ester salts, polyoxyethylene alkylether sulfate ester salts, aliphatic acid monoglyceride sulfate ester salts, polyoxyethylene alkylphenylether sulfate ester salts, polyoxyethylene styrylphenylether sulfate ester salts, alkylphosphoric ester salts, polyoxyethylene alkylether phosphoric ester salts, polyoxyethylene alkylphenylether phosphoric ester salts, partially saponified products of styrene/maleic anhydride copolymers, partially saponified products of olefin/maleic anhydride copolymers, naphthalenesulfonic salt-formalin condensates, salts of alkylpolyoxyalkylene sulfoalkylether, and salts of alkenylpolyoxyalkylene sulfoalkylether.

The cationic surfactant used in the invention is not particularly limited, and any one of known cationic surfactants may be used. Examples thereof include alkylamine salts, quaternary ammonium salts, polyoxyethylene alkylamine salts, and polyethylene polyamine compounds.

The amphoteric surfactant used in the invention is not particularly limited, and any one of known amphoteric surfactants may be used. Examples thereof include carboxybetaines, aminocarboxylates, sulfobetaines, aminosulfate esters, and imidazolines.

In the above list of the surfactants, "polyoxyethylene" may be read as "polyoxyalkylene" such as polyoxymethylene, polyoxypropylene, or polyoxybutylene, and the surfactants obtained by such reading are also usable in the invention.

Still more preferable surfactants are fluorine surfactants having a perfluoroalkyl group in the molecule. Examples of the fluorine surfactants include anionic surfactants such as perfluoroalkyl carboxylate salts, perfluoroalkyl sulfonate salts, perfluoroalkyl phosphate esters; amphoteric surfactants such as perfluoroalkylbetaines; cationic surfactants such as perfluoroalkyltrimethylammonium salts; and nonionic surfactants such as perfluoroalkylamine oxides, perfluoroalkylethyleneoxide adducts, oligomers containing a perfluoroalkyl group and a hydrophilic group, oligomers containing a perfluoroalkyl group and a lipophilic group, oligomers containing a perfluoroalkyl group, a hydrophilic group and a lipophilic group, or urethanes containing a perfluoroalkyl group and a lipophilic group. Also preferable are the fluorine surfactants described in JP-A Nos. 62-170950, 62-226143 and 60-168144.

Examples of still more preferable surfactants further include salts of alkylpolyoxyalkylene sulfoalkyl ether. Examples of such ether salts include sodium salts of n-octyl (diethyleneoxy) sulfobutyl ether, sodium salts of 2-ethylhexyl (diethyleneoxy) sulfobutyl ether, sodium salts of n-decyl(diethyleneoxy) sulfobutyl ether, potassium salts of n-dodecyl(diethyleneoxy) sulfobutyl ether, potassium salts of n-octyl(diethyleneoxy) sulfobutyl ether, potassium salts of 2-ethylhexyl (diethyleneoxy) sulfobutyl ether, potassium salts of n-decyl(diethyleneoxy) sulfobutyl ether, potassium salts of n-dodecyl(diethyleneoxy) sulfopropyl ether, sodium salts of n-octyl(diethyleneoxy) sulfopropyl ether, sodium salts of 2-ethylhexyl(diethyleneoxy) sulfopropyl ether, sodium salts of n-decyl(diethyleneoxy) sulfopropyl ether, sodium salts of n-dodecyl(diethyleneoxy) sulfopropyl ether, ammonium salts of 2-ethylhexyl (diethyleneoxy) sulfobutyl ether, triethyl ammonium salts of 2-ethylhexyl (diethyleneoxy) sulfobutyl ether, and pyridinium salts of 2-ethylhexyl(diethyleneoxy) sulfobutyl ether.

The surfactant can be used singly or in a combination of two or more thereof. The content of surfactant in the image recording layer is preferably from 0.001 to 10 wt %, and is more preferably from 0.01 to 5 wt % with respect to the total solid content in the image recording layer.

(2) Colorant

A dye showing a large absorption in the visible light region may be contained in the image recording layer as an image colorant. Specific examples thereof include Oil Yellow #1101, Oil Yellow #103, Oil Pink #312, Oil Green BG, Oil Blue BOS, Oil Blue #603, Oil Black BY, Oil Black BS, and Oil Black T-505 (manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and the dyes described in JP-A No. 62-293247. In addition, pigments such as phthalocyanine pigments, azo pigments, carbon black, and titanium oxide can also be used favorably.

It is preferable to add the colorant to the image recording layer since the colorant makes it easier to distinguish image portions and non-image portions after image formation. The addition amount of the colorant to the image recording layer is preferably from 0.01 to 10 wt % with respect to the total solid content in the image recording material.

(3) Printing-Out Agent

A compound that changes its color in the presence of an acid or radical may be added to the image recording layer in the invention as a printing-out agent so that a printed-out image is formed.

Preferable examples of the compound effective as the printing-out agent include various colorants such as diphenylmethane compounds, triphenylmethane compounds, thiazine compounds, oxazine compounds, xanthene compounds, anthraquinone compounds, iminoquinone compounds, azo compounds, and azomethine compounds.

Specific examples thereof include dyes such as brilliant green, ethyl violet, methyl green, crystal violet, basic Fuchsine, methyl violet 2B, quinaldine red, rose bengal, metanil yellow, thymol sulfophthalein, xylenol blue, methyl orange, paramethyl red, Congo red, benzopurpurin 4B, α-naphthyl red, Nile blue 2B, Nile blue A, methyl violet, malachite green, Parafuchsine, Victoria Pure Blue BOH (manufactured by Hodogaya Chemical Co., Ltd.), Oil Blue #603 (manufactured by Orient Chemical Industries, Ltd.), Oil Pink #312 (manufactured by Orient Chemical Industries, Ltd.), Oil Red 5B (manufactured by Orient Chemical Industries, Ltd.), Oil Scarlet #308 (manufactured by Orient Chemical Industries, Ltd.), Oil Red OG (manufactured by Orient Chemical Industries, Ltd.), Oil Red RR (manufactured by Orient Chemical Industries, Ltd.), Oil Green #502 (manufactured by Orient Chemical Industries, Ltd.), Spilon Red BEH Special (manufactured by Hodogawa Chemical Co., Ltd.), m-cresol purple, cresol red, rhodamine B, rhodamine 6G, sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)amino-phenyliminonaphthoquinone, 1-phenyl-3-methyl-4-p-diethylaminophenylimino-5-pyrazolone, or 1-β-naphthyl-4-p-diethylaminophenylimino-5-pyrazolone; and leuco dyes such as p,p',p"-hexamethyltriaminotriphenylmethane (leuco crystal violet), and Pergascript Blue SRB (manufactured by Ciba-Geigy Corp.).

In addition, leuco dyes, which are known as raw materials for heat-sensitive paper and pressure-sensitive paper, are also favorable. Specific examples thereof include crystal violet lactone, malachite green lactone, benzoylleucomethylene blue, 2-(N-phenyl-N-methylamino)-6-(N-p-toluoyl-N-ethyl) aminofluorane, 2-anilino-3-methyl-6-(N-ethyl-p-toluidino) fluorane, 3,6-dimethoxyfluorane, 3-(N,N-diethylamino)-5-methyl-7-(N,N-dibenzylamino)-fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-quinolidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-quinolidinofluorane, 3-pyperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide, and 3-(4-diethylaminophenyl)-3-(1-ethyl-2-methylindol-3-yl)phthalide.

The amount of the dye that changes its color in the presence of an acid or radical and is added to the image recording layer as the printing-out agent is preferably from 0.01 to 10 wt % with respect to the solid content in the image recording layer.

(4) Polymerization Inhibitor

A few amount of a thermal polymerization inhibitor can be preferably added to the image recording layer of the planographic printing plate precursor of the invention during production or storage of the image recording layer in order to prevent undesirable thermal polymerization of the polymerizable monomer (C) or the specific polymer compound (D).

Preferable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene-bis(4-methyl-6-t-butylphenol), and N-nitroso-N-phenyl hydroxylamine aluminum salt.

The amount of the thermal polymerization inhibitor to be added is preferably about 0.01 wt % to about 5 wt % with respect to the total solid content in the image recording layer.

(5) Higher Aliphatic Acid Compound and the Like

In view of preventing the polymerization inhibition by oxygen, a higher aliphatic acid compound such as behenic acid or behenic amide may be added to the image recording layer of the planographic printing plate precursor of the invention so that the higher aliphatic acid compound localizes on the surface of the image recording layer in the drying after application of the image recording layer. The amount of the higher aliphatic acid compound to be added to the image recording layer is preferably about 0.1 wt % to about 10 wt % with respect to the total solid content in the image recording layer.

(6) Plasticizer

The image recording layer of the planographic printing plate precursor of the invention may contain a plasticizer for the purpose of improving removability of unexposed portions upon development and on-press developability.

Preferable examples of the plasticizer include phthalic esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butylbenzyl phthalate, diisodecyl phthalate, and diallyl phthalate; glycol esters such as dimethylglycol phthalate, ethylphthalylethyl glycolate, methylphthalylethyl glycolate, butylphthalylbutyl glycolate, and triethylene glycol dicaprylic ester; phosphate esters such as tricresyl phosphate and triphenyl phosphate; aliphatic dibasic acid esters such as diisobutyl adipate, dioctyl adipate, dimethyl sebacate, dibutyl sebacate, dioctyl azelate, and dibutyl maleate; polyglycidyl methacrylate, triethyl citrate, glycerol triacetyl ester, and butyl laurate.

The content of plasticizer in the image recording layer is preferably about 30 wt % or less with respect to the total solid content in the image recording layer.

(7) Inorganic Fine Particle

The image recording layer of the planographic printing plate precursor of the invention may contain inorganic fine particles for the purpose of improving the cured film strength, removability of unexposed portions upon development and the on-press developability.

Preferable examples of the inorganic fine particles include silica, alumina, magnesium oxide, titanium oxide, magnesium carbonate, calcium alginate, and mixtures thereof. The presence of the particles is effective in reinforcement of the cured film and improvement in interfacial adhesiveness caused by providing roughness to the surface of the image recording layer.

The inorganic fine particles preferably have an average diameter of 5 nm to 10 μm, more preferably 0.5 to 3 μm. Within the range above, the particles can be dispersed in the image recording layer stably, the strength of the image recording layer is ensured, and a highly hydrophilic non-image portion resistant to staining during printing can be formed.

The inorganic fine particles described above are easily available as commercial products such as colloidal silica dispersions.

The content of the inorganic fine particles in the image recording layer is preferably 40 wt % or less, and is more preferably 30 wt % or less, with respect to the total solid content in the image recording layer.

(8) Low-Molecular Weight Hydrophilic Compound

The image recording layer of the planographic printing plate precursor of the invention may contain a hydrophilic low-molecular weight compound for the purpose of improving removability of unexposed portions upon development and on-press developability without impairing printing durability.

The hydrophilic low-molecular weight compound may be a water-soluble organic compound, and examples thereof include glycols such as ethylene glycol, diethylene glycol, triethylene glycol, propylene glycol, dipropylene glycol, or tripropylene glycol, and ether or ester compounds thereof; polyhydroxy compounds such as glycerol and pentaerythritol; organic amines such as triethanolamine, diethanolamine or monoethanolamine, and salts thereof, organic sulfonic acids such as alkylsulfonic acid, toluenesulfonic acid or benzenesulfonic acid, and salts thereof; organic sulfamic acids such as alkylsulfamic acid, and salts thereof; organic sulfuric acids such as alkylsulfuric acid, and salts thereof; organic phosphonic acids such as phenylphosphonic acid, and salts thereof, and organic carboxylic acids such as tartaric acid, oxalic acid, citric acid, malic acid, lactic acid, gluconic acid, or amino acids, and salts thereof.

Among these, salts of organic sulfonic acids, salts of organic sulfamic acids, and salts of organic sulfuric acids such as sodium salts or lithium salts thereof are preferably used in the invention.

Specific examples of the salts of the organic sulfonic acids include sodium normal-butylsulfonate, sodium isobutylsulfonate, sodium sec-butylsulfonate, sodium tert-butylsulfonate, sodium normal-pentylsulfonate, sodium 1-ethylpropylsulfonate, sodium normal-hexylsulfonate, sodium 1,2-dimethylpropylsulfonate, sodium 2-ethylbutylsulfonate, sodium cyclohexylsulfonate, sodium normal-heptylsulfonate, sodium normal-octylsulfonate, sodium tert-octylsulfonate, sodium normal-nonylsulfonate, sodium allylsulfonate, sodium 2-methylallylsulfonate, sodium benzenesulfonate, sodium para-toluenesulfonate, sodium para-hydroxybenzenesulfonate, sodium para-styrenesulfonate, sodium dimethyl isophthalate-5-sulfonate, disodium 1,3-benzenedisulfonate, trisodium 1,3,5-benzenetrisulfonate, sodium para-chlorobenzenesulfonate, sodium 3,4-dichlorobenzenesulfonate, sodium 1-naphthylsulfonate, sodium 2-naphthylsulfonate, sodium 4-hydroxynaphthylsulfonate, disodium 1,5-naphthyldisulfonate, disodium 2,6-naphthyldisulfonate, and trisodium 1,3,6-naphthyltrisulfonate, and lithium salts obtained by exchanging sodium in these compounds to lithium.

Specific examples of the salts of the organic sulfamic acids include sodium normal-butylsulfamate, sodium isobutylsulfamate, sodium tert-butylsulfamate, sodium normal-pentylsulfamate, sodium 1-ethylpropylsulfamate, sodium normal-hexylsulfamate, sodium 1,2-dimethylpropylsulfamate, sodium 2-ethylbutylsulfamate, and sodium cyclohexylsulfamate, and lithium salts obtained by exchanging sodium in these compounds to lithium.

These compounds have a small structure of a hydrophobic portion and scarce surface-active function, and are definitely distinguished from the surfactant for which long-chain alkylsulfonate and long-chain alkylbenzenesulfonate are favorably used.

Preferable examples of salts of the organic sulfuric acids include a compound represented by the following Formula (I).

Formula (I)

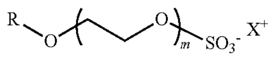

In Formula (I), R represents a substituted or unsubstituted alkyl group, a substituted or unsubstituted alkenyl group, a substituted or unsubstituted alkynyl group, a substituted or unsubstituted aryl group or a substituted or unsubstituted heterocyclic group, m represents an integer of 1 to 4, and X represents sodium, potassium or lithium.

Preferable examples of R include a substituted or unsubstituted, straight-chain, branched or cyclic alkyl group having 1 to 12 carbon atoms, an alkenyl group having 1 to 12 carbon atoms, an alkynyl group having 1 to 12 carbon atoms and an aryl group having 20 or less carbon atoms. In the case where these groups have a substituent, examples of the substituent include a straight-chain, branched or cyclic alkyl group having 1 to 12 carbon atoms, an alkenyl group having 1 to 12 carbon atoms, an alkynyl group having 1 to 12 carbon atoms, a halogen atom and an aryl group having 20 or less carbon atoms.

Preferable examples of the compound represented by Formula (1) include sodium oxyethylene-2-ethylhexyl ether sulfate, sodium dioxyethylene-2-ethylhexyl ether sulfate, potassium dioxyethylene-2-ethylhexyl ether sulfate, lithium dioxyethylene-2-ethylhexyl ether sulfate, sodium trioxyethylene-2-ethylhexyl ether sulfate, sodium tetraoxyethylene-2-ethylhexyl ether sulfate, sodium dioxyethylenehexyl ether sulfate, sodium dioxyethyleneoctyl ether sulfate and sodium dioxyethylenelauryl ether sulfate. Among them, the most preferable examples of the compound include sodium dioxyethylene-2-ethylhexyl ether sulfate, potassium dioxyethylene-2-ethylhexyl ether sulfate and lithium dioxyethylene-2-ethylhexyl ether sulfate.

The amount of the low-molecular hydrophilic compound added to the image recording layer is preferably 0.5% to 20% by mass, more preferably 1% to 10% by mass, and is particularly preferably 2% to 8% by mass of the total solid content of the image recording layer. This range provides favorable on-press developability and printing durability to the planographic printing plate of the invention.

These compounds may be used singly or by mixing two kinds or more thereof.

(9) Sensitizer

In the case where an inorganic laminar compound is contained in the protective layer described in the following, a phosphonium compound is preferably contained in the image recording layer in order to improve inking property.

This phosphonium compound functions as a surface coating agent (a sensitizer) of the inorganic laminar compound to prevent hiking property of the inorganic laminar compound from deteriorating during printing.

Preferable examples of the phosphonium compound include a compound represented by following Formula (II) or Formula (III). The more preferable phosphonium compound is a compound represented by Formula (II).

Formula (II)

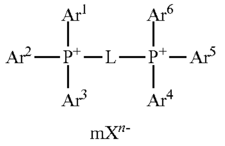

Formula (III)

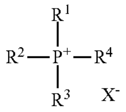

In Formula (II), $Ar^1$ to $Ar^6$ each independently represent an aryl group or a heterocyclic group, L represents a divalent linking group, $X^{n-}$ represents an n-valent counter anion, n represents an integer of 1 to 3, and m represents a number satisfying the equation of n×m=2.

Examples of the aryl group include a phenyl group, a naphthyl group, a tolyl group, a xylil group, a fluorophenyl group, a chlorophenyl group, a bromophenyl group, a methoxyphenyl group, a ethoxyphenyl group, a dimethoxyphenyl group, a methoxycarbonylphenyl group, a dimethylaminophenyl group and the like.

Examples of the heterocyclic group include a pyridyl group, a quinolil group, a pyrimidinyl group, a thienyl group, a furyl group and the like.

L preferably represents a divalent linking group having 6 to 15 carbon atoms, and more preferably represents a divalent linking group having 6 to 12 carbon atoms.

Preferable examples of $X^{n-}$ include a halogen anion such as $Cl^-$, $Br^-$ or $I^-$, a sulfonic acid anion, a carboxylic acid anion, a sulfuric ester anion, $PF_6^-$; $BF_4^-$ and a perchloric anion. Among them, a halogen anion such as $Cl^-$, $Br^-$ or $I^-$, a sulfonic acid anion and a carboxylic acid anion are particularly preferable.

Specific examples of the phosphonium compound represented by Formula (II) are shown below.

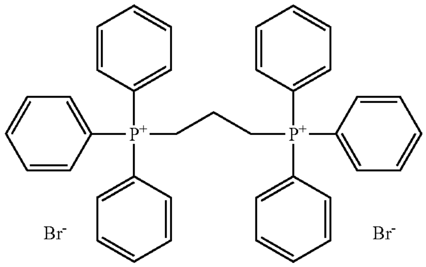

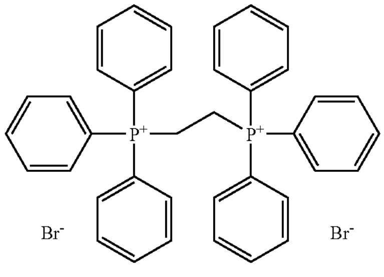

-continued

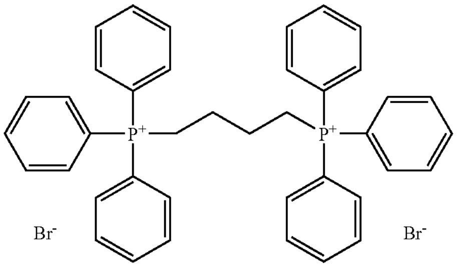

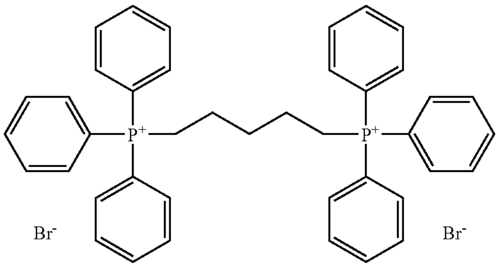

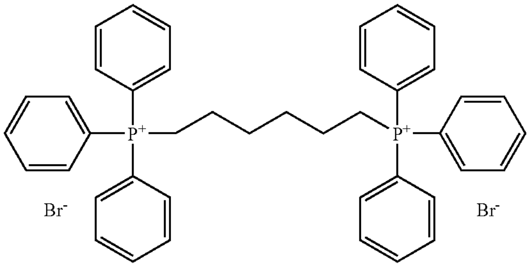

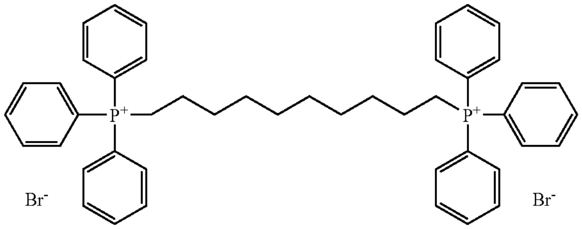

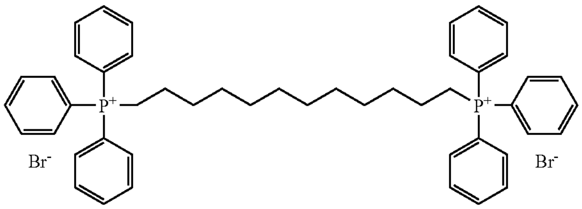

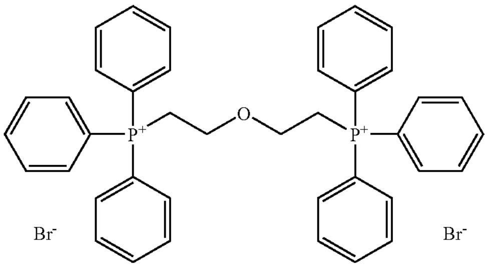

-continued
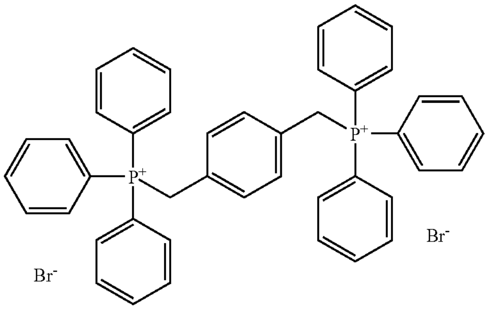
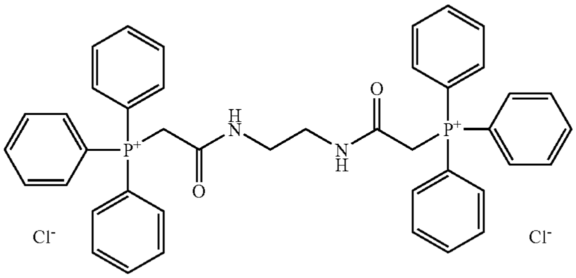
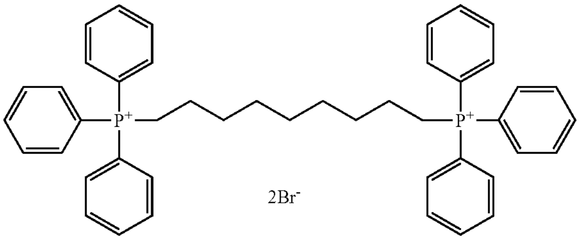
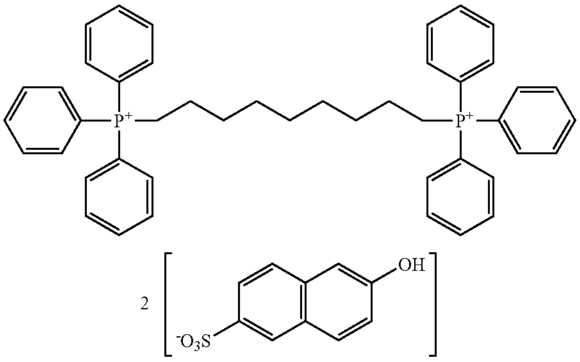
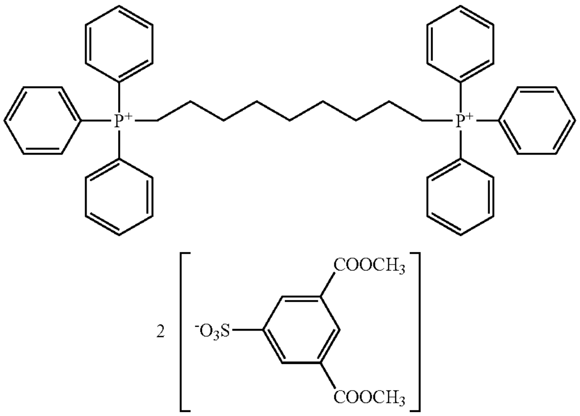
-continued
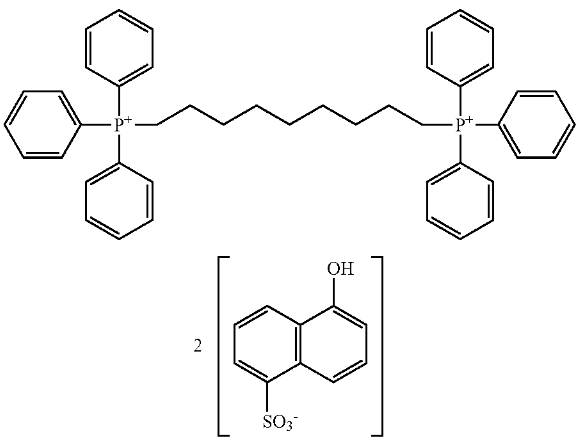
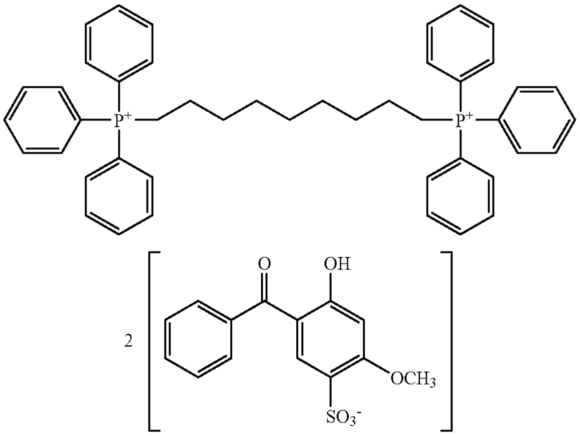
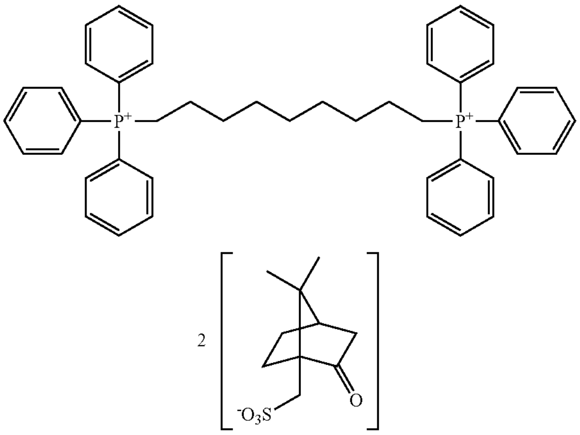
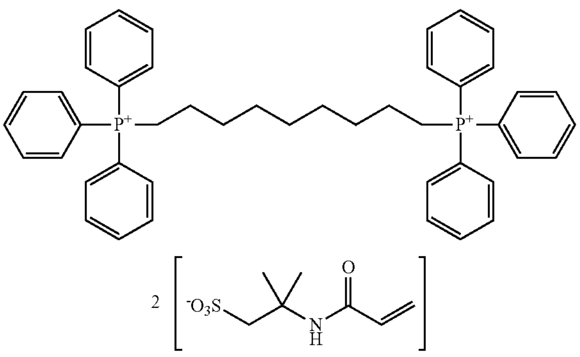

-continued

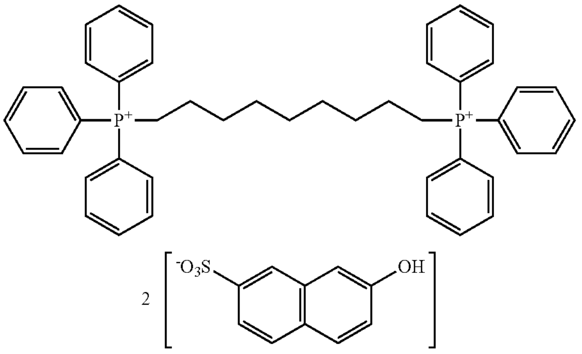

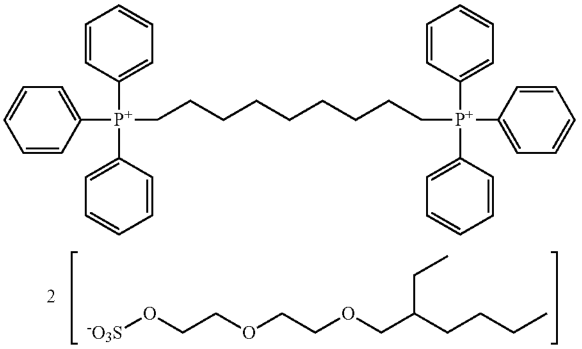

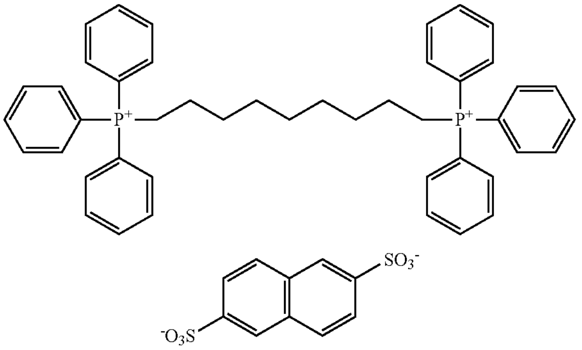

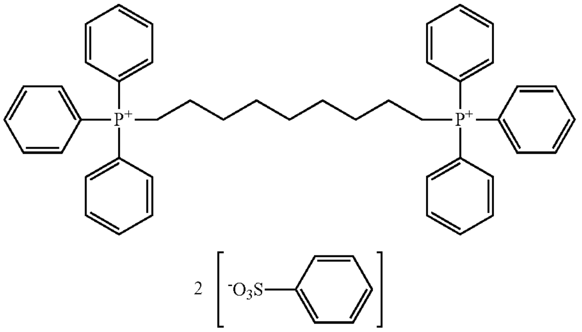

-continued

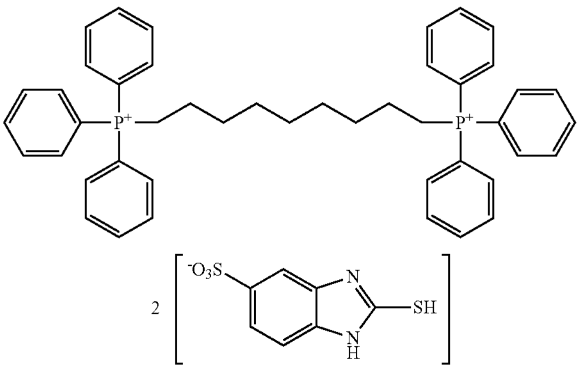

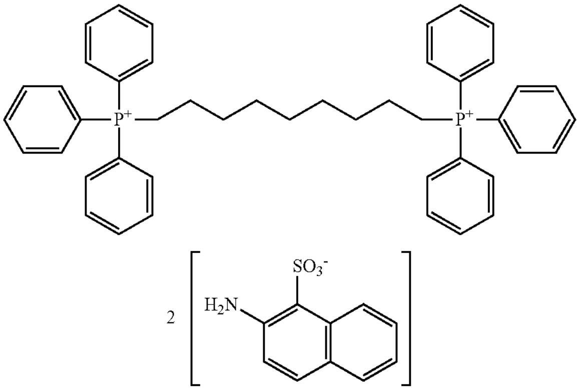

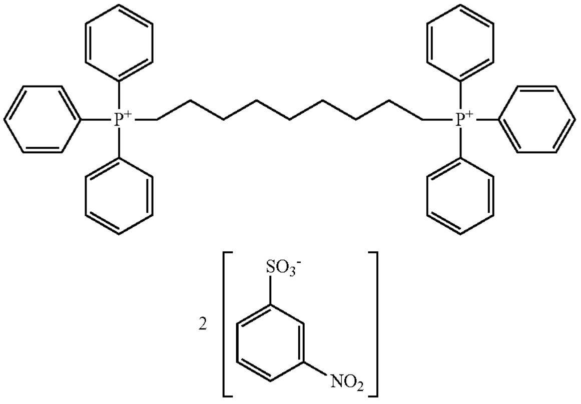

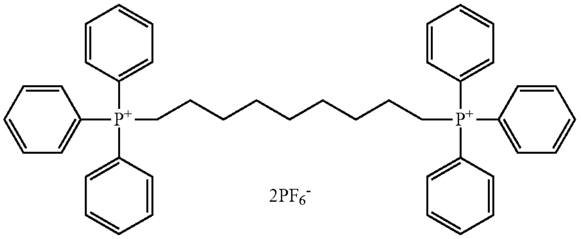

In Formula (III), $R^1$ to $R^4$ each independently represent an alkyl group, an alkenyl group, an alkynyl group, a cycloalkyl group, an alkoxy group, an aryl group, an aryloxy group, an alkylthio group, a heterocyclic group or a hydrogen atom, each of which may have a substituent. Two or more groups among the $R^1$ to $R^4$ may be bonded to form a ring. $X^-$ represents a counter anion.

Here, the number of carbon atoms when the $R^1$ to $R^4$ are an alkyl group, an alkoxy group or an alkylthio group is typically 1 to 20, the number of carbon atoms when the $R^1$ to $R^4$ are an alkenyl group or an alkynyl group is typically 2 to 15, and the number of carbon atoms when the $R^1$ to $R^4$ are a cycloalkyl group is typically 3 to 8.

Examples of the aryl group include a phenyl group and a naphthyl group, examples of the aryloxy group include a phenoxy group and a naphthyloxy group, examples of the arylthio group include a phenylthio group, and examples of the heterocyclic group include a furyl group and a thienyl group.

Examples of a substituent which can be arbitrarily provided to these groups include an alkyl group, an alkenyl group, an alkynyl group, a cycloalkyl group, an alkoxy group, an alkoxycarbonyl group, an acyl group, an alkylthio group, an aryl group, an aryloxy group, an arylthio group, a sulfino group, a sulfo group, a phosphino group, a phosphoryl group, an amino group, a nitro group, a cyano group, a hydroxy group and a halogen atom. These substituents may further have a substituent.

Examples of an anion represented by $X^-$ include a halide ion such as $Cl^-$, $Br^-$ or $I^-$, an inorganic acid anion such as $ClO_4^-$, $PF_6^-$ or $SO_4^{-2}$, an organic carboxylic acid anion and an organic sulfonic acid anion.

Examples of an organic group in the organic carboxylic acid anion and the organic sulfonic acid anion include a methyl group, an ethyl group, a propyl group, a butyl group, a phenyl group, a methoxyphenyl group, a naphthyl group, a fluorophenyl group, a difluorophenyl group, a pentafluorophenyl group, a thienyl group and a pyrrolyl group. Among these, $Cl^-$, $Br^-$, $I^-$, $ClO_4^-$ and $PF_6^-$ are preferable.

Specific examples of the phosphonium compound represented by Formula (III) are shown below.

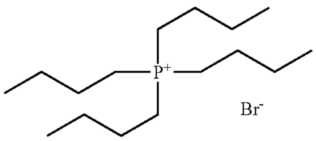

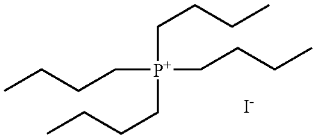

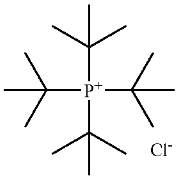

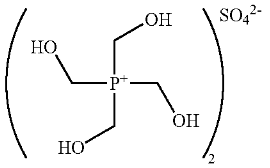

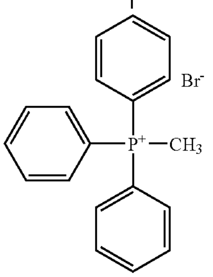

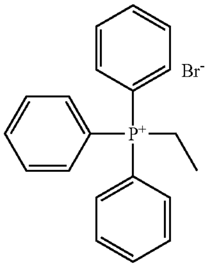

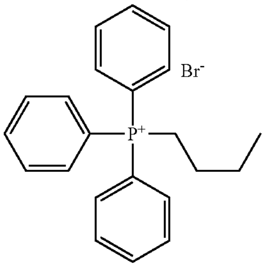

-continued

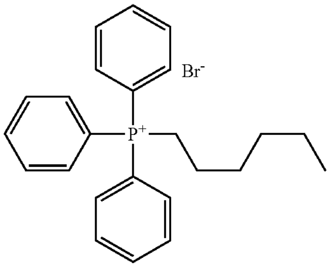

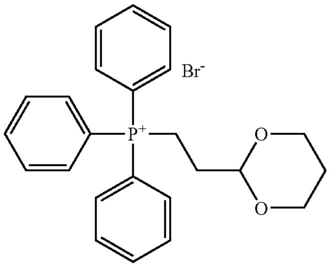

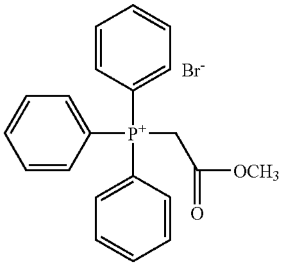

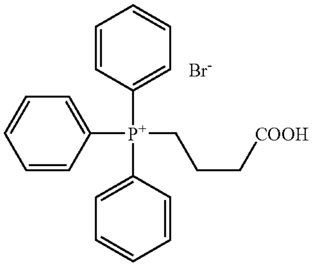

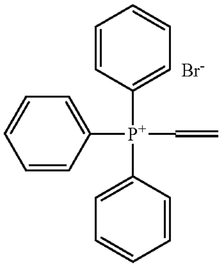

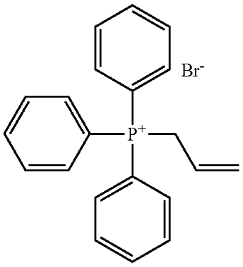

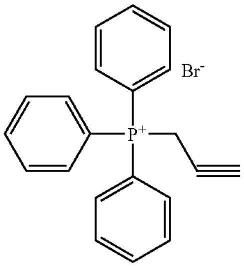

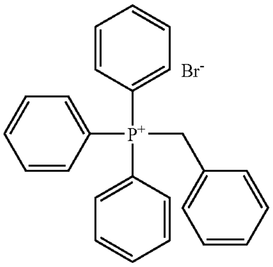

-continued

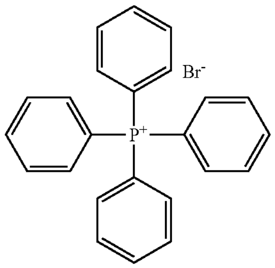

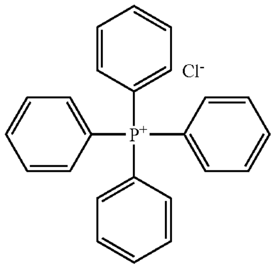

In addition to the phosphonium compounds described above, examples of the sensitizer preferably used in the invention further include the following nitrogen-containing low-molecular compounds. Preferable examples of the nitrogen-containing low-molecular compounds include compounds having the structure of the following Formula (IV).

Formula (6)

(IV)

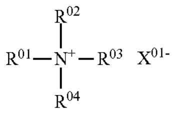

In Formula (IV), $R^{01}$ to $R^{04}$ each independently represent a hydrogen atom or an alkyl group, an alkenyl group, an alkynyl group, a cycloalkyl group, an alkoxy group, an aryl group, an aralkyl group or a heterocyclic group, each of which is substituted or unsubstituted; two or more among $R^{01}$ to $R^{04}$ may be connected with each other to form a ring; and $X^{01-}$ is an anion and represents $PF_6^-$, $BF_4^-$, or an organic sulfonate anion having a substituent selected from an alkyl group, an alkenyl group, an alkynyl group, a cycloalkyl group, an alkoxy group, an aryl group, an aralkyl group and a heterocyclic group.

Examples of the nitrogen-containing low-molecular compound used in the invention include amine salts in which at least one of $R^{01}$ to $R^{04}$ is a hydrogen atom, and quaternary ammonium salts in which none of $R^{01}$ to $R^{04}$ is a hydrogen atom.

Examples of the nitrogen-containing low-molecular compound used in the invention farther include an imidazolinium salt represented by the following Formula (V), a benzoimidazolinium salt represented by the following Formula (VI), a pyridinium salt represented by the following Formula (VII), and a quinolinium salt represented by the following Formula (VIII).

(V)

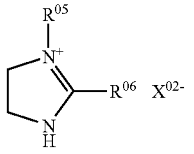

(VI)

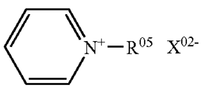

(VII)

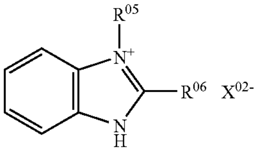

(VIII)

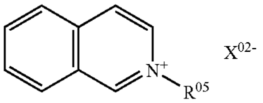

$R^{05}$ and $R^{06}$ each independently represent a hydrogen atom or an alkyl group, an alkenyl group, an alkynyl group, a cycloalkyl group, an alkoxy group, an aryl group, an aralkyl group or a heterocyclic group, each of which is substituted or unsubstituted, and $X^{02-}$ is an anion and has the same meaning as that of $X^{01-}$ in the Formula (IV)

Among those described above, the quaternary ammonium salt and the pyridinium salt can be preferably used.

Specific examples of the nitrogen-containing low-molecular compound which can be preferably used in the invention include the followings, while the scope of the invention is not limited thereby.

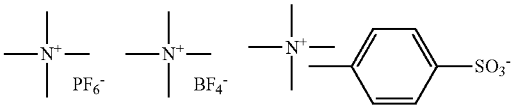

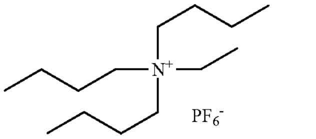

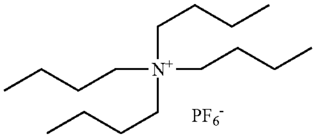

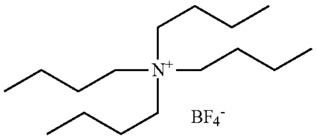

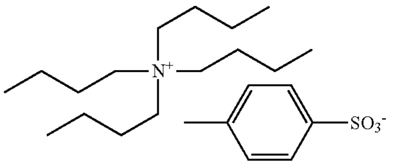

-continued

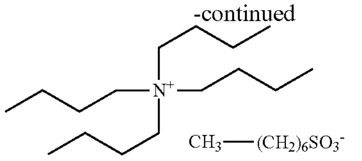

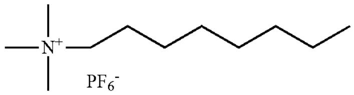

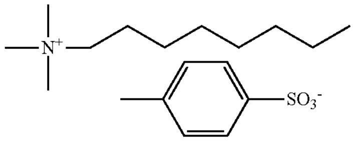

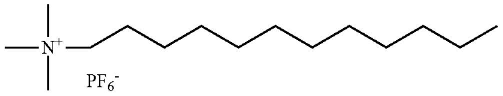

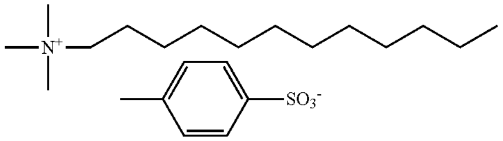

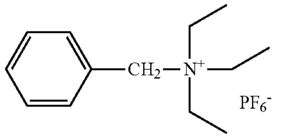

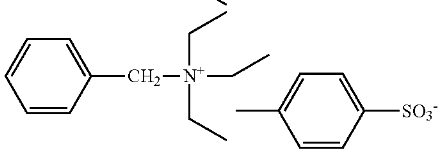

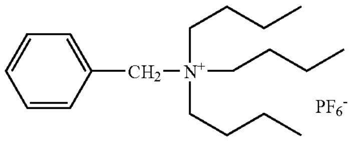

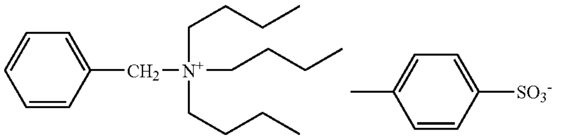

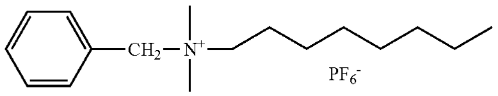

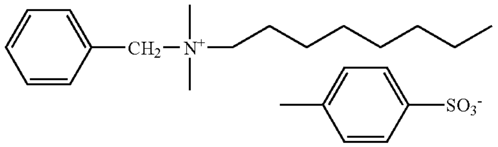

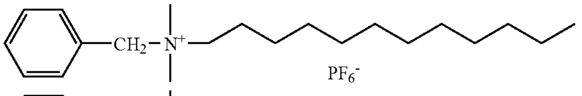

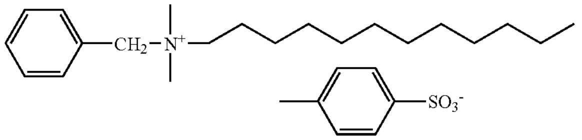

The amount of the phosphonium compound or the nitrogen-containing low-molecular compound which can be contained in the image recording layer is preferably 0.01 to 20% by mass, more preferably 0.05 to 10% by mass, most preferably 0.1 to 5% by mass, in terms of solid content with respect to the total amount of the image recording layer. When these ranges are satisfied, excellent inking property can be attained during printing.

Preferable examples of the sensitizer which can be used in the invention further include an ammonium group-containing polymer such as those shown below. The ammonium group-containing polymer may be any polymer as long as it has an ammonium group in its structure. Preferable examples thereof include those having any one of the repeating units represented by the following Formula (IX) or (X).

(IX)

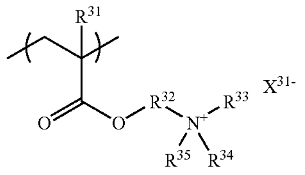

(X)

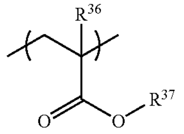

In Formulae (IX) and (X), $R^{31}$ and $R^{32}$ each independently represent a hydrogen atom or a methyl group. $R^{32}$ represents a divalent linking group such as an alkylene group which may have a substitutent or an alkyleneoxy group which may have a substitutent. $R^{33}$, $R^{34}$ and $R^{35}$ each independently represent an alkyl group having 1 to 10 carbon atoms or an aralkyl group having 1 to 10 carbon atoms. $X^{31}$ represents an organic anion or an inorganic anion such as $F^-$, $Cl^-$, $Br^-$, $I^-$, a benzene sulfonate anion which may have a substitutent, a methyl sulfate anion, an ethyl sulfonate anion, a propyl sulfonate anion, a butyl sulfate anion which may be branched, an amyl sulfate anion which may be branched, $PF_6^-$, $BF_4^-$, or $B(C_6F_5)_4^-$. $R^{37}$ represents an alkyl group having 1 to 21 carbon atoms, an aralkyl group, an aryl group, $—(C_2H_4O)_n—R^{38}$, or $—(C_3H_6O)_n—R^{38}$, and $R^{38}$ represents a hydrogen atom, a methyl group or an ethyl group. n represents 1 or 2.

The ammonium salt-containing polymer contains both of the repeating unit represented by Formula (IX) and the repeating unit represented by Formula (X). The polymer may contain two or more kinds of either or both of the structural units represented by Formula (IX) or (X). The ratio of these repeating units contained in the ammonium salt-containing polymer (that is, the ratio of the repeating unit represented by Formula (IX):the structural unit represented by Formula (X)) is not limited, while it is preferably from 5:95 to 80:20 in terms of a mole ratio. This polymer may further contain other copolymerizable component (repeating unit) in such a range that the effect of the invention can be assured.

The reduced specific viscosity (unit: cSt/g/ml, corresponding to $mm^2/s/g/ml$) of the ammonium salt-containing polymer, as determined by the following measurement method, is preferably in the range of 5 to 120, more preferably in the range of 10 to 110, and is still more preferably in the range of 15 to 100.

Method for Measuring Reduced Specific Viscosity 3.33 g of a polymer solution containing 30% by mass of a polymer to be tested (corresponding to 1 g of the polymer as solid content) is weighed out in a 20-ml measuring flask and adjusted to a volume of 20 ml with N-methylpyrrolidone. This solution is introduced into an Ubbellohde reduced viscosity tube (viscometer constant=0.010 cSt/s), and the time length required for running down of the polymer solution at 30° C. is measured, and a reduced specific viscosity of the polymer solution is calculated in a usual manner based on the equation "kinematic viscosity"="viscometer constant"× "time (sec) in which the liquid passes through a narrow tube".

Specific examples of the ammonium salt-containing polymer are shown below.

(1)

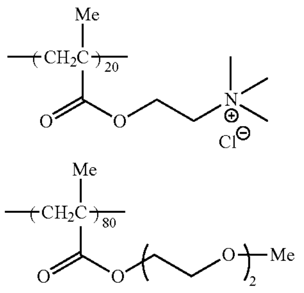

(2)

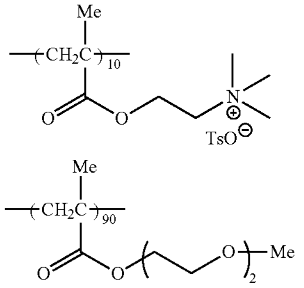

(3)

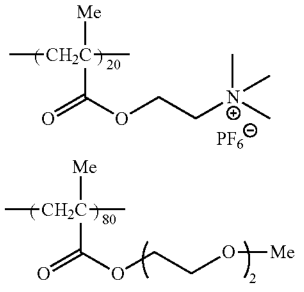

(4)

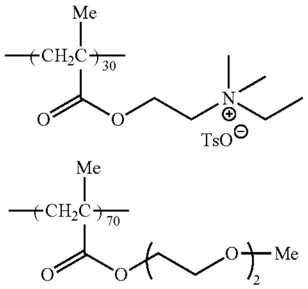

-continued (5)

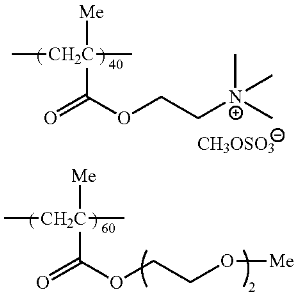

(6)

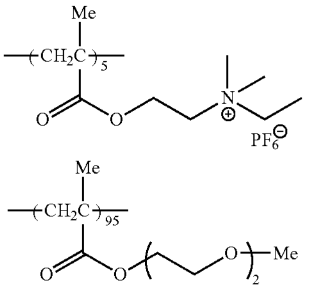

(7)

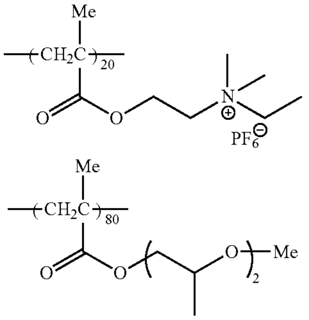

(8)

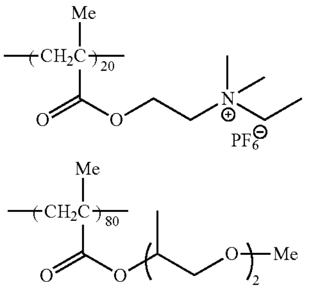

(9)

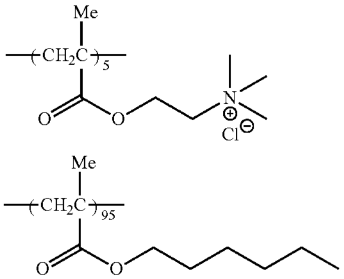

-continued
(10)
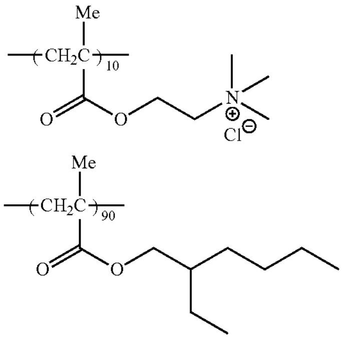
(11)
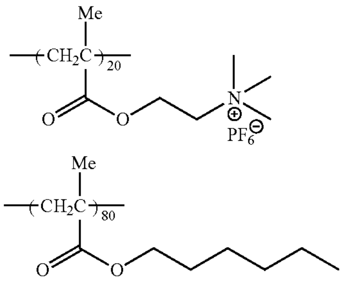
(12)
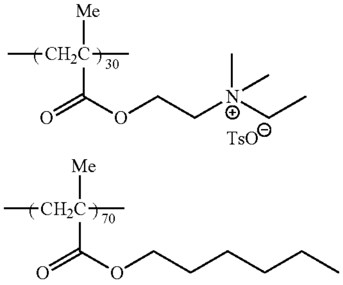
(13)
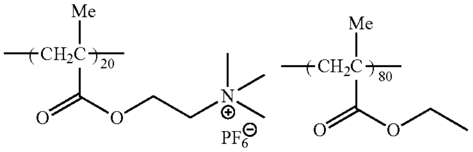
(14)
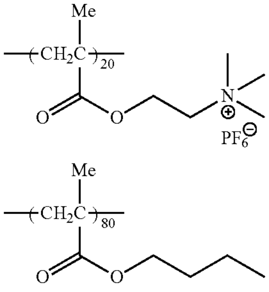
-continued
(15)
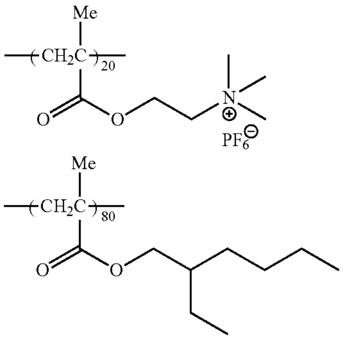
(16)
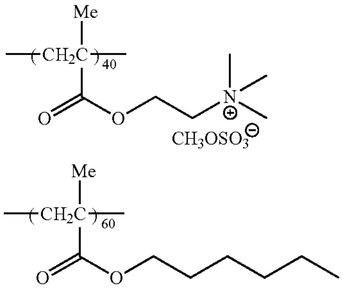
(17)
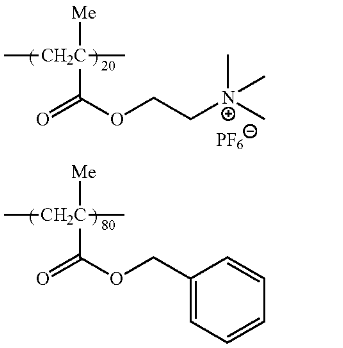
(18)
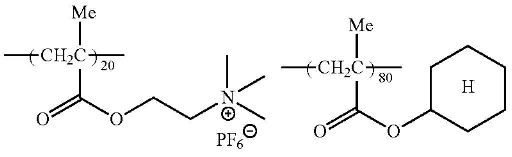
(19)
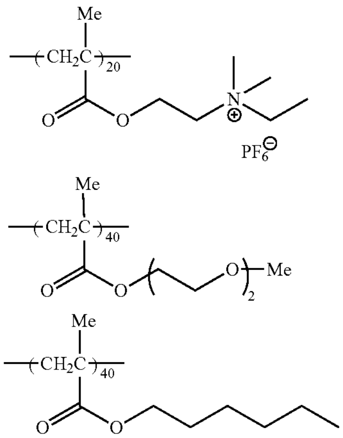

-continued (20)

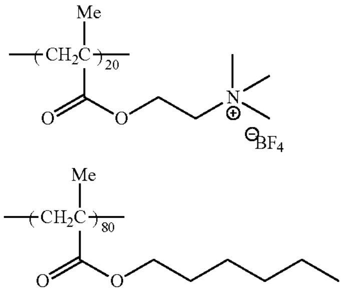

(21)

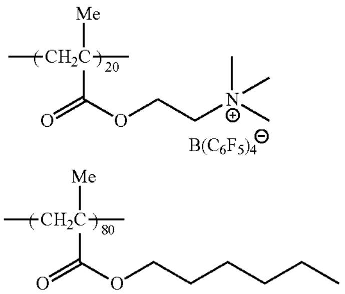

(22)

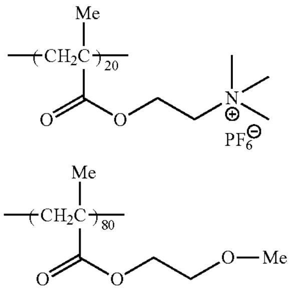

(23)

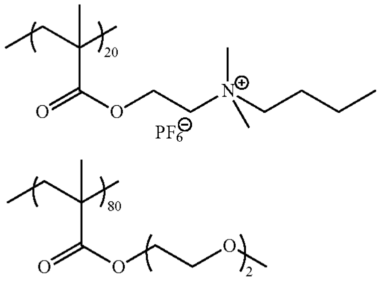

(24)

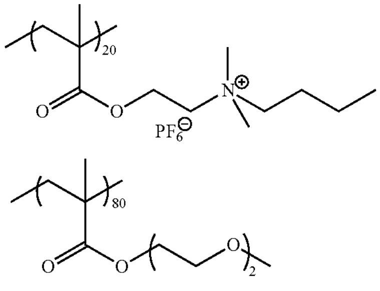

-continued (25)

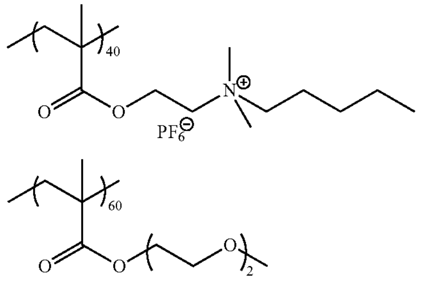

The content of the ammonium salt-containing polymer which can be contained in the image recording layer as a is preferably 0.0005 to 30.0% by mass, more preferably 0.001 to 20.0% by mass, and is particularly preferably 0.002 to 15.0% by mass, with respect to the total solid content of the image recording layer. When the content of the polymer is in this range, excellent inking property can be attained. The ammonium salt-containing polymer may also be contained in a protective layer, details of which are described in the followings.

The phosphonium compound, the nitrogen-containing low-molecular compound, and the ammonium salt-containing polymer may be used singly or in combination of two or more thereof as the sensitizer. For example, an ammonium salt which is one kind of the nitrogen-containing low-molecular compound and an ammonium salt-containing polymer can be used in combination as the sensitizer.

When two or more kinds of sensitizers are used in combination, the total amount of the sensitizers in the image recording layer is preferably in a range of 0.0005% by mass to 40.0% by mass, and is more preferably in a range of 0.001% by mass to 25.0% by mass, with respect to the total solid content of the image recording layer.

(10) Inorganic Laminar Compound

An inorganic laminar compound can be arbitrarily added to the image recording layer in the invention. Details of the inorganic laminar compound are the same as those which can be added to the protective layer described in the following. The addition of the inorganic laminar compound to the image recording layer is useful for improving printing durability, polymerization efficiency (sensitivity) and temporal stability.

The amount of the inorganic laminar compound added to the image recording layer is preferably 0.1 to 50% by mass, more preferably 0.3 to 30% by mass, and is particularly preferably 1 to 10% by mass with respect to the solid content of the image recording layer.

Formation of Image Recording Layer

The image recording layer of the planographic printing plate precursor of the invention may be formed by dispersing or dissolving the necessary components in a solvent to form a coating liquid, applying the coating liquid onto the support and drying the applied coating liquid.

Examples of the solvent for use include, but are not limited to, ethylene dichloride, cyclohexanone, methylethylketone, methanol, ethanol, propanol, ethylene glycol monomethylether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, y-butylolactone, toluene, and water. The solvent may be used singly or in a combination of two or more thereof. The solid content of the coating liquid is preferably from 1 to 50 wt % of the total amount of the coating liquid.

The image recording layer of the planographic printing plate precursor of the invention may be formed by providing multiple coating liquids, each of which is prepared by dispersing or dissolving the same or different components in the same or different solvents, and applying the coating liquids by repeating plural times of coating and drying operation.

The amount (in terms of solid content) of the image recording layer on the support after coating and drying may vary depending on the application, while it is preferably from 0.3 to 3.0 g/$m^2$ in general. Within the range above, favorable sensitivity and favorable film property of the image recording layer can be obtained.

Various methods may be used for coating. Examples thereof include bar coater coating, spin coating, spray coating, curtain coating, dip coating, air knife coating, blade coating, and roll coating.

Protective Layer

A protective layer (overcoat layer) can be preferably provided on the image recording layer of the planographic printing plate precursor according to the invention.

The protective layer a function to impart oxygen-blocking property to prevent an image formation inhibition reaction due to oxygen, as well as a function to prevent scratch or the like on the image recording layer, a function to prevent ablation at the time of high-illumination laser exposure, and the like.

Components and the like regarding the protective layer are explained hereinafter.

The exposure of the planographic printing plate is conducted normally in the air. The image forming reaction in the image recording layer caused by exposure to radiation may be inhibited by low-molecular weight compounds in the air such as oxygen and basic substances. The protective layer prevents entry of the low-molecular weight compounds such as oxygen and basic substances into the image recording layer, and consequently suppresses the reactions that inhibit image formation conducted in the air. Accordingly, desirable characteristics of the protective layer include low permeation to low-molecular weight compounds such as oxygen, superior transmission of the radiation used for exposure, excellent adhesion to the image recording layer, and easy removability during an on-press development after exposure. Protective layers having such characteristics are described, for example, in U.S. Pat. No. 3,458,311 and JP-B No. 55-49729.

The raw material for the protective layer can be selected appropriately from water-soluble polymers as well as from water-insoluble polymers. Specific examples thereof include water-soluble polymers such as polyvinyl alcohol, modified polyvinyl alcohols, polyvinyl pyrrolidone, polyvinyl imidazole, polyacrylic acid, polyacrylamide, partially saponified product of polyvinyl acetate, ethylene-vinylalcohol copolymers, water-soluble cellulose compounds, gelatin, starch compounds, or gum arabic; and polymers such as polyvinylidene chloride, poly(meta)acrylonitrile, polysulfone, polyvinyl chloride, polyethylene, polycarbonate, polystyrene, polyamide, or cellophane. The raw materials can be used in a combination of two or more thereof as necessary.

Water-soluble polymer compounds which are superior in crystallinity can be relatively useful among the raw materials above. Specific preferable examples thereof include polyvinyl alcohol, polyvinyl pyrrolidone, polyvinyl imidazole, water-soluble acrylic resins such as polyacrylic acid, gelatin, and gum arabic. Among them, polyvinyl alcohol, polyvinyl pyrrolidone, and polyvinyl imidazole are preferable in the point that they can be coated using water as the solvent and they can be easily removed with damping water provided at the time of printing. Among them, polyvinyl alcohol (PVA) gives the most favorable results on basic properties such as oxygen-blocking property or removability at development.

The polyvinyl alcohol for use in the protective layer may be partially substituted by ester, ether, or acetal as long as it still contains unsubstituted vinyl alcohol units substantially in an amount that gives required water solubility. Similarly, the polyvinyl alcohol may contain one or more other copolymerization components in a part. For example, polyvinyl alcohols having various polymerization degrees which randomly have any of various hydrophilic modified units such as an anion-modified unit modified with an anion such as a carboxyl or sulfo group, a cation-modified unit modified with a cation such as an amino or ammonium group, a silanol-modified unit, or a thiol modification unit, and polyvinyl alcohols having various polymerization degrees which have, at a terminal of the polymer chain, any of modified units such as an anion-modified unit, a cation-modified unit, a silanol-modified unit, a thiol modified unit, an alkoxyl modified unit, a sulfide modified unit, an ester modified unit between vinyl alcohol and any of various organic acids, an ester modified unit between the aforementioned anion-modified unit and an alcohol, or an epoxy-modified unit, are preferable.

Preferable examples of the modified polyvinyl alcohol include those having a polymerization degree in the range of 300 to 2,400 and hydrolysed at the degree of 71 to 100 mol % thereof. Specific examples thereof include PVA-105, PVA-110, PVA-117, PVA-117H, PVA-120, PVA-124, PVA124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 manufactured by Kuraray Co. Ltd.

Examples of the modified polyvinyl alcohols include those having an anion-modified unit such as KL-318, KL-118, KM-618, KM-118, or SK-5102; those having a cation-modified unit such as C-318, C-118, or CM-318; those having a terminal thiol-modified unit such as M-205 or M-115; those having a terminal sulfide-modified unit such as MP-103, MP-203, MP-102, or MP-202; those having an ester-modified unit with a higher aliphatic acid at the terminal such as HL-12E or HL-1203; and those having other reactive silane-modified unit such as R-1130, R-2105 or R-2130.

The Protective Layer Preferably Contains an Inorganic Laminar Compound.

The laminar compound is a particle having a thin plate shape, and examples thereof include micas including natural micas and synthetic micas such as those represented by the formula of $A(B,C)_{2-5}D_4O_{10}(OH,F,O)_2$ (wherein A represents Li, K, Na, Ca, Mg, or organic cation; B and C each independently represent Fe (II), Fe (III), Mn, Al, Mg, or V; and D represents Si or Al); tales such as that represented by $3MgO\text{-}4SiO\text{-}H_2O$; teniolite; montmorillonite; saponite; hectolite; and zirconium phosphate.

Examples of the natural micas include white mica, soda mica, phlogopite, black mica, and scaly mica. Examples of the synthetic micas include: non-swelling micas such as fluorine phlogopite $KMg_3(AlSi_3O_{10})F_2$ or K tetrasilicic mica $KMg_{2.5}(Si_4O_{10})F_2$; and swelling micas such as Na tetrasilicic mica $NaMg_{2.5}(Si_4O_{10})F_2$, Na or Liteniolite $(Na,Li)Mg_2Li(Si_4O_{10})F_2$, or montmorillonite-containing Na hectolight or Li hectolight $(Na,Li)_{1/8}Mg_{2/5}Li_{1/8}(Si_4O_{10})F_2$. Synthetic smectites are also useful.

Among the laminar compounds, fluorine-containing swelling micas, which are synthetic laminar compounds, are particularly useful. Swelling clay minerals such as mica, montmorillonite, saponite, hectolite, bentonite or the like have a laminate structure having unit crystal lattice layers with a thickness of approximately 10 to 15 Å, and the degree of intra-lattice metal atom substitutions is significantly higher than other clay minerals. As a result, the lattice layer becomes deficient in the amount of positive charges, and thus cations such as $Li^+$, $Na^+$, $Ca^{2+}$, or $Mg^{2+}$ or an organic cation (e.g., an amine salt, a quaternary ammonium salt, a phosphonium salt or a sulfonium salt) are adsorbed to the interlayer space to compensate the deficiency. These laminar compounds swell in the presence of water. Thus, the compounds are easily cleaved when a shearing force is applied in that state, giving a stable sol in water. Such a tendency is stronger in the case of bentonite and swelling synthetic micas.

With regard to the shape of the laminar compound, the thickness of the laminar compound is preferably as small as possible from the viewpoint of diffusion control, and the plane size of the laminar compound is preferably as large as possible as long as the smoothness of coated surface or the transmission of the activated radiation is not impaired. In consideration of such viewpoints, the aspect ratio of a particle of the laminar compound may be 20 or more, preferably 100 or more, and be particularly preferably 200 or more. The "aspect ratio" is a ratio of the thickness of the particle to the length of particle, and may be determined, for example, from the projection of the particle in a micrograph. A laminar compound having a greater aspect ratio may create greater effects.

Regarding the particle diameter of the laminar compound, the average diameter may be from 0.3 to 20 μm, preferably from 0.5 to 10 μm, and particularly preferably from 1 to 5 μm. When the particle diameter is less than 0.3 μm, inhibition of penetration of oxygen and moisture may become insufficient, and may not be sufficiently effective. Use of a laminar compound having a diameter of more than 20 μm may cause a problem in that dispersion stability in the coating liquid may become insufficient and coating may not be stable. The average thickness of the particles is preferably 0.1 μm or less, more preferably 00.05 μm or less, and is particularly preferably 0.01 μm or less. For example, a swelling synthetic mica, which is a typical example of the layered inorganic compound, has a thickness of approximately 1 to 50 nm and a plane size of approximately 1 to 20 μm.

Presence of particles of the inorganic laminar compound having a larger aspect ratio in the protective layer leads to improvement in the coated film strength and more effective prevention of permeation of oxygen and moisture; as a result, deterioration of the protective layer by deformation or the like is prevented, and storage stability is improved (e.g., the image forming property of the planographic printing plate precursor is not deteriorated by humidity change even when stored under high-humidity condition for a long time).

An example of a general method for dispersing the laminar compound used in the protective layer will be described. First, 5 to 10 parts by weight of the swelling laminar compound, which is mentioned above as a preferable laminar compound, is added to 100 parts by weight of water, and left sufficiently to reach a stable state so that the laminar compound swells. Then, the mixture is treated with a dispersing machine, so that the laminar compound is dispersed. Examples of the dispersing machine to be used include various mills that mechanically apply direct force for dispersing, high-speed stirring dispersing machines having high shear force, and dispersing machines giving high-intensity ultrasonic energy. Specific examples include a ball mill, a sand grinder mill, a viscomill, a colloid mill, a homogenizer, a dissolver, a Polytron, a homomixer, a homoblender, a Keddy mill, a jet agitator, a capillary emulsifier, a liquid siren, an electromagnetic strain ultrasonic generator, and an emulsifier having a Poleman whistle. A dispersion containing 5 to 10 wt % of the inorganic laminar compound dispersed by the method described above is highly viscous or gelled and extremely excellent in storage stability.

When this dispersion is used to prepare a coating liquid for forming the protective layer, the coating liquid is preferably prepared by diluting the dispersion with water and sufficiently stirring it, followed by compounding it with a binder solution.

Regarding the content of the inorganic laminar compound in the protective layer, the ratio of the amount of inorganic laminar compound contained in the protective layer to the amount of the binder used in the protective layer is preferably from 1/100 to 5/1 by weight. When multiple inorganic laminar compounds are used simultaneously, the total content of the inorganic laminar compound is preferably in the aforementioned weight range.

As additional components of the protective layer, glycerol, dipropylene glycol, propionic amide cyclohexanediol, sorbitol or the like may be added to the water-soluble polymer or the water-insoluble polymer in an amount of several wt % with respect to the polymer. Examples of the additional components further include conventional additives such as a (meth)acrylic polymer or a water-soluble plasticizer to improve physical properties of the protective layer as a film.

The protective layer can be formed by using a coating liquid for the protective layer as described in the following. The coating liquid for the protective layer may contain a conventionally-known additive in view of improving adhesiveness of the protective layer to the image recording layer and stability of the coating liquid upon time lapse.

Examples of the additive which can be contained in the coating liquid for the protective layer include an anionic surfactant, an amphoteric surfactant, a nonionic surfactant, a cationic surfactant, and a fluorine surfactant, and specific examples thereof include: anionic surfactants (e.g., sodium alkylsulfate or sodium alkylsulfonate); amphoteric surfactants (e.g., alkylamino carboxylate salts or alkylamino dicarboxylate salt); and nonionic surfactants such as polyoxyethylene alkylphenylether. The amount of the surfactant contained in the coating liquid for the protective layer may be from 0.1 to 100 wt % with respect to the amount of the water-soluble or water-insoluble polymer to be contained in the protective layer.

In addition, in view of the improvement in adhesion of the protective layer to the image portion, for example, JP-A No. 49-70702 and British Patent Application No. 1303578 describe that sufficient adhesiveness can be obtained when 20 to 60 wt % of an acrylic emulsion, a water-insoluble vinyl pyrrolidone-vinyl acetate copolymer, or the like is mixed with a hydrophilic polymer mainly composed of polyvinyl alcohol and then the mixture is applied on the image recording layer. In the present invention, any one such known techniques may be used.

Additional functions may be further provided to the protective layer. For example, a colorant (e.g., a water-soluble dye) which is excellent in transmittance to the infrared rays used for exposure of the recording layer and capable of effectively absorbing light of a wavelength that does not participate in exposure may be added to the protective layer, so that safelight compatibility can thereby be increased without reducing sensitivity.

A protective layer may be formed by coating the liquid for forming the protective layer prepared as described above on the image recording layer provided on a support, followed by drying.

The solvent for the coating liquid may be selected appropriately in consideration of the kind of binder to be used. When a water-soluble polymer is used, distilled water or purified water is preferably used as the solvent.

The method for coating the coating liquid for forming a protective layer is not particularly limited, and any one of known methods such as those described in U.S. Pat. No. 3,458,311 and JP-B No. 55-49729 may be applied.

Specifically, the protective layer may be formed by blade coating, air knife coating, gravure coating, roll coating, spray coating, dip coating, bar coating, or the like.

The amount of the protective layer to be applied is preferably in the range of 0.01 to 10 $g/m^2$, more preferably 0.02 to 3 $g/m^2$, and is particularly preferably 0.02 to 1 $g/m^2$, in terms of the amount resulted after drying the coating.

Hydrophilic Support

The hydrophilic support used in the planographic printing plate precursor according to the invention is not particularly limited, as long as a surface thereof on which the image recording layer is provided is hydrophilic. The material which forms the hydrophilic support is not particularly limited as long as it is a dimensionally stable plate-shaped material. Examples thereof include paper, paper laminated with a plastic material (e.g., polyethylene, polypropylene, or polystyrene), metal plates (e.g., of aluminum, zinc, or copper), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinylacetal), paper or plastic films laminated with a metal selected from the above metals, and paper or plastic films on which a metal selected from the above metals is deposited.

Preferable examples of the support for the planographic printing plate precursor include polyester films and aluminum plates. Among them, aluminum plates, which are superior in dimensional stability and relatively inexpensive, are more preferable.

Examples of the aluminum plate include a pure aluminum plate, an alloy plate containing aluminum as the main component and trace amounts of hetero-elements, and a thin film of aluminum or an aluminum alloy laminated with plastic. Examples of the hetero-element contained in the aluminum alloy include silicon, iron, manganese, copper, magnesium, chromium, zinc, bismuth, nickel, and titanium. The content of the hetero-elements in the alloy is preferably 10 wt % or less of the total amount of the alloy. While pure aluminum plates are preferable in the invention, aluminum plates containing trace amounts of hetero-elements are also usable in consideration of the fact that it is difficult to prepare completely pure aluminum due to the problems in refining process. The composition of the aluminum plate is not particularly limited, and a known material may be used appropriately.

The aluminum plate is preferably subjected to a surface treatment such as a surface roughening treatment or an anodizing treatment before being used. The hydrophilicity of the support and the adhesion between the image recording layer and the support are improved by the surface treatment. Before the surface roughening treatment, the aluminum plate may be, as necessary, subjected to a degreasing treatment with a surfactant, organic solvent, aqueous alkaline solution or the like so as to remove the rolling oil on the surface.

Various methods may be used for surface roughening of the aluminum plate, and examples thereof include a mechanical surface roughening treatment, an electrochemical surface roughening treatment (surface roughening by dissolving the surface electrochemically), and a chemical surface roughening treatment (surface roughening by selectively dissolving the surface chemically).

The method for the mechanical surface roughening may be selected from methods known in the art such as ball polishing, brush polishing, blast polishing, or buff polishing.

The electrochemical surface roughening may be performed, for example, by applying an alternate or direct current to the support in an electrolyte solution containing an acid such as hydrochloric acid or nitric acid. A method of using a mixed acid is also usable, such as the method described in JP-A No. 54-63902.

The aluminum plate after surface roughening treatment may be etched with alkali, using an aqueous solution of potassium hydroxide, sodium hydroxide, or the like if necessary. After being subjected to neutralization, the aluminum plate may be further subjected, as necessary, to an anodizing process so as to improve the wearing resistance.

The electrolyte to be used for the anodization of the aluminum plate may be selected from various electrolytes that are capable of forming a porous oxide film. In general, the electrolyte may be selected from sulfuric acid, hydrochloric acid, oxalic acid, chromic acid, and mixed acids thereof. The concentration of the electrolyte is determined adequately according to the kind of the electrolyte.

The condition of the anodization may be changed according to the electrolyte to be used, and thus cannot be specified uniquely. In general, the electrolyte concentration may be from 1 to 80 wt %; the liquid temperature may be from 5 to 70° C., the electric current density may be from 5 to 60 $A/dm^2$; the voltage may be from 1 to 100 V; and the electrolysis time may be from 10 seconds to 5 minutes. The amount of the anodic oxide film to be formed is preferably from 1.0 to 5.0 $g/m^2$ and is more preferably from 1.5 to 4.0 $g/m^2$. In this range, it is possible to obtain a planographic printing plate with superior printing durability and scratch resistance of the non-image portion.

The support used in the invention may be a substrate itself having an anodic oxide film, which is surface-treated as described above. Examples of the support further include a substrate which is surface-treated as described above, has the anodic oxide film, and may be her subjected to a treatment properly selected from the group consisting of: enlarging of micropores of the anodic oxide film; sealing of micropores of the anodic oxide film; and surface hydrophilizing by immersing the substrate in an aqueous solution containing a hydrophilic compound, which are described in JP-A Nos. 2001-253181 and 2001-322365, as required in order to further improve adhesive property to the upper layer, hydrophilic property, resistance to dirt and thermal insulating property of the support. Needless to say, these enlarging treatment and sealing treatment are not limited to the treatments described therein, and any conventionally known method may be applied. Examples of the sealing treatment further include a steam sealing as well as a single treatment with fluorozirconic acid, a treatment with sodium fluoride and a steam sealing with an addition of lithium chloride.

The sealing treatment used in the invention is not particularly limited, and conventionally known methods may be used. Among these, a sealing treatment with an aqueous solution containing an inorganic fluorine compound, a sealing treatment with water vapor and a sealing treatment with hot water are preferable. Each of the treatments is described below.

<1> Sealing Treatment with Aqueous Solution Containing Inorganic Fluorine Compound Preferable examples of an inorganic fluorine compound used for the sealing treatment with an aqueous solution containing an inorganic fluorine compound include a metal fluoride.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, ferric fluoride, fluorophosphoric acid and ammonium fluorophosphates. Among these, sodium fluorozirconate, sodium fluorotitanate, fluorozirconic acid and fluorotitanic acid are preferable.

The concentration of an inorganic fluorine compound in the aqueous solution is preferably 0.01% by mass or more, and is more preferably 0.05% by mass or more in view of sufficiently performing the sealing of micropores of the anodic oxide film. Further, the concentration thereof is preferably 1% by mass or less, and is more preferably 0.5% by mass or less in view of resistance to dirt.

It is preferable that the aqueous solution containing the inorganic fluorine compound further contains a phosphate compound. The inclusion of the phosphate compound in the aqueous solution allows improvements in on-press developability and resistance to dirt due to improvement in hydrophilic property of the surface of the anodic oxide film.

Preferable examples of the phosphate compound include a phosphoric acid salts of metals such as alkali metal or alkaline-earth metal.

Specific examples thereof include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, ammonium sodium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium molybdophosphate, sodium molybdophosphate, sodium phosphite, sodium tripolyphosphate and sodium pyrophosphate. Among them, sodium dihydrogen phosphate, disodium hydrogen phosphate, potassium dihydrogen phosphate and dipotassium hydrogen phosphate are preferable.

The combination of the inorganic fluorine compound and the phosphate compound is not particularly limited, while it is preferable that aqueous solution contains at least sodium fluorozirconate as the inorganic fluorine compound and at least sodium dihydrogen phosphate as the phosphate compound.

The concentration of the phosphate compound in aqueous solution is preferably 0.01% by mass or more, and is more preferably 0.1% by mass or more in view of improving on-press developability and resistance to dirt, and preferably 20% by mass or less, and is more preferably 5% by mass or less in view of solubility.

The ratio of each compound in aqueous solution is not particularly limited, while the mass ratio of an inorganic fluorine compound to a phosphate compound (inorganic fluorine compound/phosphate compound) is preferably 1/200 to 10/1, and is more preferably 1/30 to 2/1.

The upper limit of temperature of the aqueous solution is preferably 20° C. or more, and is more preferably 40° C. or more, while the lower limit of temperature thereof is preferably 100° C. or less, and is more preferably 80° C. or less.

The aqueous solution is preferably pH of 1 or more, and is more preferably pH of 2 or more, while the pH is preferably pH of 11 or less, and is more preferably pH of 5 or less.

A method for the sealing treatment with the aqueous solution containing an inorganic fluorine compound is not particularly limited, and examples thereof include an immersion method and a spray method. Any one of these methods may be conducted once or a plurality of times, and any of these methods may be used in combination of two kinds or more thereof.

Among them, the immersion method is preferable. In the case where the immersion method is performed, the time length for performing the method is preferably 1 second or more, and is more preferably 3 seconds or more, while it is preferably 100 seconds or less, and is more preferably 20 seconds or less.

<2> Sealing Treatment with Water Vapor

Examples of the sealing treatment with water vapor include a method for contacting water vapor which is pressurized or at normal pressure with an anodic oxide film continuously or discontinuously.

The temperature of water vapor is preferably 80° C. or more, and is more preferably 95° C. or more, while it is preferably 105° C. or less.

The pressure of water vapor is preferably in a range of $1.008 \times 10^5$ to $1.043 \times 10^5$ Pa, that corresponds to the range from [(atmospheric pressure)−50 mmAq] to [(atmospheric pressure)+300 mmAq].

The time for contacting water vapor is preferably 1 second or more, and is more preferably 3 seconds or more, while it is preferably 100 seconds or less, and is more preferably 20 seconds or less.

<3> Sealing Treatment with Hot Water

Examples of the sealing treatment with hot water include a method for immersing an aluminum plate with an anodic oxide film formed in hot water.

The hot water may contain inorganic salt (for example, phosphate) or organic salt.

The temperature of hot water is preferably 80° C. or more, and is more preferably 95° C. or more, while it is preferably 100° C. or less.

The time for immersing the aluminum plate in hot water is preferably 1 second or more, and is more preferably 3 seconds or more, while it is preferably 100 seconds or less, and is more preferably 20 seconds or less.

Examples of the method for hydrophilizing the surface of the substrate include an alkali metal silicate method, such as the methods described in U.S. Pat. Nos. 2,714,066, 3,181,461, 3,280,734 and 3,902,734. In the method, the support may be immersed or may be electrolyzed in, for example, an aqueous solution of sodium silicate. Other examples of the hydrophilizing method include a method of treating the support with potassium fluorozirconate described in JP-B No. 36-22063, and the methods of treating the support with polyvinylphosphonic acid described in U.S. Pat. Nos. 3,276,868, 4,153,461 and 4,689,272.

The support used in the invention is preferably the one having Si atoms adhering thereto by being subjected to dipping treatment as hydrophilization treatment with an aqueous solution such as sodium silicate. The support is particularly preferably the one having Si atoms adhering in an amount of 8 $mg/m^2$ or more to the surface thereof. The upper limit of the amount of Si atoms adhering thereto is 15 $mg/m^2$, and is preferably 12 $mg/m^2$. The amount of Si atoms adhering thereto can be quantified by fluorescent X-ray measurement.

Generally, as the amount of Si atoms on the surface of the support become larger, hydrophilicity is increased, while water tends to easily penetrate into the interface between the support and the image recording layer, which may result in a problem of deterioration in printing durability and in a problem that when the surface of an image region after exposure to light is flawed, the flaw will appear on a print.

However, when the image recording layer in the invention is used, printing durability can be improved as described above, and therefore, deterioration in printing durability can be prevented even if a highly hydrophilic support having Si atoms adhering thereon in an amount of 8 $mg/m^2$ or more is used.

In the case where a support having a surface with insufficient hydrophilic property, such as a polyester film, is used as the support in the invention, it is desirable that the surface is rendered hydrophilic by applying a hydrophilic layer. Preferable examples of the hydrophilic layer include: a hydrophilic layer described in JP-A No. 2001-199175 and is formed by coating a coating solution containing colloid of oxide or hydroxide of at least one element selected from beryllium, magnesium, aluminum, silicon, titanium, boron, germanium, tin, zirconium, iron, vanadium, antimony and transition metal; a hydrophilic layer described in JP-A No. 2002-79772 and has an organic hydrophilic matrix obtained by crosslinking or para-crosslinking an organic hydrophilic polymer; a hydrophilic layer having an inorganic hydrophilic matrix obtained by sol-gel transformation through hydrolysis and condensation reaction of polyalkoxysilane, titanate, zirconate or aluminate; and a hydrophilic layer composed of an inorganic thin film having a surface containing metallic oxide. Among them, the hydrophilic layer formed by coating a coating solution containing colloid of oxide or hydroxide of silicon is preferable.

Also, in the case where a polyester film is used as the support in the invention, an antistatic layer is preferably provided on either or both of a side of the support to which the hydrophilic layer is provided or the opposite side thereof. The configuration in which the antistatic layer is provided between the support and the hydrophilic layer may contribute to an improvement in adhesive property to the hydrophilic layer. Examples of the antistatic layer include a polymer layer in which metallic oxide fine particles and a matting agent are dispersed as described in JP-A No. 2002-79772.

The support preferably has a centerline average roughness of 0.10 to 1.2 μm. In the range above, excellent adhesiveness to the image recording layer, favorable printing durability, and superior staining resistance can be obtained.

The thickness of the support is preferably from 0.1 to 0.6 mm, and is more preferably from 0.15 to 0.4 mm.

Back Coat Layer

A back coat layer may be provided on the back surface of the support as necessary after surface treatment of the support or after formation of an undercoat layer described in the following.

Preferable examples the material for the back coat layer include the organic polymer compounds described in JP-A No. 5-45885 and the coating layers of a metal oxide generated by hydrolysis and polycondensation of an organic or inorganic metal compound described in JP-A No. 6-35174. Among them, alkoxy compounds of silicon such as $Si(OCH_3)_4$, $Si(OC_2H_5)_4$, $Si(OC_3H_7)_4$, or $Si(OC_4H_9)_4$ are preferable in the point of its low cost and easy availability.

Undercoat Layer

An undercoat layer may be provided between the image recording layer and the support in the planographic printing plate precursor according to the invention as necessary.

The undercoat layer facilitates separation of unexposed portions of the image recording layer from the support, leading to improved on-press developability. Further, the undercoat layer, which functions as a heat-insulating layer, prohibits the heat generated by exposure to infrared laser radiation from diffusing into the support, and thus allows efficient use of the heat. Therefore, there is an advantage in that the sensitivity can be improved.

Specifically, preferable examples of the compound for forming the undercoat layer include a silane-coupling agent having an addition-polymerizable ethylenic double-bond reactive group such as those described in JP-A No. 10-282679, and a phosphorus compound having an ethylenic double-bond reactive group such as those described in JP-A No. 2-304441.

More preferable examples of the compound for forming the undercoat layer include a polymer resin having a polymer resin having an adsorptive group, a hydrophilic group, and a crosslinking group. The polymer resin is preferably formed by copolymerizing an adsorptive group-containing monomer, a hydrophilic group-containing monomer, and a crosslinking group-containing monomer.

The polymer resin for forming the undercoat layer preferably has a group that can be adsorbed on the hydrophilic support surface. Examples of the method to determine if the polymer resin has a property to adsorb onto the hydrophilic surface of the support include the following method.

A test compound is dissolved in a good solvent to form a coating liquid, and the coating liquid is applied on a support and dried to give a coating amount of 30 $mg/m^2$ after drying. Then, the support coated with the test compound is washed sufficiently with a good solvent, and the amount of the test compound remaining on the support (the test compound that was not washed away) is determined, from which the amount of the test compound adsorbed on the support is calculated. The residual amount may be determined directly from the measurement of the amount of the remaining compound, or alternatively, indirectly from quantitative measurement of the amount of the test compound dissolved in the washing solution. The quantitative determination of the compound may be performed, for example, by fluorescent X-ray analysis, reflection spectroscopic absorbance measurement, liquid chromatography measurement, or the like. Herein, the term "compound that can be adsorbed on the support" refers to a compound that remains in an amount of at least 1 $mg/m^2$ after the washing described above.

The adsorptive group that is adsorptive to the hydrophilic support surface is a functional group that can form a chemical bond (e.g., an ionic bond, a hydrogen bond, a coordination bond, or a bond based on intermolecular force) with a substance (e.g., metal or metal oxide) or a functional group (e.g., a hydroxyl group) present on the hydrophilic support surface. The adsorptive group is preferably an acidic group or a cationic group.

The acidic group preferably has an acid dissociation constant (pKa) of 7 or less, Examples of the acidic group include a phenolic hydroxyl group, a carboxyl group, $—SO_3H$, $—OSO_3H$, $—PO_3H_2$, $—OPO_3H_2$, $—CONHSO_2—$, $—SO_2NHSO_2—$ and $—COCH_2COCH_3$. Among these, $—OPO_3H_2$ and $—PO_3H_2$ are particularly preferable. The acidic group may be in a form of a metal salt.

The cationic group is preferably an onium group. Examples of the onium group include an ammonium group, a phosphonium group, an arsonium group, a stibonium group, an oxonium group, a sulfonium group, a selenonium group, a stannonium group, and a iodonium group. Among these, an ammonium group, a phosphonium group, and a sulfonium groups are preferable; an ammonium group and a phosphonium group are more preferable; and an ammonium group is most preferable.

Particularly preferable examples of the adsorptive group-containing monomer used for synthesizing the polymer resin used for forming the under coat layer include a compound represented by the following Formula (U1) or (U2).

Formula (U1)

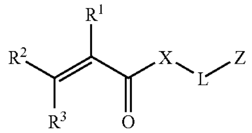

Formula (U2)

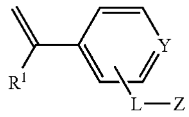

In Formulae (U1) and (U2), $R^1$, $R^2$ and $R^3$ each independently represent a hydrogen atom, a halogen atom, or an alkyl group having 1 to 6 carbon atoms. It is preferable that $R^1$, $R^2$ and $R^3$ each independently represent a hydrogen atom or an alkyl group having 1 to 6 carbon atoms, more preferably a hydrogen atom or an alkyl group having 1 to 3 carbon atoms, and is particularly preferably a hydrogen atom or a methyl group. $R^2$ and $R^3$ are each particularly preferably a hydrogen atom.

Z represents the adsorptive group which is adsorptive to the hydrophilic surface of the support as described above.

In Formulae (U1) and (U2), L represents a single bond or a divalent connecting group.

L is preferably a divalent aliphatic group (such as an alkylene group, a substituted alkylene group, an alkenylene group, a substituted alkenylene group, an alkynylene group, or a substituted alkynylene group), a divalent aromatic group (such as an arylene group or a substituted arylene group), a divalent heterocyclic group, or a combination of one or more of the forementioned divalent connecting groups with an oxygen atom (—O—), a sulfur atom (—S—), an imino group (—NH—), a substituted imino group (—NR—, wherein R represents an aliphatic group, an aromatic group or a heterocyclic group) or a carbonyl group (—CO—).

The divalent aliphatic group may have a cyclic or branched structure. The number of the carbon atoms in the divalent aliphatic group is preferably from 1 to 20, more preferably from 1 to 15, and is particularly preferably from 1 to 10. The divalent aliphatic group is more preferably a saturated aliphatic group rather than being an unsaturated aliphatic group. The divalent aliphatic group may have one or more substituents. Examples of the substituents include a halogen atom, a hydroxyl group, an aromatic group, and a heterocyclic group.

The number of the carbon atoms of the divalent aromatic group is preferably from 6 to 20, more preferably from 6 to 15, and is particularly preferably from 6 to 10. The divalent aromatic group may have one or more substituents. Examples of the substituents include a halogen atom, a hydroxyl group, an aliphatic group, an aromatic group, and a heterocyclic group.

The divalent heterocyclic group preferably has a five- or six-membered heterocyclic ring. The divalent heterocyclic ring may be fused with another heterocyclic ring, an aliphatic ring or an aromatic ring. The heterocyclic group may have one or more substituents. Examples of the substituents include a halogen atom, a hydroxyl group, an oxo group (=O), a thioxo group (=S), an imino group (=NH), a substituted imino group (=N—R, wherein R represents an aliphatic group, an aromatic group or a heterocyclic group), an aliphatic group, an aromatic group and a heterocyclic group.

L is preferably a divalent connecting group containing multiple polyoxyalkylene structures. The polyoxyalkylene structure is more preferably a polyoxyethylene structure. In other words, L preferably contains $—(OCH_2CH_2)_n—$ (n represents an integer from 2 or greater).

In Formula (U1), X represents an oxygen atom (—O—) or an imino group (—NH—). X is preferably an oxygen atom.

In Formula (U2), Y represents a carbon atom or a nitrogen atom. When Y is a nitrogen atom and L binds to Y to form a quaternary pyridinium group, the quaternary pyridinium group is adsorptive by itself. In this case, it is not essential for Z to be the absorptive functional group, and Z may be a hydrogen atom.

Hereinafter, specific examples of the monomer represented by Formula (U1) or (U2) will be listed.

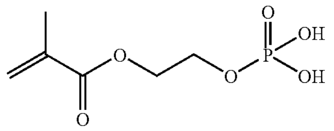

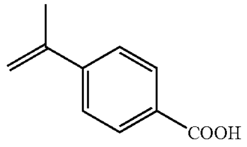

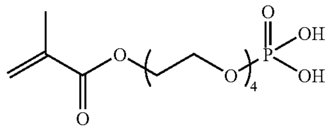

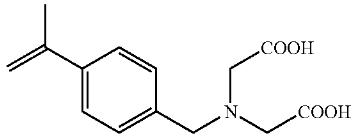

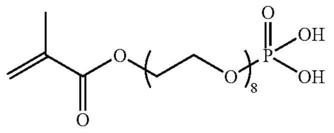

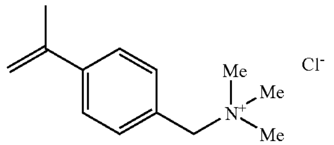

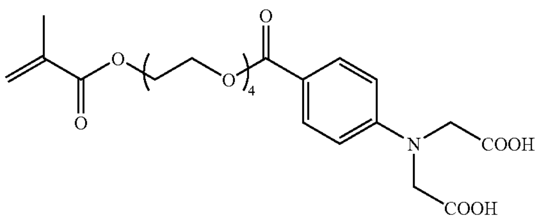

-continued

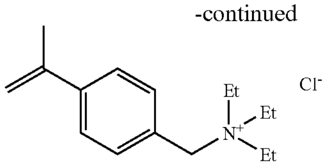

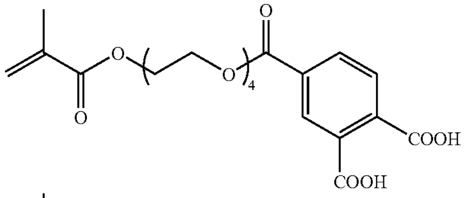

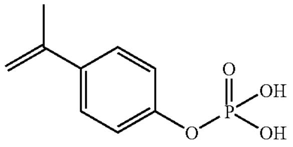

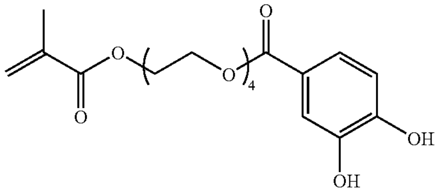

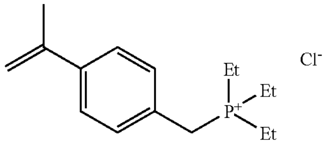

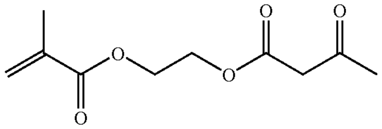

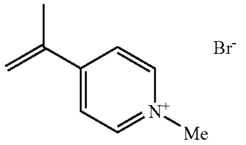

The polymer resin suitable as the compound for forming the undercoat layer preferably has a hydrophilic group. Preferable examples of the hydrophilic group include a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group, and a phosphoric acid group. Among these, a sulfonic acid group, which has a high hydrophilicity, is more preferable as the hydrophilic group.

Specific examples of the monomer having a sulfonic acid group include sodium salts and amine salts of methallyloxybenzenesulfonic acid, allyloxybenzenesulfonic acid, allylsulfonic acid, vinylsulfonic acid, para-styrenesulfonic acid, methallylsulfonic acid, acrylamide tert-butylsulfonic acid, 2-acrylamide-2-methylpropanesulfonic acid or (3-acryloyloxypropyl)butylsulfonic acid. Among them, sodium 2-acrylamide-2-methylpropanesulfonate is preferable in view of hydrophilic ability and handling of synthesis.

These are appropriately used in synthesizing polymer resin suitable as the compound for forming the under coat layer.

The polymer resin for forming the undercoat layer used in the invention preferably has a crosslinking group. The presence of a crosslinking group improves adhesiveness to the image portion. Examples of the method for imparting crosslinking property to the polymer resin for forming the undercoat layer include: a method of introducing a crosslinking functional group such as ethylenic unsaturated bond into side chains of the polymer; and a method of forming a salt structure between the polymer resin and a compound having an ethylenic unsaturated bond and a substituent with the opposite charge to the charge of the polar substituents on the polymer resin.

Examples of the polymer having an ethylenic unsaturated bond on its side chain include polymers of esters or amides of an acrylic acid or a methacrylic acid wherein an ester residue or an amide residue therein (R of —COOR or —CONHR) contains an ethylenic unsaturated bond.

Examples of the residues (R) having an ethylenic unsaturated bond include $-(CH_2)_nCR^1=CR^2R^3$, $-(CH_2O)_nCH_2CR^1=CR^2R^3$, $-(CH_2CH_2O)_nCH_2CR^1=CR^2R^3$, $-(CH_2)_nNH-CO-O-CH_2CR^1=CR^2R^3$, $-(CH_2)_n-O-CO-CR^1=CR^2R^3$, and $-(CH_2CH_2O)_2-X$ (wherein, $R^1$ to $R^3$ each independently represent a hydrogen atom, a halogen atom, an alkyl group, an aryl group, an alkoxy group, or an aryloxy group having 1 to 20 carbon atoms; $R^1$ and $R^2$ and/or $R^1$ and $R^3$ may bond to each other to form a ring; n represents an integer from 1 to 10; and X represents a dicyclopentadienyl residue).

Specific examples of the ester residue include $-CH_2CH=CH_2$ (described in JP-B No. 7-21633), $-CH_2CH_2O-CH_2CH=CH_2$, $-CH_2C(CH_3)=CH_2$, $-CH_2CH=CH-C_6H_5$, $-CH_2CH_2OCOCH=CH-C_6H_5$, $-CH_2CH_2NHCOO-CH_2CH=CH_2$, and $-CH_2CH_2O-X$ (wherein, X represents a dicyclopentadienyl residue).

Specific examples of the amide residue include $-CH_2CH=CH_2$, $-CH_2CH_2O-Y$ (wherein, Y represents a cylcohexene residue), and $-CH_2CH_2OCO-CH=CH_2$.

The crosslinking group-containing monomer for the polymer resin for forming the undercoat layer is preferably an ester or an amide of an acrylic acid or a methacrylic acid having the crosslinking group.

The content of the crosslinking group in the polymer resin for forming the undercoat layer (the content of radical polymerizable unsaturated double bonds as determined by iodine titration) is preferably from 0.1 to 10.0 mmol, more preferably from 1.0 to 7.0 mmol, and is particularly preferably from 2.0 to 5.5 mmol, per 1 g of the polymer resin. In the range above, favorable sensitivity and staining resistance can be obtained at the same time, and satisfactory storage stability can also be achieved.

The weight-average molecular weight of the polymer resin for forming the undercoat layer is preferably 5,000 or more, and is more preferably 10,000 to 300,000. The number-average molecular weight of the polymer resin for forming the undercoat layer is preferably 1,000 or more, and is more preferably from 2,000 to 250,000. The polydispersity (the weight-average molecular weight/the number-average molecular weight) is preferably from 1.1 to 10.

The polymer resin for forming the undercoat layer may be a random polymer, a block polymer, a graft polymer, or the like, and is preferably a random polymer.

Only one polymer resin for forming the undercoat layer may be used as the polymer resin for forming the undercoat layer, or alternatively, a combination of two or more polymer resin may be used in the invention.

A coating liquid for forming the undercoat layer can be formed by dissolving the polymer resin for forming the undercoat layer to an organic solvent such as methanol, ethanol, acetone, methylethylketone or the like and/or water.

The coating liquid for forming the undercoat layer may further contain an infrared absorbing agent.

Various conventionally-known methods can be performed to apply the coating liquid for forming the undercoat layer onto the support. Examples thereof include bar coater coating, spin coating, spray coating, curtain coating, dip coating, air knife coating, blade coating, and roll coating.

The amount of the undercoat layer coated (solid content) is preferably from 0.1 to 100 mg/$m^2$, and is more preferably from 1 to 30 mg/$m^2$.

Printing Method

Hereinafter, a printing method using the planographic printing plate precursor of the invention is described in view of the case where the image recording layer has on-press developability.

The printing method of the invention includes at least: imagewise exposing and mounting the planographic printing plate precursor of the invention; supplying printing ink and dampening water to the exposed planographic printing plate precursor; and printing, wherein a planographic printing plate which enables the printing is formed upon starting the printing, by removing an unexposed portion of the image recording layer without conducting a specific development process.

Hereinafter, the printing method of the invention is described in detail.

A laser is preferable as a light source used for imagewise exposure in the printing method of the invention. The laser used in the invention is not particularly limited, while preferable examples thereof include a solid laser and a semiconductor laser for irradiating infrared rays with a wavelength of 760 to 1,200 nm, and a semiconductor laser for irradiating light with a wavelength of 250 to 420 nm.

It is preferable that the infrared laser has an output of 100 mW or more, the exposure time per picture element therewith is within 20 microseconds, and the amount of irradiation energy provided thereby is 10 to 300 mJ/$cm^2$. It is preferable that the semiconductor laser for irradiating light with a wavelength of 250 to 420 nm has an output of 0.1 mW or more. In either of the lasers, a multi-beam laser device is preferably used for shortening exposure time.

The exposed planographic printing plate precursor is mounted on a printing cylinder of a printing press. In the case where the printing press is a printing press having a laser exposure device, the planographic printing plate precursor can be firstly mounted on a printing cylinder of the printing press and thereafter subjected to imagewise exposure.

When a planographic printing plate precursor is used for printing with supplied dampening water and printing ink after being imagewise exposed to laser radiation without undergoing a development process such as a wet development, an exposed portion in the image recording layer is cured to form a region having a lipophilic surface to receive the printing ink. On the other hand, an unexposed portion in the image recording layer is uncured and is removed by being dissolved or dispersed in the supplied dampening water and/or the printing ink so that a hydrophilic surface is exposed in a region corresponding to the removed unexposed portion. As a result, the dampening water adheres to the thus revealed hydrophilic surface, while the printing ink adheres to the image recording layer in the exposed portion, allowing initiation of printing.

Either the dampening water or the printing ink may be firstly supplied to the printing surface of the thus-formed printing plate, while it is preferable to supply the printing ink first in view of preventing contaminations of the dampening water with the image recording layer in the unexposed portion. Generally-used damping water and printing ink for planographic printing may be used respectively as the dampening water and the printing ink.

In this way, the planographic printing plate precursor is developed on an offset printing press, and is used for printing of multiple sheets of paper.

In an embodiment in which the planographic printing plate precursor of the invention does not have the on-press developability and needs a development treatment such as a wet development treatment, a development treatment is carried out between the exposure and the printing.

While the development treatment used in the invention is determined depending on the image recording layer, the planographic printing plate precursor of the invention is preferably subjected to the development process shown below.

Development

A developing solution which can be preferably used in the invention is an aqueous solution with the pH of 2 to 10. For example, the developing solution is preferably water alone or a water-based aqueous solution (containing 60 mass % or more water), and is particularly preferably an aqueous solution having a similar composition to that of generally known dampening water, an aqueous solution containing a surfactant (anionic, nonionic, cationic or the like) or an aqueous solution containing a water-soluble polymer compound. Particularly, an aqueous solution containing both a surfactant and a water-soluble polymer compound is preferable. The pH of the developing solution is more preferably 3 to 8, and is still more preferably 4 to 6.9, which is in a weakly acidic range.

Hereinafter, the components that may be contained in the developing solution are described in more detail.

Examples of the anionic surfactant used in the developing solution include aliphatic acid salts, abietic acid salts, hydroxyalkanesulfonic acid salts, alkanesulfonic acid salts, dialkyl sulfoscuccinate salts, straight-chain alkylbenzenesulfonic acid salts, branched-chain alkylbenzenesulfonic acid salts, alkylnaphthalenesulfonic acid salts, alkylphenoxypolyoxyethylene propylsulfonic acid salts, polyoxyethylene alkylsulfophenylether salts, N-methyl-N-oleyltaurine sodium salt, N-alkyl-sulfosuccinic monoamide disodium salts, petroleum sulfonate salt, sulfonated castor oil, sulfated beef tallow oil, sulfate ester salts of an aliphatic acid alkyl ester, alkyl sulfate ester salts, polyoxyethylene alkylether sulfate ester salts, aliphatic acid monoglyceride sulfate ester salts, polyoxyethylene alkylphenylether sulfate ester salts, polyoxyethylene styrylphenylether sulfate ester salts, alkylphosphoric ester salts, polyoxyethylene alkylether phosphoric ester salts, polyoxyethylene alkylphenylether phosphoric ester salts, partially saponified products of styrene/maleic anhydride copolymers, partially saponified products of olefin/maleic anhydride copolymers, and naphthalenesulfonic salt-formalin condensates.

The cationic surfactant used in the invention is not particularly limited, and any one of known cationic surfactants may be used. Examples thereof include alkylamine salts, quaternary ammonium salts, polyoxyethylene alkylamine salts, and polyethylene polyamine compounds.

Examples of the nonionic surfactant used in the developing solution include polyethylene glycol-type higher alcohol-ethylene oxide adducts, alkylene phenol-ethylene oxide adducts, aliphatic acid-ethylene oxide adducts, polyhydric alcohol-aliphatic acid ester-ethylene oxide adducts, higher alkyl amine-ethylene oxide adducts, aliphatic acid amide-ethylene oxide adducts, ethylene oxide adducts of fats and oils, polypropylene glycol-ethylene oxide adducts, dimethyl siloxane-ethylene oxide block copolymers, dimethyl siloxane-(propylene oxide-ethylene oxide) block copolymers, polyhydric alcohol-type glycerol aliphatic acid esters, pentaerythritol aliphatic acid esters, sorbitol and sorbitan aliphatic acid esters, sucrose aliphatic acid esters, polyhydric alcohol alkyl ethers and alkanol amine aliphatic acid amides.

These nonionic surfactants may be used singly or as a mixture of two or more thereof. In the invention, more preferable examples include sorbitol and/or sorbitan aliphatic acid ester-ethylene oxide adducts, polypropylene glycol-ethylene oxide adducts, dimethyl siloxane-ethylene oxide block copolymers, dimethyl siloxane-(propylene oxide-ethylene oxide) block copolymers, and polyhydric alcohol aliphatic acid esters.

From the viewpoint of solubility or turbidity in water, the nonionic surfactant used in the developing solution in the invention has an HLB (Hydrophile-Lipophile Balance) value of preferably 6 or more, which is more preferably 8 or more. The content of the nonionic surfactant in the developing solution is preferably 0.01 to 10% by mass, and is more preferably 0.01 to 5% by mass.

Acetylene glycol oxyethylene adducts, acetylene alcohol oxyethylene adducts, fluorine surfactants or silicon surfactants may also be similarly used.

In a particularly preferable example of the surfactant used in the developing solution in the invention, the nonionic surfactant is contained from the viewpoint of defoaming property.

Examples of the water-soluble polymer compound used in the developing solution in the invention include soybean polysaccharides, modified starch, gum arabic, dextrin, cellulose modified compounds (for example, carboxymethyl cellulose, carboxyethyl cellulose and methyl cellulose) and modified products thereof, pullulan, polyvinyl alcohol and modified compounds thereof, polyvinyl pyrrolidone, polyacrylamide and acrylamide copolymers, Vinyl methyl ether/maleic anhydride copolymers, vinyl acetate/maleic anhydride copolymers, and styrene/maleic anhydride copolymers.

The soybean polysaccharides may be those known in the art, such as a commercial product available under the trade name "SOYA FIVE" (manufactured by Fuji Oil Co., Ltd.), and soybean polysaccharides of various grades may be used. Preferable examples of the soybean polysaccharides include those having a viscosity in the range of 10 to 100 mPa/sec. when it is in a form of 10 mass % aqueous solution.

The modified starch used may be the known one and can be produced, for example, by a method of decomposing starch of corn, potato, tapioca, rice, or wheat with an acid or an enzyme under a condition in which 5 to 30 glucose residues are decomposed with one molecule of the acid or the enzyme and then adding oxypropylene to the product in an alkali.

A plurality of the water-soluble polymer compounds may be simultaneously used. The content of the water-soluble polymer compound in the developing solution is preferably 0.1 to 20% by mass, and is more preferably 0.5 to 10% by mass.

The developing solution which can be used in the invention may contain an organic solvent. Examples of the organic solvent that may be contained in the development solution include aliphatic hydrocarbons (hexane, heptane, "ISOPER E, H, G" (trade name, manufactured by Esso Chemical), gasoline, kerosene etc.), aromatic hydrocarbons (toluene, xylene etc.), halogenated hydrocarbons (methylene dichloride, ethylene dichloride, tricrene, monochlorobenzene etc.) and polar solvents.

Examples of the polar solvents include alcohols (methanol, ethanol, propanol, isopropanol, benzyl alcohol, ethylene glycol monomethyl ether, 2-ethoxy ethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol, methyl amyl alcohol etc.), ketones (acetone, methyl ethyl ketone, ethyl butyl ketone, methyl isobutyl ketone, cyclohexanone etc.), esters (ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, butyl levulinate etc.), and other solvents (triethyl phosphate, tricresyl phosphate, N-phenyl ethanol amine, N-phenyl diethanol amine etc.).

When the organic solvent is water-insoluble, it may be made water-soluble by using a surfactant or the like before utilization, and when an organic solvent is contained in the developing solution, the concentration of the solvent is desirably less than 40% by mass, from the viewpoint of safety and flammability.

The developing solution in the invention may further contain a preservative, a chelate compound, a defoaming agent, an organic acid, an inorganic acid, an inorganic salt etc. in addition to the components described above.

Preferable examples of the preservative include phenol and modified compounds thereof, formalin, imidazole modified compounds, sodium dehydroacetate, 4-isothiazolin-3-one modified compounds, benzoisothiazolin-3-one, benzotriazole modified compounds, amidine guanidine modified compounds, quaternary ammonium salts, modified compounds of pyridine, quinoline, guanidine or the like, diazine, triazole modified compounds, oxazole, oxazine modified compounds, and a nitrobromo alcohol such as 2-bromo-2-nitropropane-1,3-diol, 1,1-dibromo-1-nitro-2-ethanol or 1,1-dibromo-1-nitro-2-propanol.

Examples of the chelate compound include ethylenediaminetetraacetic acid, its potassium salt and its sodium salt; diethylenetriaminepentaacetic acid, its potassium salt and its sodium salt; triethylenetetraminehexaacetic acid, its potassium salt and its sodium salt; hydroxyethylethylenediaminetriacetic acid, its potassium salt and its sodium salt; nitrilotriacetic acid and its sodium salt; and organic phosphonic acids such as 1-hydroxyethane-1,1-diphosphonic acid, its potassium salt and its sodium salt and aminotri(methylenephosphonic acid), its potassium salt or its sodium salt, as well as phosphonoalkane tricarboxylic acids. In place of the sodium salts and potassium salts mentioned above, salts of organic amines are also effective as the chelate compound.

Examples of the defoaming agent that can be used in the invention include generally-known silicon-containing spontaneous emulsification compounds, emulsification compounds, and nonionic surfactants with an HLB of 5 or less. Among them, silicon-containing defoaming agents are preferable. Either compounds which work by emulsification-dispersing or compounds which work by solubilization among these can be used.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and organic phosphonic acid. The organic acid may also be used in the form of an alkali metal salt or ammonium salt thereof.

Examples of the inorganic acid and inorganic salt include phosphoric acid, metaphosphoric acid, monobasic ammonium phosphate, dibasic ammonium phosphate, sodium monobasic phosphate, sodium dibasic phosphate, potassium monobasic phosphate, potassium dibasic phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate.

The developing solution can be used as a developing solution or a replenishing development solution for the exposed planographic printing plate precursor, and is preferably applied to automatic developing machines described in the followings. When the planographic printing plate precursor is developed in the automatic developing machine, the developing solution becomes deteriorated as the processing amount increases. Therefore, the processing ability may be recovered by adding a replenishing solution or using a fresh developing solution. This replenishing system is also preferably used in the invention.

The development with an aqueous solution at pH 2 to 10 in the invention can be preferably conducted with an automatic developing machine provided with a means of feeding a developing solution and with a rubbing member. Examples of automatic developing machines include automatic developing machines performing rubbing treatment of a planographic printing plate precursor after image recording and simultaneously delivering the precursor as described in JP-A No. 2-220061 and JP-A No. 60-59351 and automatic developing machines performing rubbing treatment, after image recording, of a planographic printing plate precursor set on a cylinder by rotating the cylinder as described in U.S. Pat. Nos. 5,148,746 and 5,568,768 and British Patent No. 2297719. Among them, automatic developing machines using rotating brush rollers as the rubbing member are particularly preferable.

The rotating brush rollers which can be preferably used in the invention can be suitably selected upon taking into consideration their ability to prevent marring an image portion, the rigidity of a support of the planographic printing plate precursor, and the like. Examples of the rotating brush rollers include known brush rollers formed by implanting a brush material to plastic or metallic rollers. Examples of brush rollers that can be used in the invention include brush rollers wherein a metallic or plastic grooved material having a linearly implanted brush material is wound closely and radially around a plastic or metallic roller as a core, as described in JP-A No. 58-159533, JP-A No. 3-100554, and Japanese Utility Model Application Publication (JP-Y) No. 62-167253.

The brush material that can be used in the invention include plastic fibers (for example, synthetic fibers including polyesters such as polyethylene terephthalate or polybutylene terephthalate, polyamides such as nylon 6.6 or nylon 6.10, polyacryls such as polyacrylonitrile or poly(alkyl(meth)acrylates), and polyolefins such as polypropylene or polystyrene). For example, a blush material having a fiber hair diameter of 20 to 400 μm and a hair length of 5 to 30 mm can be preferably used.

The outer diameter of the rotating brush roller is preferably 30 to 200 mm, and the circumferential velocity of the brush roller end rubbing the surface of a plate is preferably 0.1 to 5 m/sec.

The rotating direction of the rotating brush roller used in the invention may be the same direction as, or an opposite direction to, the delivery direction of the planographic printing plate precursor of the invention, while in the case where an automatic developing machine using two or more rotating brush rollers is used, it is preferable that at least one of the rotating brush rollers is rotated in the same direction as the delivery direction and at least one of the rotating brush rollers is rotated in an opposite direction to the delivery direction. By so doing, removal of the image recording layer in a non-image portion can further be secured. It is also effective to swing the rotating brush roller in the direction of the rotation axis of the brush roller.

The temperature of the developing solution in development treatment can be arbitrarily set, while it is preferably 10 to 50° C.

Subsequently, the water washing, drying treatment and desmutting treatment of the planographic printing plate precursor after rubbing treatment may be arbitrarily conducted in the invention. In the desmutting treatment, a known desmutting solution may be used.

During a print-making process using the planographic printing plate precursor of the invention, the entire surface of the precursor may be arbitrarily heated before the exposure, during the exposure, and from the start of exposure to the start of the development. If such heating is conducted, the image forming reaction in the image recording layer may be enhanced to provide advantages such as improvements in sensitivity and printing durability and stable sensitivity. For the purpose of improving image strength and printing durability, it is also effective to conduct post-heating of the entire surface or exposure of the entire surface of the images after development. In general, it is preferable that heating before the development is conducted under mild conditions at 150° C. or less. Too high temperature may raise problems such as fogging on non-image areas. In heating after development, significantly severe conditions may be employed. Usually, heating is conducted at a temperature in the range of 200 to 500° C. If a heating temperature after development is low, a sufficient image strengthening action may not be achieved. On the contrary, if a heating temperature is too high, problems such as a deteriorated support and thermal decomposition in image areas may occur.

The planographic printing plate obtained through the foregoing development treatment is mounted on an offset printing press and used for printing a large number of sheets.

When printing is conducted, a conventionally-known plate cleaner for PS plates can be used to remove stains on the plate. Examples of the plate cleaner for PS plates include CL-1, CL-2, CP, CN-4, CN, CG-1, PC-1, SR and IC (all trade names, manufactured by Fujifilm Corporation).

EXAMPLES

Hereinafter, the present invention is described in detail by way of Examples, while the Examples should not be construed as limiting the invention.

Synthesis Example 1

Synthesis of Specific Polymer Compound (P-1)

160.01 g of 1-methoxy-2-propanol was introduced into a 500-ml flask equipped with a condenser and a stirrer, and then heated to 70° C. under nitrogen stream.

A solution containing 94.11 g of diethylene glycol monomethyl ether, 43.05 g of methacrylic acid and 2.303 g of a polymerization initiator (trade name: V-601, manufactured by Wako Pure Chemical Industries, Ltd.) in the 160.01 g 1-methoxy-2-propanol was added dropwise thereto over 2.5 hours. After the dropwise addition, the mixture was stirred for 2 hours at 70° C., then 1.151 g of V-601 was added, and the mixture was heated to 90° C. and further stirred for 2 hours. After the reaction solution was cooled to room temperature, 80 g of glycidyl methacrylate, 0.432 g of p-methoxyphenol, and 2.171 g of tetraethyl ammonium bromide were added to the reaction solution which was then heated again to 90° C. and stirred for 8 hours to give a specific polymer compound P-1.

The weight-average molecular weight of the resulting specific polymer compound P-1, as determined by gel permeation chromatography (GPC) with polystyrene as a standard substance, was 100,000, and it was thus confirmed that polymerization was properly conducted. As a result of oxidation titration, it was confirmed that no carboxyl group had remained in the resulting specific polymer compound P-1. It was also confirmed by NMR spectrum that methacryl groups had been introduced into side chains of the resulting specific polymer compound P-1 by polymer reaction.

Synthesis Example 2

Synthesis of Specific Polymer Compound (P-2)

156.28 g of 1-methoxy-2-propanol was introduced into a 500-mil flask equipped with a condenser and a stirrer, and then heated to 70° C. under nitrogen stream. A solution of 50.06 g of methyl methacrylate, 75.29 g diethylene glycol monomethyl ether, 8.61 g methacrylic acid and 1.382 g a polymerization initiator (trade name: V-601, manufactured by Wako Pure Chemical Industries, Ltd.) in the 156.28 g of 1-methoxy-2-propanol was added dropwise thereto over 2.5 hours. After the dropwise addition, the mixture was stirred for 2 hours at 70° C., then 1.151 g of V-601 was added, and the mixture was heated to 90° C. and further stirred for 2 hours. After the reaction solution was cooled to room temperature, 15.64 g of glycidyl methacrylate, 0.2992 g of p-methoxyphenol, and 1.496 g of tetraethyl ammonium bromide were added to the reaction solution which was then heated again to 90° C. and stirred for 8 hours to give a specific polymer compound P-2.

The weight-average molecular weight of the resulting specific polymer compound P-2, as determined by gel permeation chromatography (GPC) with polystyrene as a standard substance, was 200,000, and it was thus confirmed that polymerization was properly conducted. As a result of oxidation titration, it was confirmed that no carboxyl group had remained in the resulting specific polymer compound P-2.

Synthesis Examples 3 to 8

Synthesis of Specific Polymer Compounds (P-3 to P-8)

Specific polymer compounds P-3 to P-8 shown in the following Table 1 were synthesized in the same manner as the Synthesis Examples 1 and 2 except that the kinds and contained ratio of the of monomers used for the synthesises were varied.

The weight-average molecular weights of the resulting specific polymer compounds P-3 to P-8 were determined in the same manner as the Synthesis Examples 1 and 2.

The structures of the specific polymer compounds P-1 to P-8, comparative polymer compounds C-1 to C-3, and weight-average molecular weights thereof are shown in the following Tables 1 and 2. Each of the numerical values shown under the structural units in Tables 1 and 2 are a polymerization molar ratio of each of a structural unit shown above in the polymer compound.

TABLE 1

| Specific Polymer Compound | Composition of Synthesized Polymer Compound (mol %) | Weight-Average Molecular Weight |
|---|---|---|
| P-1 | 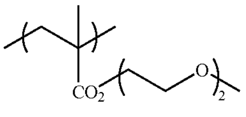 50 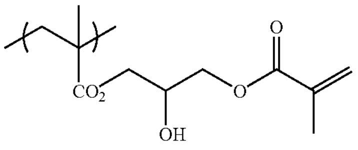 50 | 100,000 |
| P-2 | 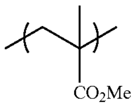 50 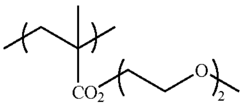 40 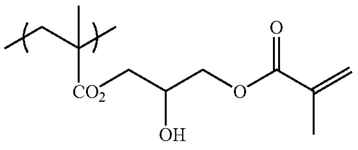 10 | 200,000 |
| P-3 | 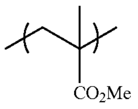 30 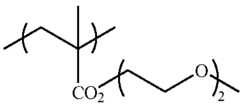 40 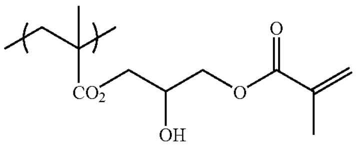 30 | 70,000 |

TABLE 1-continued
| Specific Polymer Compound | Composition of Synthesized Polymer Compound (mol %) | Weight-Average Molecular Weight |
|---|---|---|
| P-4 | 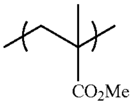 50 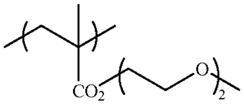 40 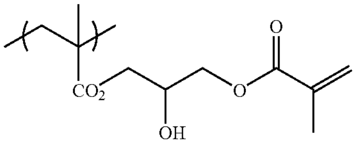 10 | 30,000 |
| P-5 | 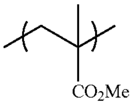 50 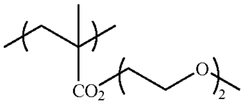 40 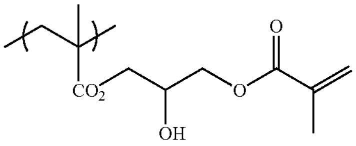 10 | 70,000 |
| P-6 | 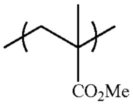 50 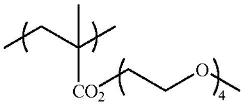 40 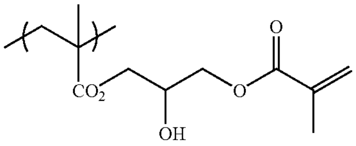 10 | 80,000 |
| P-7 | 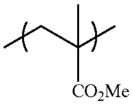 50 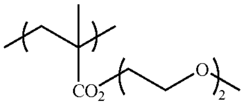 40 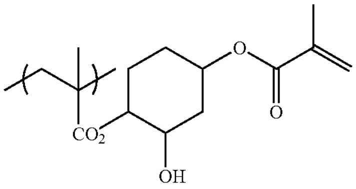 10 | 95,000 |
| P-8 | 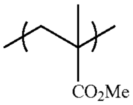 50 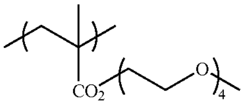 40 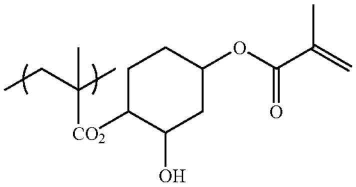 10 | 105,000 |
TABLE 2
| Comparative Polymer Compound | Composition of Synthesized Polymer Compound (mol %) | Weight-Average Molecular Weight |
|---|---|---|
| C-1 | 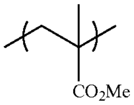 60 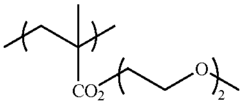 40 | 100,000 |
| C-2 | 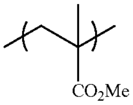 50 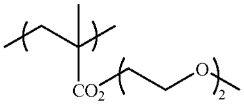 40 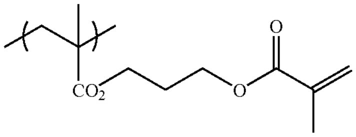 10 | 85,000 |

TABLE 2-continued

| Comparative Polymer Compound | Composition of Synthesized Polymer Compound (mol %) | Weight-Average Molecular Weight |
|---|---|---|
| C-3 | 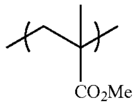 90 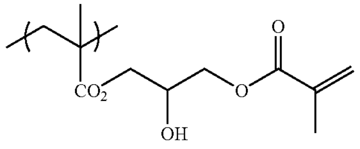 10 | 100,000 |

Examples 1 to 16 and Comparative Examples 1 to 5

1. Preparation of Planographic Printing Plate Precursor

(1) Preparation of Aluminum Support

An aluminum plate containing 99.50 wt % or more of Al; 0.25 wt % of Si; 0.40 wt % of Fe; 0.05 wt % of Cu; 0.05 wt % of Mn; 0.05 wt % of Mg; 0.05 wt % of Zn; and 0.03 wt % of Ti and having a thickness of 0.3 mm was degreased with aqueous 10 wt % sodium aluminate solution for removal of surface rolling oil at 50° C. for 30 seconds, and the aluminum surface was grained with three bundle nylon brushes having a bristle diameter of 0.3 mm by using an aqueous suspension of pumice containing pumice particles with a median diameter of 25 μm (specific density: 1.1 g/$cm^3$), followed by sufficient washing with water. The plate was immersed and etched in an aqueous 25 wt % sodium hydroxide solution at 45° C. for 9 seconds, washed with water, and then, immersed in 20 wt % nitric acid at 60° C. for 20 seconds and washed with water. The amount of etching on the grained surface was approximately 3 g/$m^2$.

The plate was subjected to continuous electrochemical surface roughening treatment with an alternating voltage of 60 Hz. The electrolytic solution used was 1 wt % aqueous nitric acid solution (containing 0.5 wt % of aluminum ion) at a temperature of 50° C. The electrochemical surface roughening treatment was carried out with a carbon electrode as a counter electrode, using a trapezoid rectangular wave alternating current wherein the time TP required for the electric current to change from 0 to the peak value was 0.8 msec and the duty ratio was 1:1. Ferrite was used as an assistant anode. The current density was 30 A/$dm^2$ in terms of the electric current peak value, and 5% of the electric current from the power source was distributed to the assistant anode.

During the electrolysis with nitric acid, the quantity of electricity was 175 C/$dm^2$ in terms of quantity of electricity at the time the aluminum plate works as the anode. Thereafter, the plate was washed with sprayed water.

Then, the plate was subjected to electrochemical surface roughening in an electrolyte solution of aqueous 0.5 wt % hydrochloric acid solution (containing aluminum ion at 0.5 wt %) at a liquid temperature of 50° C. under the condition of an electrical quantity of 50 C/$dm^2$ when the aluminum plate works as the anode, by a method similar to the nitric acid electrolysis described above. Then, the plate was washed with sprayed water.

A direct current anodic oxide film having a thickness of 2.5 g/$m^2$ was formed on the plate by using an electrolyte solution of 15 wt % sulfuric acid (containing 0.5 wt % of aluminum ion) at an electric current density of 15 A/$dm^2$, washed with water, and dried to obtain a support (1).

Preparation of Support A

For securing the hydrophilicity of the non-image region, the support (1) was subjected to silicate treatment with an aqueous solution of 1.5% by mass of No. 3 sodium silicate at 70° C. for 12 seconds. When the amount of Si was quantified by an X-ray fluorescence measuring instrument (trade name: PIX3000, manufactured by Rigaku Corporation), the amount of Si adhering to the support was 6 mg/$m^2$. Thereafter, the specimen was washed with water to give a support (2). The central line average roughness (Ra) of the support (2), as determined with a probe of 2 μm in diameter, was 0.51 μm.

An undercoat liquid for forming an undercoat layer having the following formulation was applied on the thus obtained support (2) so that a dry coating amount thereof become 8 mg/$m^2$ and the coated liquid was dried so as to form a support A to be used in the following experiments.

| Formulation of Undercoat liquid | |
|---|---|
| Compound (1) for forming undercoat layer | 0.017 g |
| Methanol | 9.00 g |
| Distilled water | 1.00 g |

Compound (1) for forming undercoat layer

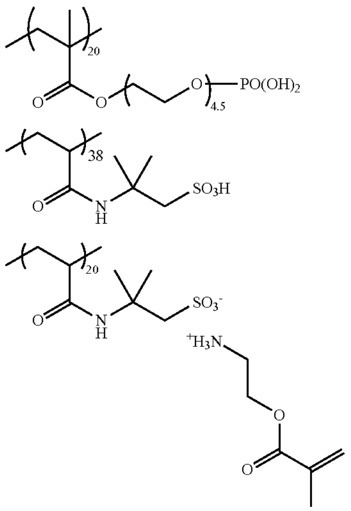

-continued

| Formulation of Undercoat liquid |
|---|

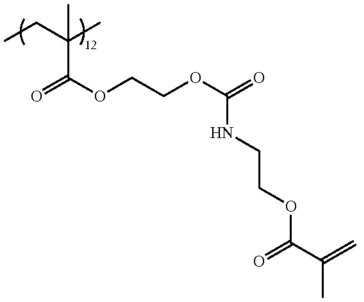

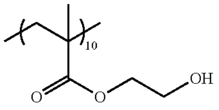

Preparation of Support B

For securing the hydrophilicity of the non-image region, the support (1) was subjected to silicate treatment with an aqueous solution of 2.5% by mass of No. 3 sodium silicate at 70° C. for 13 seconds. When the amount of Si was quantified by an X-ray fluorescence measuring instrument (trade name: PIX3000, manufactured by Rigaku Corporation), the amount of Si adhering to the support was 10 mg/m$^2$. Thereafter, the specimen was washed with water to give a support (3). The central line average roughness (Ra) of the support (3), as determined with a probe of 2 μm in diameter, was 0.51 μm.

The undercoat liquid for forming an undercoat layer was applied on the thus obtained support (3) so that a dry coating amount thereof become 8 mg/m$^2$ and the coated liquid was dried so as to form a support B to be used in the following experiments.

(3) Formation of Image Recording Layer

A coating liquid (1) for forming an image recording layer having the following formulation was bar-coated on the undercoat layer of any one of the support shown in the following Tables 3 and 4 and was dried in an oven at 100° C. for 60 seconds to form an image recording layer of any one of planographic printing plate precursors of Examples 1 to 16 and Comparative examples 1 to 5 having dry coating amount of 1.0 g/m$^2$.

The coating liquid (1) for forming an image recording layer was prepared by mixing a photosensitive liquid (1) and a microgel liquid (1) shown in the followings and stirring just before the coating thereof

| Formulation of Photosensitive liquid (1) | |
|---|---|
| Specific polymer compound or Comparative polymer compound shown in Tables 3 and 4 (in terms of solid content) | 0.162 g |
| Infrared ray absorbing agent shown below | 0.030 g |
| Polymerization initiator shown below | 0.162 g |
| Polymerizable compound (trade name: ARONIX M215, manufactured by Toa Gosei Co., Ltd.) | 0.385 g |
| PAIONIN A-20 (trade name, manufactured by Takemoto Oil & Fat Co., Ltd.) | 0.055 g |
| Sensitizer (1) shown below | 0.044 g |

-continued

| Formulation of Photosensitive liquid (1) | |
|---|---|
| Fluorine surfactant (1) shown below | 0.008 g |
| Methylethylketone | 1.091 g |
| 1-methoxy-2-propanol | 8.609 g |

Infrared absorbing agent (1)

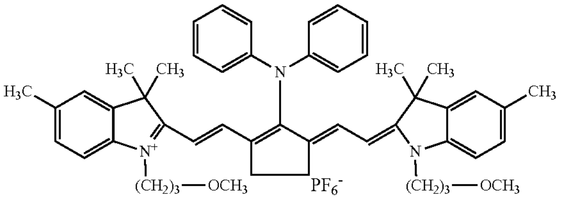

Polymerization initiator (1)

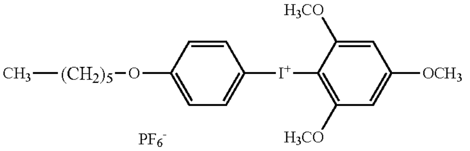

Sensitizer (1)

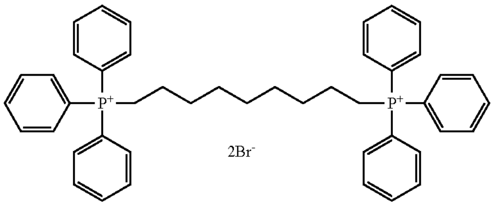

Fluorine surfactant (1)

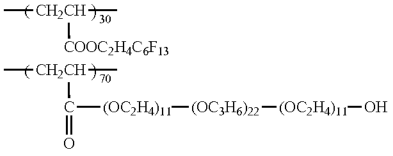

| Formulation of Microgel liquid (1) | |
|---|---|
| Microgel (1) prepared as shown below | 2.640 g |
| Distilled water | 2.425 g |

Synthesis of Microgel (1)

10 g of trimethylolpropane-xylene diisocyanate adduct (trade name: TAKENATE D-110N, manufactured by Mitsui Chemicals Polyurethanes, Inc.), 3.15 g of pentaerythritol tetraacrylate (trade name: SR444, manufactured by NIPPON KAYAKU Co., Ltd.) and 0.1 g of PAIONIN A-41C (trade name, manufactured by Takemoto Oil & Fat Co., Ltd.) as oil phase components were dissolved in 17 g of ethyl acetate. 40 g of an aqueous solution containing 4% by mass of PVA-205 was prepared as an aqueous phase. The oil phase components and the aqueous phase component were mixed and emulsified at 12,000 rpm for 10 minutes by using a homogenizer. The thus obtained emulsion was added to 25 g of distilled water and stirred at room temperature for 30 minutes, and further stirred at 50° C. for 3 hours. The microgel liquid thus obtained was diluted with water so that the solid content concentration thereof became 15% by mass. The average particle diameter of the thus obtained microcapsule was 0.2 μm.

Formation of Protective Layer

Subsequently, a coating liquid for forming a protective layer having the following formulation was subject to bar coating on each of the image recording layers, and thereafter to oven drying at temperature of 120° C. for 60 seconds to form an overcoat layer having a dry coating amount of 0.15 g/m$^2$.

Thus, planographic printing plate precursors of Examples 1 to 16 and Comparative Examples 1 to 5 were obtained.

| Formulation of Coating liquid for forming Protective layer | |
|---|---|
| Inorganic laminar compound dispersion (1) prepared as below | 1.5 g |
| Polyvinyl alcohol (6% by massof aqueous solution)<br>(trade name: CKS50, manufactured by The Nippon Synthetic Chemical Industry Co., Ltd.)<br>(saponification degree: 99 mol % or more, polymerization degree: 300) | 0.55 g |
| Polyvinyl alcohol (6% by massof aqueous solution)<br>(trade name: PVA-405, manufactured by Kuraray Co., Ltd.)<br>(saponification degree: 81.5 mol %, polymerization degree: 500) | 0.03 g |
| Surfactant (1% by massof aqueous solution)<br>(trade name: EMALEX710, manufactured by Nihon Emulsion Co., Ltd.) | 8.60 g |
| Ion-exchanged water | 6.0 g |

Preparation of Inorganic Laminar Compound Dispersion (1)

6.4 g of synthetic mica (trade name: SOMASIF ME-100, manufactured by CO-OP Chemical Co., Ltd.) was added to 193.6 g of ion-exchanged water and then dispersed with a homogenizer so that dispersed particles therein have an average diameter (laser scattering method) of 3 μm. The aspect ratio of the dispersed particle thus obtained was 100 or more.

2. Evaluation of Planographic Printing Plate Precursor

The resulting planographic printing plate precursor was exposed under the conditions of an external drum rotation speed of 1,000 rpm, a laser output of 70% and a resolution of 2,400 dpi by LUXEL PLATESETTER T-6000III (trade name, manufactured by Fujifilm Corporation) equipped with an infrared semiconductor laser. The exposed image contained a solid image and a 50% halftone chart of 20 μm dot FM screen.

The resulting exposed precursor was mounted on a printing body of a printing press LITHRONE 26 (trade name, manufactured by Komori Corporation) without subjecting the exposed precursor to development treatment. Dampening water consisting of ECOLITY-2 (trade name, manufactured by Fujifilm Corporation)/tap water=2/98 (volume ratio), and VALUES-G (N) black ink (trade name, manufactured by Dainippon Ink and Chemicals, Inc.) were supplied for on-press development by a standard automatic printing start method of the LITHRONE 26, and then 100 sheets of TOKUBISHI ART PAPER (trade name, manufactured by Mitsubishi Paper Mills Ltd., 76.5 kg/1,000 sheets) were printed at a printing speed of 10,000 prints/hour.

(A) Evaluation of on-Press Developability

Printing was conducted as described above, and the on-press development in the printing press was finished, and the number of printing papers required until the ink became untransferred onto the non-image portion in the machine was determined as an indicator of on-press developability. These results are shown in Tables 3 and 4.

(B) Evaluation of Printing Durability

After the on-press developability was evaluated, printing was further continued. Because the image recording layer gradually became worn as the number of prints was increased, the density of the ink on prints dropped. When the halftone-area ratio of FM screen 50% halftone dots, as determined by a Gretag densitometer, was found to be 5% less than the corresponding value of the 100th print, printing was terminated, and the number of sheets printed until then was determined to evaluate printing durability. The results thereof are shown in Tables 3 and 4.

(C) Evaluation of on-Press Developability after Time Lapse

The resulting planographic printing plate precursor was left for 3 days in a thermostatic humidistat bath set at 45° C. and 75% relative humidity, and then exposed and used in printing in the same manner as described above, to determine on-press developability.

As the number of printed sheets is nearer to the number of sheets printed in the machine with the unleft precursor as described in (A) above, the stability against time lapse can be judged to be excellent.

(D) Evaluation of Resistance to Scratching

The planographic printing plate precursor was exposed to light under the conditions described above, and the exposed portion of its solid image was scratched under various loads with a scratch tester having a rubber needle of 5.0 mm in diameter, and thereafter, on-press development was carried out under the conditions described above, and the maximum load under which the scratched portion did not cause a corresponding deficiency on the print was determined to evaluate scratch resistance.

TABLE 3

| | Support | Specific polymer compound | On-press developability (number of prints) | On-press developability after time lapse (number of prints) | Usual Printing Durability (1000 prints) | Scratch Resistance (g) |
|---|---|---|---|---|---|---|
| Example 1 | A | P-1 | 5 | 25 | 45 | 40 |
| Example 2 | A | P-2 | 5 | 35 | 75 | 50 |
| Example 3 | A | P-3 | 5 | 35 | 65 | 50 |
| Example 4 | A | P-4 | 5 | 15 | 55 | 50 |
| Example 5 | A | P-5 | 4 | 20 | 70 | 50 |
| Example 6 | A | P-6 | 5 | 25 | 50 | 50 |
| Example 7 | A | P-7 | 5 | 30 | 50 | 50 |
| Example 8 | A | P-8 | 5 | 30 | 50 | 50 |
| Example 9 | B | P-1 | 3 | 15 | 40 | 50 |
| Example 10 | B | P-2 | 3 | 25 | 70 | 50 |

TABLE 4

| | Support | Specific polymer compound | On-press developability (number of prints) | On-press developability after time lapse (number of prints) | Usual Printing Durability (1000 prints) | Scratch Resistance (g) |
|---|---|---|---|---|---|---|
| Example 11 | B | P-3 | 3 | 20 | 70 | 50 |
| Example 12 | B | P-4 | 3 | 10 | 60 | 50 |
| Example 13 | B | P-5 | 2 | 15 | 65 | 50 |
| Example 14 | B | P-6 | 3 | 25 | 45 | 50 |
| Example 15 | B | P-7 | 3 | 20 | 45 | 50 |
| Example 16 | B | P-8 | 3 | 20 | 45 | 50 |
| Comparative Example 1 | A | C-1 | 10 | 60 | 45 | 30 |
| Comparative Example 2 | A | C-2 | 13 | 70 | 60 | 50 |
| Comparative Example 3 | B | C-1 | 9 | 55 | 45 | 30 |
| Comparative Example 4 | B | C-2 | 13 | 70 | 60 | 50 |
| Comparative Example 5 | B | C-3 | 100 | poor development | 60 | 50 |

As is evident from Tables 3 and 4, it can be seen that the planographic printing plate precursors of Examples 1 to 16, as compared with the planographic printing plate precursors in Comparative Examples 1 to 5, maintain excellent printing durability, have excellent on-press developability and are excellent in temporal stability.

It can also be seen that the planographic printing plate precursors of Examples 1 to 16 exhibit certain scratch resistance with no correlation with the amount of Si atoms adhering to the surface of the support. It can also be seen that even if the amount of the Si atoms adhering to the surface of the support is higher than 8 mg/m$^2$, printing durability is not significantly lowered.

Examples 101 to 108 and Comparative Examples 101 to 102

1. Preparation of Planographic Printing Plate Precursor

(1) Preparation of Aluminum Support

An aluminum plate containing 99.50 wt % or more of Al; 0.25 wt % of Si; 0.40 wt % of Fe; 0.05 wt % of Cu; 0.05 wt % of Mn; 0.05 wt % of Mg; 0.05 wt % of Zn; and 0.03 wt % of Ti and having a thickness of 0.3 mm was degreased with aqueous 10 wt % sodium aluminate solution for removal of surface rolling oil at 50° C. for 30 seconds, and the aluminum surface was grained with three bundle nylon brushes having a bristle diameter of 0.3 mm by using an aqueous suspension of pumice containing pumice particles with a median diameter of 25 μm (specific density: 1.1 g/cm$^3$), followed by sufficient washing with water. The plate was immersed and etched in an aqueous 25 wt % sodium hydroxide solution at 45° C. for 9 seconds, washed with water, and then, immersed in 20 wt % nitric acid at 60° C. for 20 seconds and washed with water. The amount of etching on the grained surface was approximately 3 g/m$^2$.

The plate was subjected to continuous electrochemical surface roughening treatment with an alternating voltage of 60 Hz. The electrolytic solution used was 1 wt % aqueous nitric acid solution (containing 0.5 wt % of aluminum ion) at a temperature of 50° C. The electrochemical surface roughening treatment was carried out with a carbon electrode as a counter electrode, using a trapezoid rectangular wave alternating current wherein the time TP required for the electric current to change from 0 to the peak value was 0.8 msec and the duty ratio was 1:1. Ferrite was used as an assistant anode. The current density was 30 A/dm$^2$ in terms of the electric current peak value, and 5% of the electric current from the power source was distributed to the assistant anode.

During the electrolysis with nitric acid, the quantity of electricity was 175 C/dm$^2$ in terms of quantity of electricity at the time the aluminum plate works as the anode. Thereafter, the plate was washed with sprayed water.

Then, the plate was subjected to electrochemical surface roughening in an electrolyte solution of aqueous 0.5 wt % hydrochloric acid solution (containing aluminum ion at 0.5 wt %) at a liquid temperature of 50° C. under the condition of an electrical quantity of 50 C/dm$^2$ when the aluminum plate works as the anode, by a method similar to the nitric acid electrolysis described above. Then, the plate was washed with sprayed water.

For securing the hydrophilicity of the non-image region, the resultant was subjected to silicate treatment with an aqueous solution of 2.5% by mass of No. 3 sodium silicate at 70° C. for 12 seconds. The amount of Si adhering to the support was 10 mg/m$^2$. Thereafter, the specimen was washed with water to give a support (101). The central line average roughness (Ra) of the support (2), as determined with a probe of 2 μm in diameter, was 0.51 μm.

Formation of Undercoat Layer

An undercoat liquid (101) for forming an undercoat layer having the following formulation was applied on the thus obtained support (101) so that a dry coating amount thereof become 28 mg/m$^2$.

| Formulation of Undercoat liquid (101) | |
|---|---|
| Compound (1) for forming undercoat layer | 0.18 g |
| Hydroxyethylimmino diacetate | 0.10 g |
| Methanol | 55.24 g |
| Water | 6.15 g |

Compound (1) for forming undercoat layer

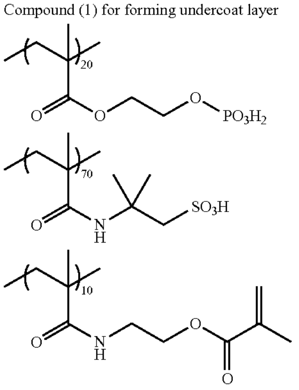

(3) Formation of Image Recording Layer

A coating liquid (101) for forming an image recording layer having the following formulation was bar-coated on the undercoat layer and was dried in an oven at 100° C. for 60 seconds to form an image recording layer of any one of planographic printing plate precursors of Examples 101 to 108 and Comparative examples 101 to 102 having dry coating amount of 1.0 g/$m^2$.

The coating liquid (101) for forming an image recording layer was prepared by mixing a photosensitive liquid (101) and a microgel liquid (101) shown in the followings and stirring just before the coating thereof.

| Formulation of Photosensitive liquid (101) | |
|---|---|
| Specific polymer compound or Comparative polymer compound shown in Table 5 (in terms of solid content) | |
| Infrared ray absorbing agent (1) shown below | 0.030 g |
| Polymerization initiator shown below | 0.162 g |
| Polymerizable compound (trade name: NK ESTER A-9300, manufactured by Shin-Nakamura Chemical Co., Ltd.) | 0.192 g |
| Low-molecular hydrophilic compound (tris(2-hydroxyethyl)isocyanurate) | 0.062 g |
| Low-molecular hydrophilic compound (1) shown below | 0.050 g |
| Sensitizer (1) (phosphonium compound shown below) | 0.055 g |
| Sensitizer ($PF_6$ salt of benzyl-dimethyl-octyl ammonium) | 0.018 g |
| Trimethylglycine | 0.01 g |
| Fluorine surfactant (1) (phosphonium compound shown below) | 0.008 g |
| Methylethylketone | 1.091 g |
| 1-methoxy-2-propanol | 8.609 g |

| Formulation of Microgel liquid (101) | |
|---|---|
| Microgel (1) prepared as described above | 2.640 g |
| Distilled water | 2.425 g |

Infrared absorbing agent (1)

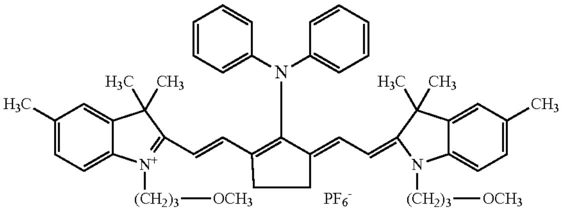

-continued

Polymerization initiator (1)

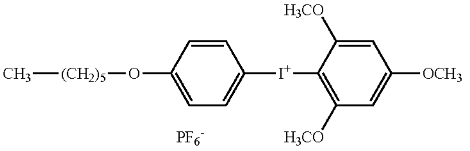

Fluorine surfactant (1)

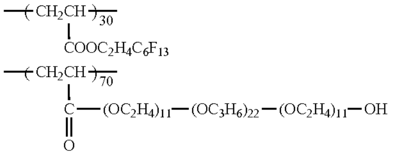

Phosphonium compound (1)

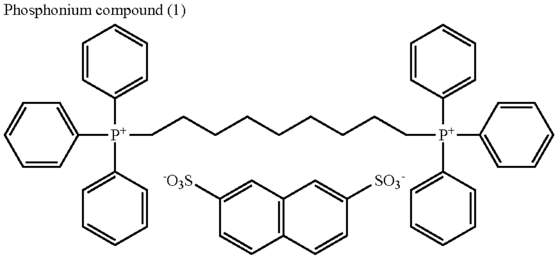

Low-molecular hydrophilic compound (1)

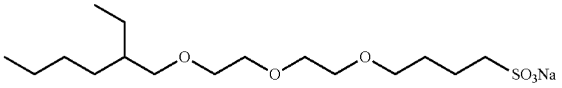

Formation of Protective Layer

Subsequently, the coating liquid for forming a protective layer as described was subject to bar coating on each of the image recording layers, and thereafter to oven drying at temperature of 120° C. for 60 seconds to form an overcoat layer having a dry coating amount of 0.15 g/$m^2$.

Thus, planographic printing plate precursors of Examples 101 to 108 and Comparative examples 101 to 102 were obtained.

2. Evaluation of Planographic Printing Plate Precursor

Each of the resulting planographic printing plate precursors was subjected to tests for evaluating (A) on-press developability, (B) printing durabilitym (C) on-press developability after time lapse, and (D) resistance to scratching in similar manners as described above. Results thereof are shown in the following Table 5.

TABLE 5

| | Support | Specific polymer compound (content) | On-press developability (number of prints) | On-press developability after time lapse (number of prints) | Usual Printing Durability (1000 prints) | Scratch Resistance (g) |
|---|---|---|---|---|---|---|
| Example 101 | 101 | P-1 (0.165 g) | 3 | 7 | 60 | 40 |
| Example 102 | 101 | P-2 (0.165 g) | 3 | 7 | 70 | 50 |
| Example 103 | 101 | P-3 (0.165 g) | 3 | 8 | 60 | 50 |
| Example 104 | 101 | P-4 (0.165 g) | 3 | 8 | 70 | 50 |
| Example 105 | 101 | P-5 (0.165 g) | 4 | 5 | 60 | 50 |
| Example 106 | 101 | P-6 (0.165 g) | 3 | 8 | 60 | 50 |
| Example 107 | 101 | P-7 (0.186 g) | 4 | 6 | 50 | 50 |
| Example 108 | 101 | P-8 (0.225 g) | 3 | 6 | 80 | 50 |
| Comparative Example 101 | 101 | C-1 (0.165 g) | 9 | 16 | 50 | 30 |
| Comparative Example 102 | 101 | C-2 (0.165 g) | 10 | 25 | 50 | 30 |

Examples 201 to 208 and Comparative Examples 201 to 202

1. Preparation of Planographic Printing Plate Precursor

Planographic printing plate precursors of Examples 201 to 208 and Comparative examples 201 to 202 were prepared in the same manner as Examples 101 to 108 and Comparative examples 101 to 102, except that a coating liquid (201) having the following formulation was used in place of the coating liquid (101).

2. Evaluation of Planographic Printing Plate Precursor

Each of the resulting planographic printing plate precursors was subjected to tests for evaluating (A) on-press developability, (B) printing durabilitym (C) on-press developability after time lapse, and (D) resistance to scratching in similar manners as described above. Results thereof are shown in the following Table 6.

TABLE 6

| | Support | Specific polymer compound | On-press developability (number of prints) | On-press developability after time lapse (number of prints) | Usual Printing Durability (1000 prints) | Scratch Resistance (g) |
|---|---|---|---|---|---|---|
| Example 201 | 101 | P-1 | 3 | 7 | 65 | 40 |
| Example 202 | 101 | P-2 | 3 | 7 | 70 | 50 |
| Example 203 | 101 | P-3 | 3 | 7 | 60 | 50 |
| Example 204 | 101 | P-4 | 3 | 7 | 70 | 50 |
| Example 205 | 101 | P-5 | 4 | 5 | 65 | 50 |
| Example 206 | 101 | P-6 | 3 | 7 | 60 | 50 |
| Example 207 | 101 | P-7 | 4 | 6 | 60 | 50 |
| Example 208 | 101 | P-8 | 3 | 6 | 80 | 50 |
| Comparative Example 201 | 101 | C-1 | 9 | 16 | 50 | 30 |
| Comparative Example 202 | 101 | C-2 | 10 | 23 | 50 | 30 |

| Formulation of Photosensitive liquid (201) | |
|---|---|
| Specific polymer compound or Comparative polymer compound shown in Table 6 | 0.24 g |
| Infrared ray absorbing agent (2) shown below | 0.05 g |
| Radical polymerization initiator (1) (described above) | 0.20 g |
| Polymerizable compound (trade name: ARONIX M215, manufactured by Toa Gosei Co., Ltd.) | 0.192 g |
| Low-molecular hydrophilic compound (sodium n-heptyl sulfonate) | 0.05 g |
| Low-molecular hydrophilic compound (1) shown below | 0.050 g |
| Trimethylglycine | 0.01 g |
| Sensitizer ($PF_6$ salt of benzyl-dimethyl-octyl ammonium) | 0.018 g |
| Sensitizer (ammonium group-containing compound (1) shown below, reduced specific viscosity: 44 × $mm^2$/s/g/ml) | 0.035 g |
| Fluorine surfactant (1) (described above) | 0.008 g |
| Methylethylketone | 18.0 g |

Infrared absorbing agent (2)

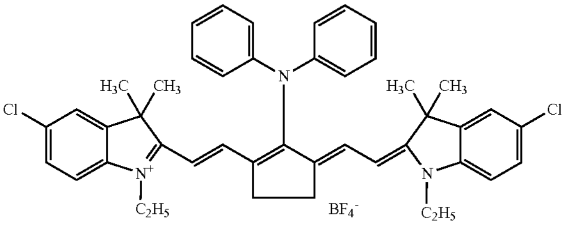

Ammonium group-containing compound (1)

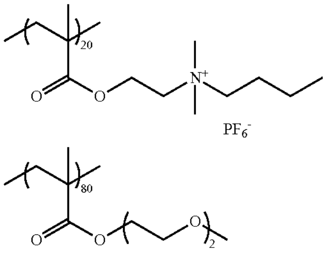

As is evident from Tables 5 and 6, it can be seen that the planographic printing plate precursors of Examples 101 to 108 and 201 to 208 maintain excellent printing durability, have excellent on-press developability and are excellent in temporal stability as are similar to Examples 1 to 16.

It can also be seen that the planographic printing plate precursors of Examples 101 to 108 and 201 to 208 exhibit further on-press developability which is more remarkably excellent than that of Examples 1 to 16.

What is claimed is:

1. A planographic printing plate precursor comprising: a hydrophilic support; and an image recording layer that is provided on the support, the image recording layer comprising: an infrared ray absorbing agent (A); a polymerization initiator (B); a polymerizable monomer (C); and a polymer compound (D) having an alkyleneoxy group in its molecule and having, in a side chain thereof, at least one selected from a group represented by the following Formula (1) and a group represented by the following Formula (2):

Formula (1)

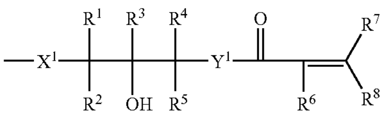

Formula (2)

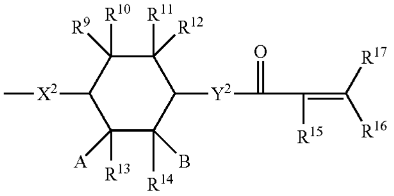

wherein, in Formula (1), $R^1$ to $R^8$ each independently represent a hydrogen atom or a monovalent substituent; $X^1$ and $Y^1$ each independently represent a single bond or a divalent linking group: and in Formula (2), $R^9$ to $R^{17}$ each independently represent a hydrogen atom or a monovalent substituent: A and B each independently represent a hydrogen atom or a monovalent substituent, provided that at least one of A and B is a hydroxyl group; and $X^2$ and $Y^2$ each independently represent a single bond or a divalent linking group:

wherein the alkyleneoxy group is represented by the following Formula (3):

Formula (3)

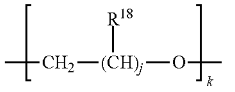

wherein $R^{18}$ represents a hydrogen atom or a methyl j is an integer of 1 or 2; and k is an integer of 1 to 15: when k is an integer of 2 to 9, each of the $R^{18}$ among the plural $R^{18}$s may be the same or different, and each of the integers respectively denoted by j may be the same or different;

wherein the alkyleneoxy group represented by Formula (3) is included in a side chain of the polymer compound (D); and wherein the side chain including the alkyleneoxy group represented by Formula (3) is represented by the following Formula (4):

Formula (4)

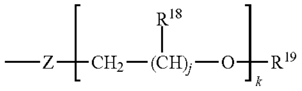

wherein $R^{18}$ represents a hydrogen atom or a methyl group; $R^{19}$ represents a hydrogen atom, an alkyl group which may have a substituent, or an aryl group which may have a substituent: j is an integer of 1 or 2; k is an integer of 1 to 15; when k is an integer of 2 to 9, each of the $R^{18}$ among the plural $R^{18}$s may be the same or different, and each of the integers respectively denoted by j may be the same or different; and Z represents a single bond or a linking group connected with a main-chain skeleton of the polymer compound (D).

2. The planographic printing plate precursor of claim 1, wherein in Formula (1), $R^1$ to $R^8$ each independently represent a hydrogen atom, an alkyl group, or an aryl group; and $X^1$ and $Y^1$ each independently represent —O— or —$NR^{20}$—, in which $R^{20}$ represents a hydrogen atom, an alkyl group, or an aryl group: and in Formula (2), $R^9$ to $R^{17}$ each independently represent a hydrogen atom, an alkyl group, or an aryl group; A and B each independently represent a hydrogen atom or a monovalent substituent, provided that at least one of A and B is a hydroxyl group; and $X^2$ and $Y^2$ each independently represent —O— or —$NR^{21}$—, in which $R^{21}$ represents a hydrogen atom, an alkyl group, or an aryl group.

3. The planographic printing plate precursor of claim 1, wherein the polymer compound (D) has, in the side chain thereof, the group represented by Formula (1).

4. The planographic printing plate precursor of claim 1, wherein the image recording layer comprises at least one selected from a microcapsule and a microgel.

5. The planographic printing plate precursor of claim 1, wherein silicon atoms adhere on a surface of the hydrophilic support in an amount of 8 mg/$m^2$ or more.

6. The planographic printing plate precursor of claim 1, wherein, following exposure, the image recording layer forms an image as a result of supply of printing ink and dampening water at a printing press and removal of an unexposed portion.

7. The planographic printing plate precursor of claim 1, wherein the polymer compound (D) comprises at least one selected from the following structural units:

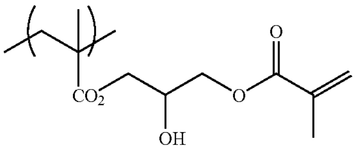

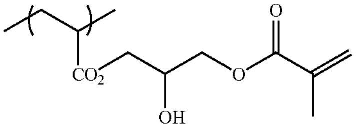

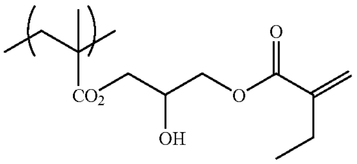

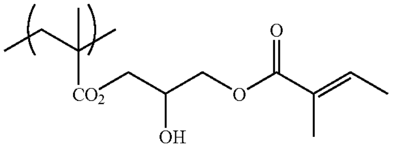

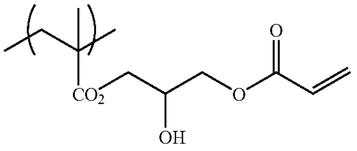

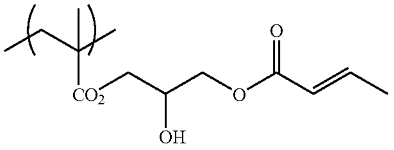

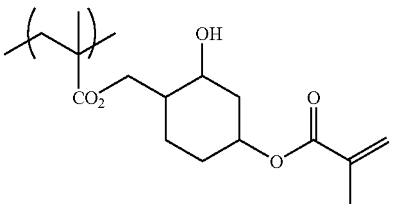

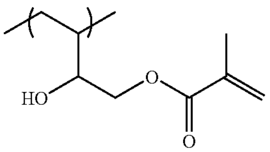

-continued
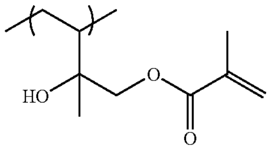
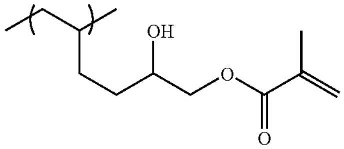
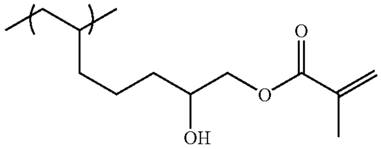
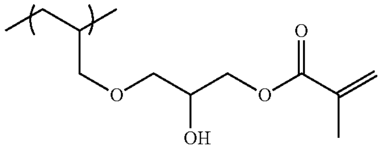
-continued
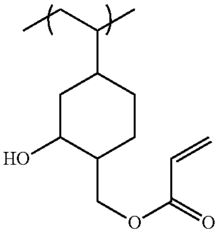
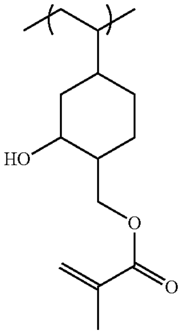
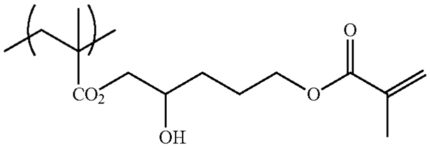
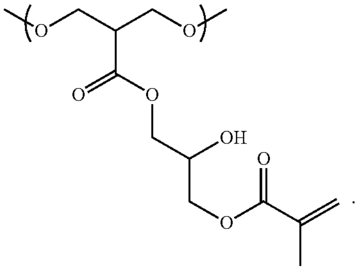
* * * * *